US012621007B2

(12) United States Patent
Pulikkoonattu et al.

(10) Patent No.: US 12,621,007 B2
(45) Date of Patent: May 5, 2026

(54) SYSTEMS AND METHODS FOR BLOCK-KRONECKER BASED LOW DENSITY PARITY CHECK (LDPC) CODE WITH 1/2 CODE RATE

(71) Applicant: Avago Technologies International Sales Pte. Limited, Singapore (SG)

(72) Inventors: Rethnakaran Pulikkoonattu, San Diego, CA (US); Andrew Blanksby, Irvine, CA (US); Vinko Erceg, San Diego, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 76 days.

(21) Appl. No.: 18/647,663

(22) Filed: Apr. 26, 2024

(65) Prior Publication Data

US 2025/0202503 A1    Jun. 19, 2025

Related U.S. Application Data

(60) Provisional application No. 63/610,928, filed on Dec. 15, 2023, provisional application No. 63/610,566, (Continued)

(51) Int. Cl.
| | |
|---|---|
| *H03M 13/11* | (2006.01) |
| *H03M 13/00* | (2006.01) |
| *H03M 13/03* | (2006.01) |

(52) U.S. Cl.
CPC ....... *H03M 13/116* (2013.01); *H03M 13/036* (2013.01); *H03M 13/1185* (2013.01); *H03M 13/6516* (2013.01)

(58) Field of Classification Search
CPC ............. H03M 13/116; H03M 13/036; H03M 13/1185; H03M 13/6516
(Continued)

(56) References Cited

U.S. PATENT DOCUMENTS

| | | | |
|---|---|---|---|
| 2008/0022191 A1* | 1/2008 | Stolpman ............ | H03M 13/353 714/776 |
| 2008/0065956 A1* | 3/2008 | Blankenship ..... | H03M 13/6544 714/758 |

(Continued)

FOREIGN PATENT DOCUMENTS

EP    3 540 948 A1    9/2019

OTHER PUBLICATIONS

Patel et al., Design and Implementation of Quasi Cyclic Low Density Parity Check (QC-LDPC) Code on FPGA, 2017, IEEE, pp. 181-185. (Year: 2017).*

(Continued)

*Primary Examiner* — John J Tabone, Jr.
(74) *Attorney, Agent, or Firm* — Foley & Lardner LLP

(57)    ABSTRACT

An apparatus may include a transmitter and one or more processors. The one or more processors may identify, based on a first parity check matrix of a first quasi-cyclic-low-density parity-check (QC-LDPC) code according to a code rate of 1/2, a second parity check matrix corresponding to a first exponent matrix comprising 1152 values for a second QC-LDPC code. The second QC-LDPC code may have a code block size that is twice a code block size of the first QC-LDPC code. The one or more processors may encode data using the second parity check matrix. The transmitter may be configured to transmit the encoded data.

18 Claims, 25 Drawing Sheets

100

Related U.S. Application Data filed on Dec. 15, 2023, provisional application No. 63/610,762, filed on Dec. 15, 2023, provisional application No. 63/610,859, filed on Dec. 15, 2023.

(58) Field of Classification Search
USPC .................................................. 714/781, 785
See application file for complete search history.

(56) References Cited

U.S. PATENT DOCUMENTS

| | | | | |
|---|---|---|---|---|
| 2008/0222486 | A1* | 9/2008 | Richardson | ........ H03M 13/1185 |
| | | | | 714/757 |
| 2010/0318872 | A1* | 12/2010 | Wang | .................. H03M 13/658 |
| | | | | 714/752 |
| 2011/0047433 | A1* | 2/2011 | Abu-Surra | .......... H03M 13/033 |
| | | | | 714/752 |
| 2014/0258806 | A1* | 9/2014 | Bao | ....................... H04L 1/0043 |
| | | | | 714/758 |
| 2016/0072524 | A1* | 3/2016 | Park | ................... H03M 13/1165 |
| | | | | 714/776 |
| 2016/0380722 | A1* | 12/2016 | Hassanin | .............. H04L 1/0045 |
| | | | | 714/776 |
| 2018/0287632 | A1* | 10/2018 | Rom | ..................... G06F 3/0655 |
| 2020/0083904 | A1* | 3/2020 | Myung | ............. H03M 13/6516 |
| 2021/0013901 | A1* | 1/2021 | Li | ........................ H03M 13/616 |
| 2021/0167800 | A1* | 6/2021 | Shin | ...................... H03M 13/116 |
| 2022/0069843 | A1* | 3/2022 | Li | ......................... H04L 1/0057 |
| 2022/0294474 | A1* | 9/2022 | Motwani | ............. H03M 13/353 |
| 2023/0155724 | A1 | 5/2023 | Kim et al. | |
| 2023/0188254 | A1 | 6/2023 | Myung et al. | |
| 2024/0048160 | A1 | 2/2024 | Li et al. | |
| 2024/0421831 | A1* | 12/2024 | Shinohara | ........... H03M 13/271 |
| 2025/0202503 | A1* | 6/2025 | Pulikkoonattu | .... H03M 13/1185 |
| 2025/0202504 | A1* | 6/2025 | Pulikkoonattu | ...... H03M 13/116 |
| 2025/0202505 | A1* | 6/2025 | Pulikkoonattu | ..... H03M 13/036 |
| 2025/0202506 | A1* | 6/2025 | Pulikkoonattu | ...... H03M 13/116 |

OTHER PUBLICATIONS

Al Hariri et al., A High Throughput Configurable Partially-Parallel Decoder Architecture for Quasi-Cyclic Low-Density Parity-Check Codes, 2014, IEEE, pp. 1-6. (Year: 2014).*

802 11 Working Group: IEEE Draft; Draft P802, 11AY_DO, 2., IEEE-SA, Piscataway, NJ USA, vol. 802.llay drafts, No. D0.2 Feb. 9, 2017 (Feb. 9, 2017), pp. 1-193, XP068137600, Retrieved from the Internet: URL:www.ieee802.org/11/private/Draft_Stand ards/llay/Draft P802.11ay_J)0.2. pdf [retrieved on Feb. 9, 2017].

802.11 Working Group: "IEEE Std 802.11-2016", Dec. 14, 2016 (Dec. 14, 2016), pp. 2450-2451, XP093257139, Retrieved from the Internet: URL:https://ieeexplore.ieee.org/stamp/stamp.jsp?tp=&arnumber=7786995&tag [retrieved on Mar. 7, 2025].

802.11 Working Group: "IEEE Std 802 ; Nov. 2016", Dec. 14, 2016 (Dec. 14, 2016), pp. 3295-3295, XP093256916, Retrieved from the Internet: URL:https://ieeexplore.ieee.org/stamp/stamp.jsp?tp=&arnumber=7786995 [retrieved on Mar. 7, 2025].

European Search Report on EP Appln. No. 24212855.1 dated Mar. 18, 2025.

European Search Report on EP Appln. No. 24212856.9 dated Mar. 20, 2025.

European Search Report on EP Appln. No. 24212858.5 dated Mar. 21, 2025.

European Search Report on EP Appln. No. 24212860.1 dated Mar. 20, 2025.

Final Office Action on U.S. Appl. No. 18/647,780 Dtd Oct. 23, 2025.

Kovalev et al. "Quantum Kronecker sum—product low—density parity—check codes with finite rate". Physical Review A, vol. 88, Issue 1, id. 012311—Published Jul. 11, 2013.

Notice of Allowance on U.S. Appl. No. 18/647,792 DTD Jan. 6, 2026.

* cited by examiner

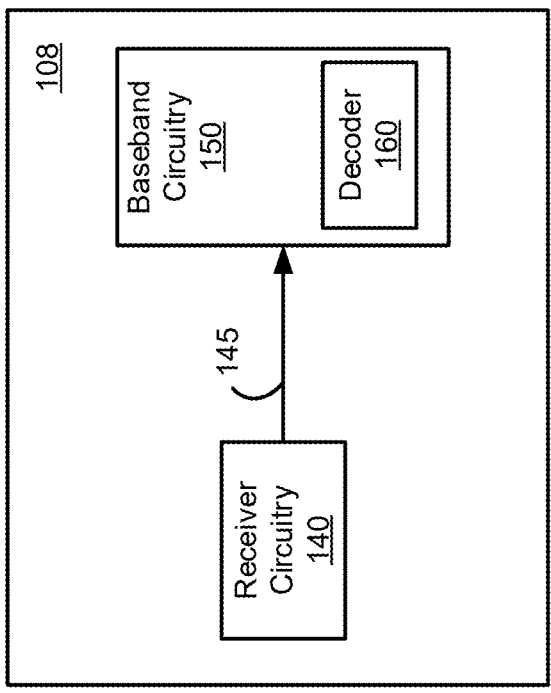
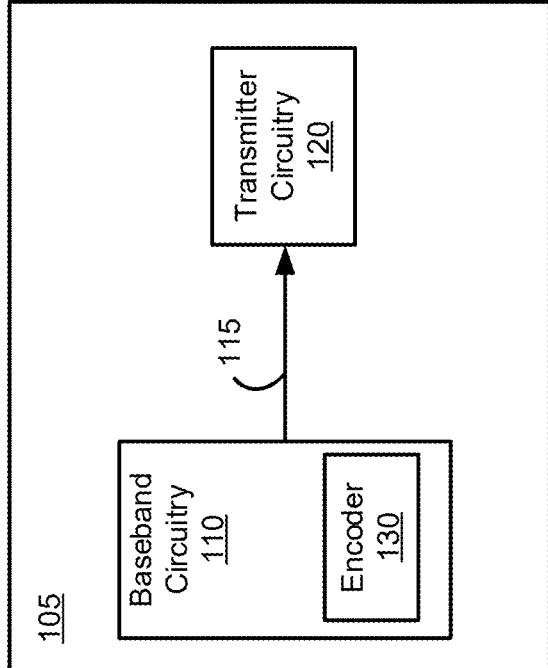
FIG. 1

Binary Matrix Γ1

FIG. 7A

Binary Matrix Γ2

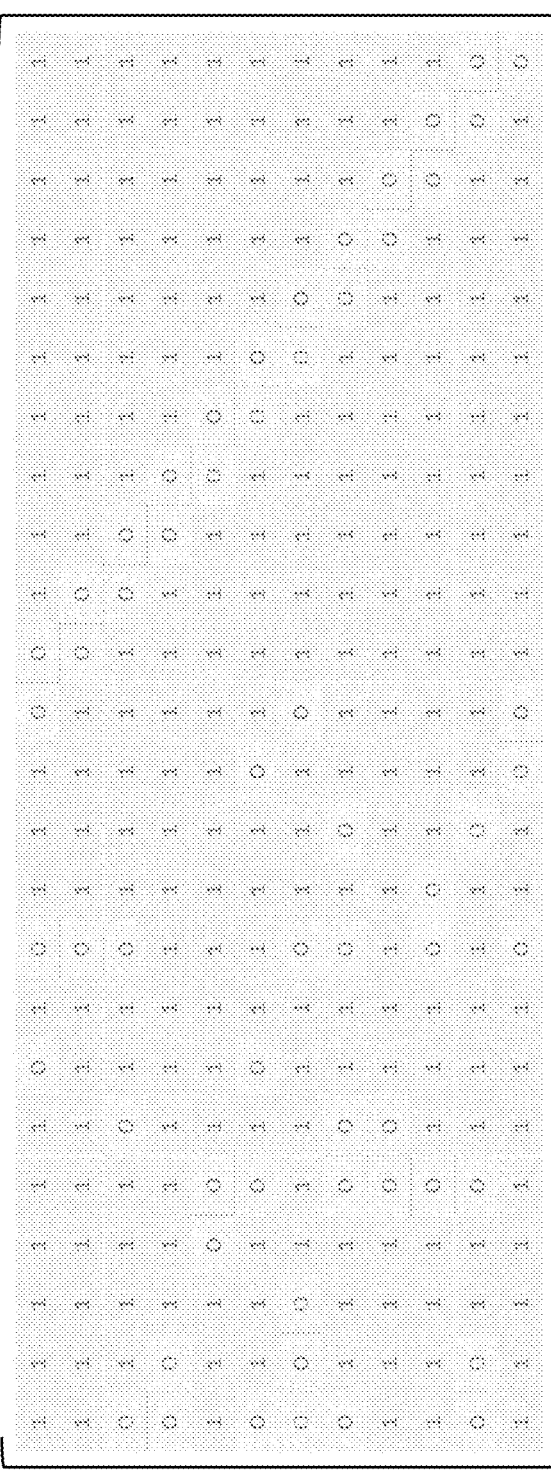
FIG. 7C

Binary Matrix Γ4

Exponent Matrix $\acute{P} = E(\acute{H})$ Constructed Using $\Gamma 1$

Exponent Matrix $\hat{P} = E(\hat{H})$ Constructed Using $\Gamma 2$

820

Exponent Matrix $\hat{P} = E(\hat{H})$ Constructed Using $\Gamma 3$

Exponent Matrix $\hat{P} = E(\hat{H})$ Constructed Using Γ4

Parity Check Matrix $\acute{H}$ Corresponding to $\acute{P} = E(\acute{H})$ Constructed Using Γ1

900

```
Line 1: begin
Line 2:    Γ12=[ ... ]
Line 3:    J = [0 1; 1 0]  # Exchange matrix J(2)
Line 4:    LiftMatrix = [J^Γ12[i, j] for i ∈ 1:size(EH1944, 1), j ∈ 1:size(EH1944, 2)]
Line 5:    invLiftMatrix = [J^(Γ12[i, j] + 1) for i ∈ 1:size(EH1944, 1), j ∈ 1:size(EH1944, 2)]
Line 6:    EH3888 = Int.(khatri_rao(LiftMatrix, EH1944) - khatri_rao(invLiftMatrix, ones(size(EH1944))))
Line 7: end Line 8: function khatri_rao(A::Matrix, B::Matrix)
Line 9:    m, n = size(A)
Line 10:    C = kron.(A, B)
Line 11:    return hcat([hcat(C[1+(i-1)*m:m*(i)]...)' for i = 1:n]...)
Line 12: end
```

FIG. 9

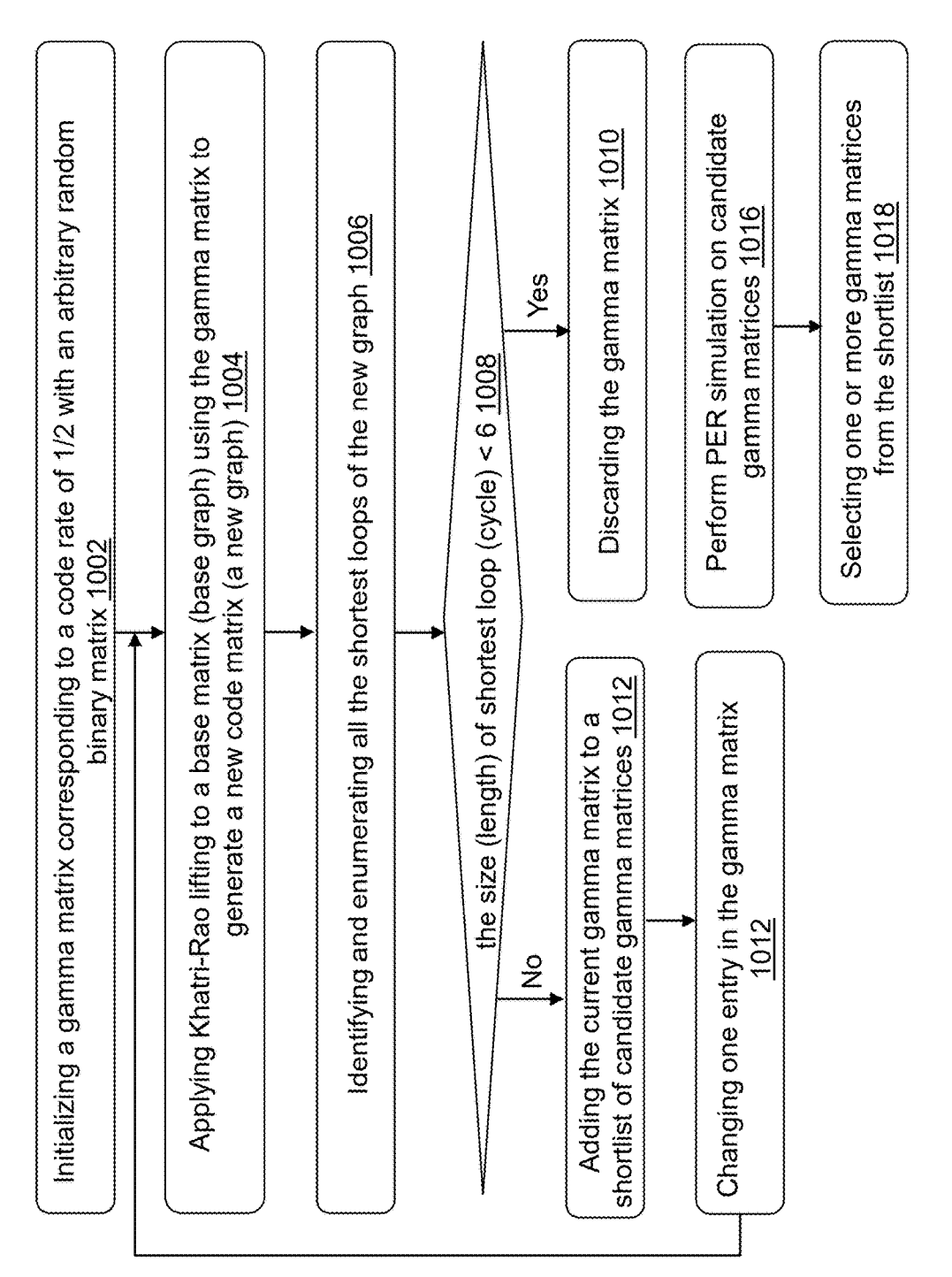

1000

Initializing a gamma matrix corresponding to a code rate of 1/2 with an arbitrary random binary matrix 1002

Applying Khatri-Rao lifting to a base matrix (base graph) using the gamma matrix to generate a new code matrix (a new graph) 1004

Identifying and enumerating all the shortest loops of the new graph 1006 the size (length) of shortest loop (cycle) < 6 1008

No

Adding the current gamma matrix to a shortlist of candidate gamma matrices 1012

Changing one entry in the gamma matrix 1012

Yes

Discarding the gamma matrix 1010

Perform PER simulation on candidate gamma matrices 1016

Selecting one or more gamma matrices from the shortlist 1018

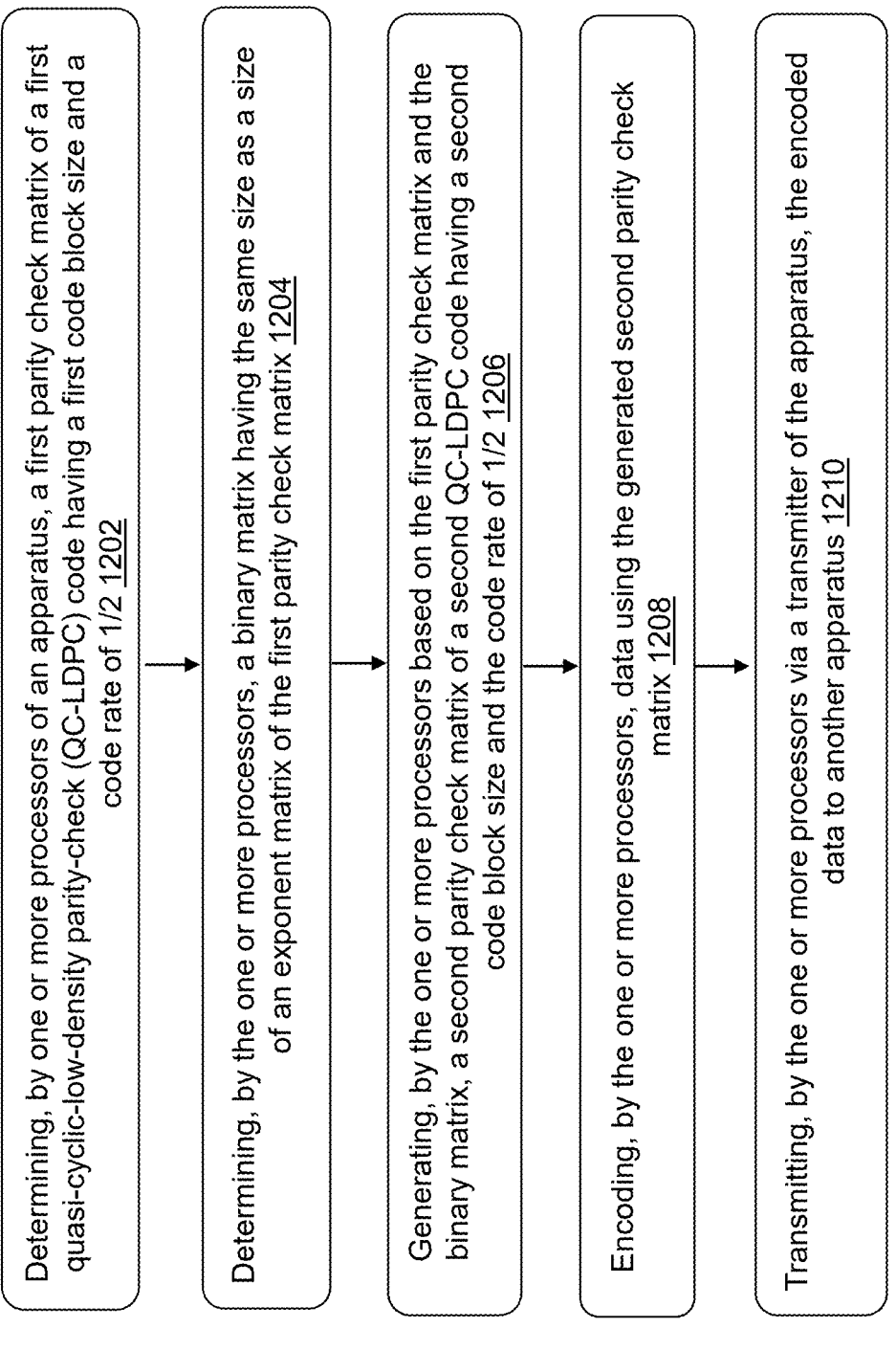

Determining, by one or more processors of an apparatus, a first parity check matrix of a first quasi-cyclic-low-density parity-check (QC-LDPC) code having a first code block size and a code rate of 1/2 1202

Determining, by the one or more processors, a binary matrix having the same size as a size of an exponent matrix of the first parity check matrix 1204

Generating, by the one or more processors based on the first parity check matrix and the binary matrix, a second parity check matrix of a second QC-LDPC code having a second code block size and the code rate of 1/2 1206

Encoding, by the one or more processors, data using the generated second parity check matrix 1208

Transmitting, by the one or more processors via a transmitter of the apparatus, the encoded data to another apparatus 1210

FIG. 12

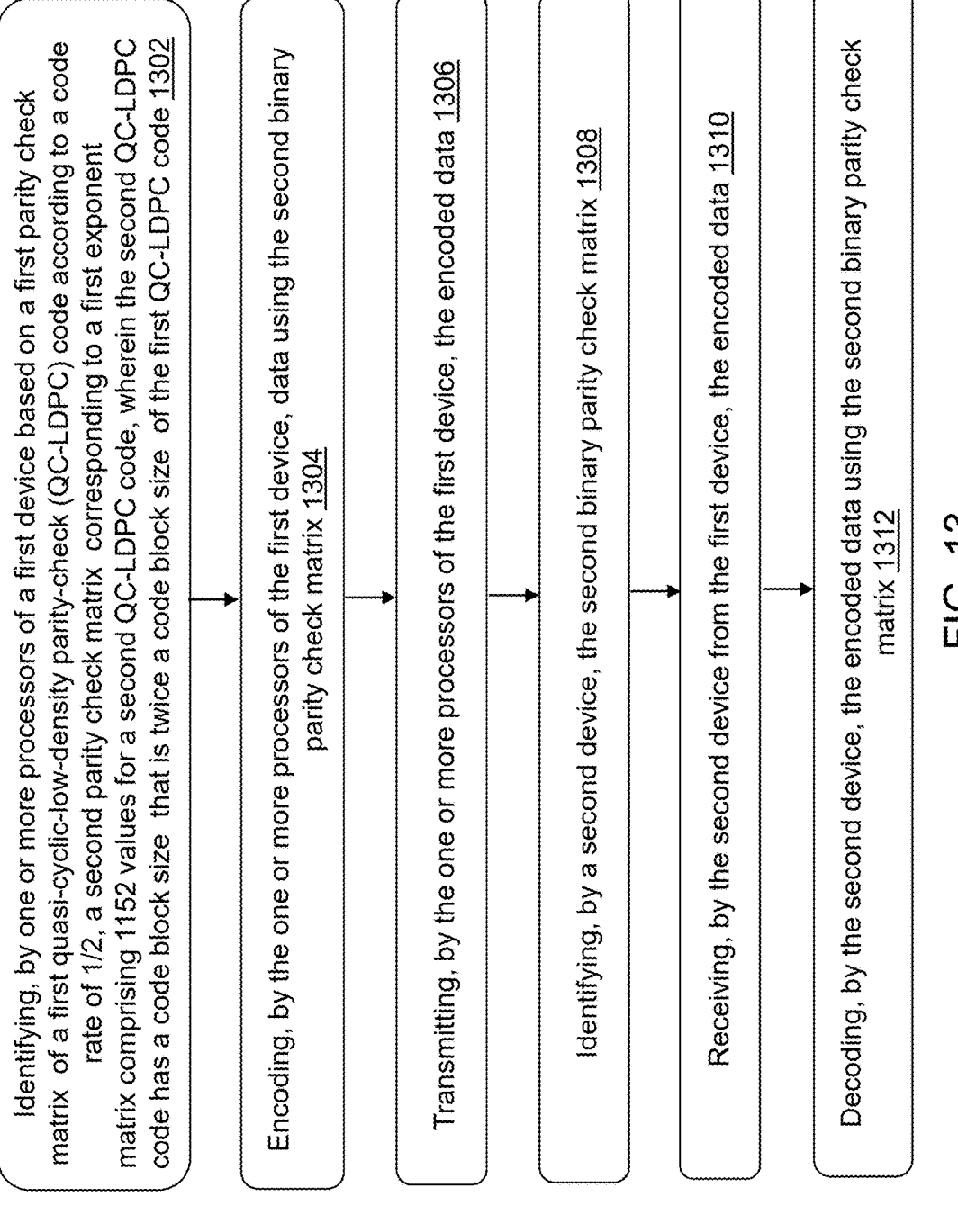

1300

Identifying, by one or more processors of a first device based on a first parity check matrix of a first quasi-cyclic-low-density parity-check (QC-LDPC) code according to a code rate of 1/2, a second parity check matrix corresponding to a first exponent matrix comprising 1152 values for a second QC-LDPC code, wherein the second QC-LDPC code has a code block size that is twice a code block size of the first QC-LDPC code 1302

Encoding, by the one or more processors of the first device, data using the second binary parity check matrix 1304

Transmitting, by the one or more processors of the first device, the encoded data 1306

Identifying, by a second device, the second binary parity check matrix 1308

Receiving, by the second device from the first device, the encoded data 1310

Decoding, by the second device, the encoded data using the second binary parity check matrix 1312

FIG. 13

SYSTEMS AND METHODS FOR BLOCK-KRONECKER BASED LOW DENSITY PARITY CHECK (LDPC) CODE WITH 1/2 CODE RATE

CROSS-REFERENCE TO RELATED APPLICATIONS

This application claims the benefit of priority to each of U.S. Provisional Patent Application No. 63/610,859 filed on Dec. 15, 2023, U.S. Provisional Patent Application No. 63/610,566 filed on Dec. 15, 2023, U.S. Provisional Patent Application No. 63/610,762 filed on Dec. 15, 2023, and U.S. Provisional Patent Application No. 63/610,928 filed on Dec. 15, 2023, all of which are incorporated herein by reference in their entirety for all purposes.

FIELD OF THE DISCLOSURE

This disclosure generally relates to systems and methods for improving an encoding process and/or a decoding process of a communications system using a quasi-cyclic-low-density parity-check (QC-LDPC) code.

BACKGROUND

Error correcting codes enable information data to be exchanged between a transmitter communication system and a receiver communication system in a reliable manner. A transmitter communication system encodes the information data to obtain a codeword. The codeword is encoded information data. The transmitter communication system transmits the codeword to the receiver communication system. Due to noise in the communication channel, the transmission received by the receiver communication system may not be identical to the transmitted codeword. Encoding information data allows a receiver communication system with a proper decoding process to recover the information data from the received transmission despite such noise. For example, the transmitter communication system transmits parity bits to the receiver communication system. The parity bits allow the receiver communication system to verify whether the received transmission is a valid codeword and to correct errors in the transmission if the received transmission is not a valid codeword. In one approach, generating parity bits involves a complex process.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 1 is a diagram depicting an example communication environment with communication systems, according to one or more embodiments.

FIG. 7A to FIG. 7D are diagrams each depicting an example binary matrix $\Gamma$ (also referred to as "gamma matrix" or "$\Gamma$ matrix"), according to one or more embodiments.

FIG. 9 is a diagram depicting an example implementation (source code) of generating a parity check matrix using a binary matrix $\Gamma$, according to one or more embodiments.

FIG. 10 is a flow diagram showing a process for determining one or more binary matrices $\Gamma$, according to one or more embodiments.

FIG. 12 is a flow diagram showing a process for encoding data using an LDPC code, in accordance with an embodiment.

FIG. 13 is a flow diagram showing a process for encoding data and/or decoding data using an LDPC code, in accordance with an embodiment.

Figure 2:
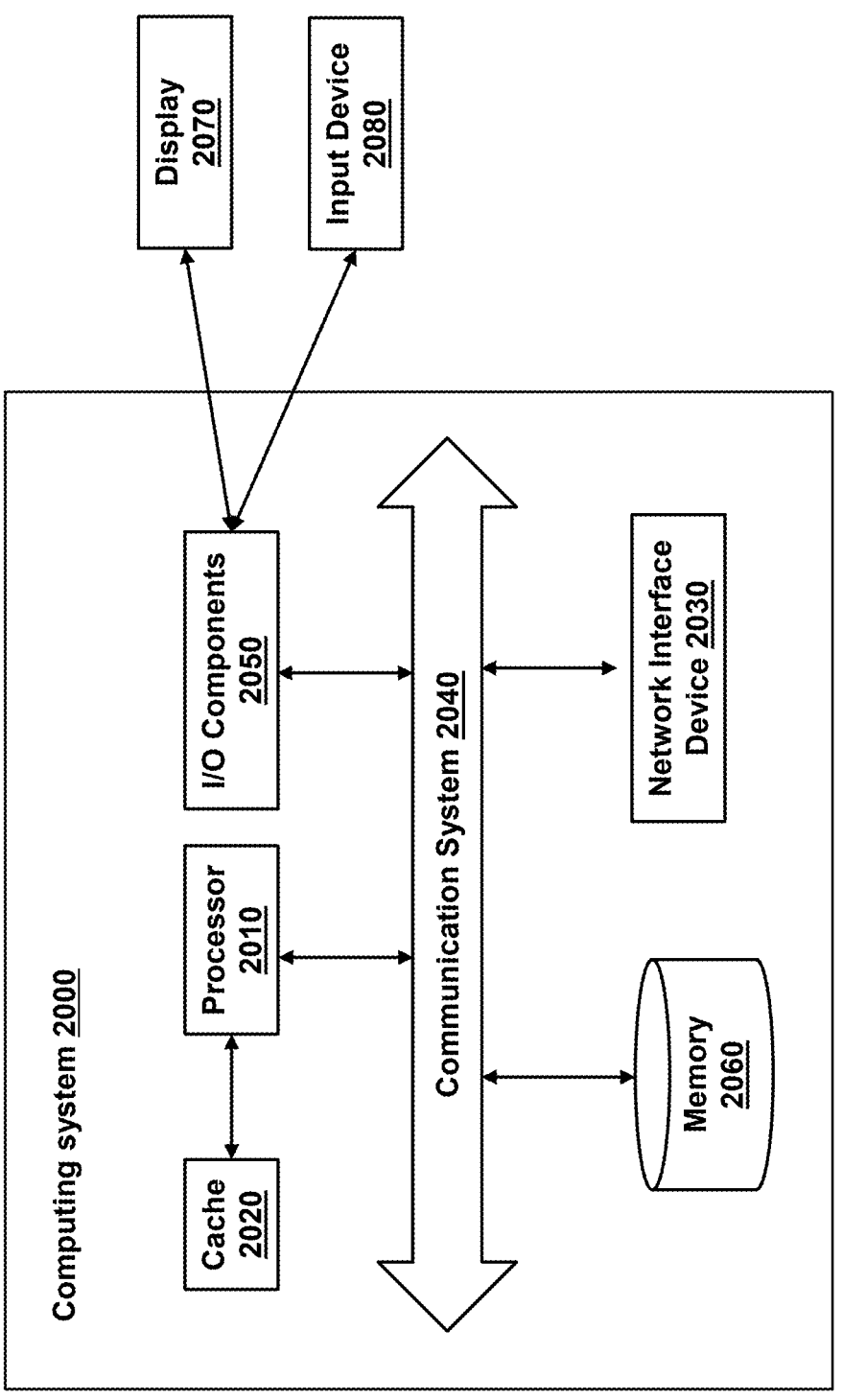
FIG. 2 is a schematic block diagram of a computing system, according to an embodiment.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, a first feature in communication with or communicatively coupled to a second feature in the description that follows may include embodiments in which the first feature is in direct communication with or directly coupled to the second feature and may also include embodiments in which additional features may intervene between the first and second features, such that the first feature is in indirect communication with or indirectly coupled to the second feature. In addition, the present disclosure may repeat reference numerals and/or letters in the various examples. This repetition is for the purpose of simplicity and clarity and does not in itself dictate a relationship between the various embodiments and/or configurations discussed.

In one aspect, a parity check matrix defines a set of equations that are satisfied by any valid codeword. The parity check matrix may be used for encoding low density parity check ("LDPC") codes, described by Richardson and Urbanke in IEEE Transactions on Information Theory, Vol. 47, No. 2 (February 2001). Generally, many wireless and wireline communication systems use LDPC as a forward error correction coding scheme. However, the longest block length (in bit) for coded data, supported in the 802.11 standards (e.g., 802.11n-802.11be) is 1944. There may be a limited gain in a radio channel (e.g., 2×2 multiple-input and multiple-output channels) that can be achieved using the block length of 1944.

To solve this problem, according to certain aspects, embodiments in the present disclosure relate to a technique to support or provide an LDPC code with the block length of 3888 and the code rate of 1/2. The block length of 3888 is 2 times that of the longest code supported in 802.11n-802.11be standards (e.g., the block length of 1944). In some embodiments, the LDPC code has a quasi-cyclic (QC) structure which helps in efficient encoding and decoding. In some embodiments, QC-LDPC codes may be a class of structured LDPC codes, which may be used in many practical applications including the IEEE 802.11n, 802.11ac, 802.11ax, 802.11be standards. In QC-LDPC codes, a parity check matrix has a cyclic structure that repeats itself in a quasi-cyclic manner, which can simplify the encoding and decoding processes, making QC-LDPC codes more efficient. The code block size (denoted by n) refers to a total number of coded or transmitted bits as a result of encoding data using an error correction code (e.g., LDPC). The number of information bits (denoted by k) refers to a number of bits that carry the data to be subject to the encoding using the error correction code. The code rate (denoted by R) refers to a ratio of the number of information bits to the code block size (R=k/n). In some embodiments, an LDPC encoder may take a block of k bits of information bits (e.g., k=1944) and produce n coded bits with the code rate R=k/n (e.g., R=1/2, n=3888). An LDPC decoder may operate on (noisy version of) n received bits and (ideally) recover the k information bits. In some embodiments, the LDPC encoder may take a block of k bits of information bits as input, encode the block of k bits to produce a block of n coded bits (e.g., n=3888) with the code rate 1/2 (R=k/n).

In some implementations, an apparatus may include a transmitter and one or more processors. The one or more processors may be configured to determine a first parity check matrix of a first QC-LDPC code having a first code block size and a code rate of 1/2. A parity check matrix refers to a matrix that can define relationships (e.g., parity check equations or constraints) between information bits and parity bits. A binary parity check matrix refers to a parity check matrix in which all the entries are either 0 or 1. The one or more processors may be configured to determine a binary matrix (also referred to as "gamma matrix" or "T matrix") having the same size as a size of an exponent matrix of the first parity check matrix. For example, the exponent matrix of the first parity check matrix may have a dimension of 12×24 (12 rows and 24 columns) which is the same as the dimension of the binary matrix. The one or more processors may be configured to generate, based on the first parity check matrix and the binary matrix, a second parity check matrix of a second QC-LDPC code having a second code block size and the code rate of 1/2. The one or more processors may be configured to encode data using the generated second parity check matrix. The one or more processors may be configured to transmit, via a transmitter of the apparatus, the encoded data to another apparatus.

In some implementations, the first code block size may be 1944 bits, and the second code block size may be 3888 bits. In some implementations, each of the first parity check matrix and the second parity check matrix may have an exponent matrix comprising a plurality of integers, the number of the plurality of integers being equal to the number of elements of the parity check matrix divided by z, where z is an integer representing a lifting size of the QC-LDPC code. Each element of the exponent matrix may correspond to a cyclic shift value of an identity matrix. A size of the identity matrix is z×z, and the cyclic shift value d is an integer such that −1≤d<z, where z is an integer representing a lifting size of the QC-LDPC code. The cyclic shift value d may represent a shifted identity matrix that is obtained by right-shifting the identity matrix by d. The cyclic shift value −1 may represent a null matrix of the identity matrix.

In some implementations, in determining the binary matrix, the one or more processors may be configured to determine a plurality of sub-matrices of the binary matrix, each sub-matrix being a power of an exchange matrix of order 2. The one or more processors may be configured to randomize non-zero values of the binary matrix such that the binary matrix maintains to have full rank.

In some implementations, the binary matrix may include the following set of values: [1 1 1 1 1 1 1 1 0 1 0 1 0 0 1 1 1 1 1 1 1 1 1 0 1 1 1 0 1 1 1 0 1 1 1 0 0 1 1 1 1 1 1 1 1 0 1 1 1 1 0 1 1 0 1 1 1 1 0 0 1 1 1 1 1 1 1 0 0 1 1 1 1 0 0 1 1 1 1 1 0 0 1 1 1 1 1 1 1 1 1 0 1 1 1 1 1 1 1 1 0 0 1 1 1 1 1 1 0 1 1 1 1 1 0 1 1 1 1 1 1 1 1 1 1 0 0 1 1 1 1 1 1 0 1 1 1 1 0 1 1 1 1 1 0 1 1 1 1 0 0 1 1 1 1 1 1 1 1 1 1 0 1 1 1 1 1 1 1 1 1 1 1 1 0 0 1 1 1 1 1 1 0 1 1 1 1 1 1 1 1 1 1 1 1 1 0 0 1 1 1 0 1 1 1 1 1 1 0 1 1 1 1 1 1 1 1 0 0 1 0 0 1 1 0 1 1 1 1 1 1 1 1 1 1 1 1 1 1 0 0 1 1 1 1 1 1 1 0 0 1 1 0 0 1 1 1 1 1 1 1 1 1 0]; and the second exponent matrix of the second parity check matrix corresponding to the binary matrix may include the following set of values: [−1 57 −1 −1 −1 −1 −1 −1 −1 50 −1 −1 1 1 −1 −1 50 −1 −1 −1 79 −1 −1 −1 1 −1 0 −1 −1 −1 −1 −1 −1 −1 −1 −1 −1 −1 −1 −1 −1 −1 −1 −1 −1 57 −1 −1 −1 −1 −1 −1 −1 50 −1 −1 −1 1 1 −1 −1 −1 −1 50 −1 −1 −1 79 −1 −1 −1 1 1 −1 0 −1 −1 −1 −1 −1 −1 −1 −1 −1 −1 −1 −1 −1 −1 −1 −1 −1 −1 −1 3 −1 −1 −1 −1 28 −1 −1 0 −1 −1 −1 −1 −1 −1 −1 55 −1 −1 7 −1 −1 −1 −1 −1 −1 0 −1 0 −1 −1 −1 −1 −1 −1 −1 −1 −1 −1 −1 −1 −1 −1 −1 −1 −1 −1 −1 −1 3 −1 −1 28 −1 −1 −1 −1 0 −1 −1 −1 −1 −1 −1 −1 55 7 −1 −1 −1 −1 −1 −1 −1 −1 0 −1 0 −1 −1 −1 −1 −1 −1 −1 −1 −1 −1 −1 −1 −1 −1 −1 −1 −1 30 −1 −1 −1 −1 −1 −1 −1 24 37 −1 −1 −1 −1 −1 56 −1 −1 14 −1 −1 −1 −1 −1 −1 −1, −1 1 0 −1 0 −1 −1 −1 −1 −1 −1 −1 −1 −1 −1 −1 −1 −1 −1 −1 −1 −1 −1 −1 30 −1 −1 −1 −1 −1 −1 24 −1 −1 37 −1 −1 −1 −1 −1 56 14 −1 −1 −1 −1 −1 −1 −1 −1 −1 0 −1 0 −1 −1 −1 −1 −1 −1 −1 −1 −1 −1 −1 −1 −1 −1 62 −1 53 −1 −1 −1 −1 −1 53 −1 −1 −1 −1 3 −1 35 −1 −1 −1 −1 −1 −1 −1 1 −1 −1 −1 −1 −1 0 −1 0 −1 −1 −1 −1 −1 −1 −1 −1 −1 −1 −1 −1 −1 −1 62 −1 53 −1 −1 −1 53 −1 −1 −1 −1 −1 −1 3 −1 35 −1 −1 −1 −1 −1 −1 −1 −1 −1 −1 −1 0 −1 0 −1 −1 −1 −1 −1 −1 −1 −1 −1 −1 −1 −1 −1 40 −1 −1 −1 20 −1 66 −1 −1 −1 −1 22 −1 28 −1 −1 −1 −1 −1 −1 −1 −1 −1 −1 −1 −1 −1 −1 −1 −1 −1 40 −1 −1 −1 −1 −1 20 66 −1 −1 −1 −1 −1 22 −1 28 −1 −1 −1 −1 −1 −1 −1 −1 −1 −1 −1 −1 −1 −1 0 −1 0 −1 −1 −1 −1 −1 −1 −1 −1 −1 0 −1 −1 −1 −1 −1 −1 −1 −18 −1 −1 42 −1 −1 −1 −1 50 −1 −1 −1 −1 −18 −1 −1 −1 −1 −1 −1 −1 −1 −1 0 −1 0 −1 −1 −1 −1 −1 −1 −1 −1 −1 −1 0 −1 −1 −1 −1 −1 −18 −1 −1 −1 −1 42 −1 −1 50 −1 −1 −1 −1 −1 8 −1 −1 −1 −1 −1 −1 −1 −1 −1 −1 −1 −1 0 −1 0 −1 −1 −1 −1 −1 −1 −1 −1 −1 69 79 −1 −1 79 −1 −1 −1 −1 −1 −1 56 −1 −1 −1 −1 52 −1 −1 −1 −1 −1 −1 −1 0 −1 −1 −1 −1 −1 −1 −1 −1 −1 0 −1 0 −1 −1 −1 −1 −1 −1 −1 69 −1 −1 79 79 −1 −1 −1 −1 −1 −1 −1 56 −1 −1 52 −1 −1 −1 −1 −1 −1 −1 −1 0 −1 −1 −1 −1 −1 −1 −1 −1 0 −1 0 −1 −1 −1 −1 −1 −1 −1 −1 −1 65 −1 −1 −1 −1 −1 38 57 −1 −1 −1 −1 −1 72 −1 −1 −1 27 −1 −1 −1 −1 −1 −1 −1 −1 −1 −1 −1 −1 −1 −1 0 −1 0 −1 −1 −1 −1 −1 −1 −1 65 −1 −1 −1 −1 −1 38 −1 −1 57 −1 −1 72 −1 −1 −1 27 −1 −1 −1 −1 −1 −1 1 −1 −1 −1 −1 −1 −1 −1 −1 0 −1 −1 −1 −1 −1 0 −1 −1 −1 −1 −1 −1 −1 −1 64 −1 −1 −1 −1 14 −1 −1 52 −1 −1 −1 −1 −1 30 −1 −1 −1 −1 32 −1 −1 −1 −1 −1 −1 −1 −1 −1 −1 −1 −1 −1 0 −1 0 −1 −1 −1 −1 64 −1 −1 −1 −1 −1 −1 −1]

14 52 –1 –1 –1 –1 –1 30 –1 –1 –1 –1 –1 32 –1 –1 –1 –1
–1 –1 –1 –1 –1 –1 –1 –1 –1 –1 –1 –1 –1 –1 0 –1 0 –1 –1
–1 –1 –1 –1 45 –1 –1 –1 –1 –1 70 –1 0 –1 –1 –1 –1 –1 –1
77 9 –1 –1 –1 –1 –1 –1 –1 –1 –1 –1 –1 –1 –1 –1 –1 –1 –1
–1 –1 –1 –1 –1 –1 0 –1 0 –1 –1 –1 –1 –1 –1 45 –1 –1 70
–1 0 –1 –1 –1 –1 –1 –1 –1 77 –1 –19 –1 –1 –1 –1 –1 –1
–1 –1 –1 –1 –1 –1 –1 –1 –1 –1 –1 –1 –1 –1 –1 –1 –1 0 –1
0 –1 –1 2 –1 56 –1 –1 –1 –1 57 35 –1 –1 –1 –1 –1 –1 –1
–1 –1 –1 –1 –1 12 –1 –1 –1 –1 –1 –1 –1 –1 –1 –1 –1 –1
–1 –1 –1 –1 –1 –1 –1 –1 –1 –1 0 –1 0 –1 –1 2 –1 56 –1
–1 57 –1 –1 35 –1 –1 –1 –1 –1 –1 –1 –1 –1 –1 12 –1 –1
–1 –1 –1 –1 –1 –1 –1 –1 –1 –1 –1 –1 –1 –1 –1 –1 –1 –1
–1 –1 –1 –1 0 –1 0 –1 24 –1 –1 –1 61 –1 –1 –1 60 –1 –1
–1 –1 27 –1 51 –1 –1 –1 –1 –1 16 –1 1 –1 –1 –1 –1 –1 –1
–1 –1 –1 –1 –1 –1 –1 –1 –1 –1 –1 –1 –1 –1 –1 0 –1 24 –1
–1 –1 61 –1 –1 –1 60 –1 –1 –1 –1 –1 27 –1 51 –1 –1
–1 –1 –1 16 –1 1 –1 –1 –1 –1 –1 –1 –1 –1 –1 –1 –1 –1
–1 –1 –1 –1 –1 –1 –1 –1 0].

In some implementations, in generating, based on the first parity check matrix and the binary matrix, the second parity check matrix, the one or more processors may be configured to determine a first exponent matrix of the first parity check matrix, determine a Khatri-Rao product of the first exponent matrix and the binary matrix, and determine, based on a result of the Khatri-Rao product, a second exponent matrix of the second parity check matrix. In generating, based on the first parity check matrix and the binary matrix, the second parity check matrix, the one or more processors may be configured to generate, for each element of the second exponent matrix, a shifted identity matrix of an identity matrix based on a value of each element of the second exponent matrix. The one or more processors may be configured to generate the second parity check matrix such that the second parity check matrix includes, as an element corresponding to each element of the second exponent matrix, the generated shifted identity matrix.

In some implementations, the binary matrix may include the following set of values: [1 1 1 1 1 1 0 1 0 1 1 1 0 0 1
1 1 1 1 1 1 1 1 1 1 1 1 1 1 1 1 0 1 1 1 1 0 0 1 1 1 1 1 1
1 1 1 0 1 1 1 1 0 1 1 0 1 1 1 1 1 0 0 1 1 1 1 1 1 1 1 0 0 1
1 1 1 1 1 1 1 1 1 1 1 0 0 1 1 1 1 1 1 1 1 1 1 0 0 1 1 0 0
1 1 1 1 1 1 0 0 1 1 1 1 1 1 0 1 1 1 0 1 0 1 1 1 0 1 1 1
1 1 0 0 1 1 1 1 0 0 0 1 1 1 1 0 1 1 1 0 1 1 1 1 1 0 0 1
1 1 1 0 1 1 1 0 0 1 1 0 1 0 1 1 1 1 1 1 1 0 0 1 1 1 1 1
1 1 0 1 1 1 1 1 1 1 1 0 0 1 1 1 1 1 1 0 1 1 1 0 1 1 1 0
0 1 1 1 1 1 1 1 1 1 1 0 0 1 1 0 1 1 0 1 1 1 1 1 0 1 1 1 1
1 1 1 1 1 1 0 0 1 1 1 1 1 1 1 1 0 1 1 0 0 1 1 1 1 1 1 1 1
1 1 0]; and the second exponent matrix of the second parity check matrix corresponding to the binary matrix may include the following set of values: [–1 57 –1 –1 –1 –1 –1
–1 –1 50 –1 –1 1 1 –1 –1 –1 50 –1 –1 –1 –1 79 –1 –1 1 1
–1 0 –1 –1 –1 –1 –1 –1 –1 –1 –1 –1 –1 –1 –1 –1 –1 –1 –1 –1
–1 –1 57 –1 –1 –1 –1 –1 –1 50 –1 –1 –1 –1 1 1 –1 –1 –1
50 –1 –1 79 –1 –1 –1 –1 1 1 –1 0 –1 –1 –1 –1 –1 –1 –1
–1 –1 –1 –1 –1 –1 –1 –1 –1 –1 –1 –1 –1 –1 3 –1 –1 –1 28 –1
–1 –1 0 –1 –1 –1 –1 –1 –1 55 –1 –1 7 –1 –1 –1 –1 –1 –1
0 –1 0 –1 –1 –1 –1 –1 –1 –1 –1 –1 –1 –1 –1 –1 –1 –1 –1
–1 –1 –1 3 –1 –1 –1 28 –1 –1 –1 0 –1 –1 –1 –1 –1 –1 –1
–1 55 7 –1 –1 –1 –1 –1 –1 –1 –1 0 –1 0 –1 –1 –1 –1 –1
–1 –1 –1 –1 –1 –1 –1 –1 –1 –1 –1 –1 –1 30 –1 –1 –1 –1 –1
–1 –1 –1 –1 24 37 –1 –1 –1 –1 –1 56 –1 –1 14 –1 –1 –1
–1 –1 –1 –1 –1 1 0 –1 0 –1 –1 –1 –1 –1 –1 –1 –1 –1 –1
–1 –1 –1 –1 –1 –1 –1 –1 –1 30 –1 –1 –1 –1 –1 –1 24 –1 –1
37 –1 –1 –1 –1 –1 –1 56 14 –1 –1 –1 –1 –1 –1 –1 –1 –1
0 –1 0 –1 –1 –1 –1 –1 –1 –1 –1 –1 –1 –1 –1 –1 –1 –1 –1
62 –1 53 –1 –1 –1 –1 –1 53 –1 –1 –1 –1 –1 3 –1 35 –1
–1 –1 –1 –1 –1 –1 –1 –1 –1 –1 –1 0 –1 0 –1 –1 –1 –1 –1

–1 –1 –1 –1 –1 –1 –1 –1 –1 –1 –1 62 –1 53 –1 –1 –1 –1 –1
53 –1 –1 –1 –1 –1 3 –1 35 –1 –1 –1 –1 –1 –1 –1 –1 –1
–1 –1 –1 –1 0 –1 0 –1 –1 –1 –1 –1 –1 –1 –1 –1 –1 –1 –1
–1 –1 –1 40 –1 –1 –1 –1 20 –1 66 –1 –1 –1 –1 –1 22 –1
28 –1 –1 –1 –1 –1 –1 –1 –1 –1 –1 –1 –1 –1 –1 –1 –1 0 –1 0
–1 –1 –1 –1 –1 –1 –1 –1 –1 –1 –1 –1 –1 –1 –1 40 –1 –1 –1 –1
–1 –1 20 –1 66 –1 –1 –1 –1 –1 22 –1 28 –1 –1 –1 –1 –1
–1 –1 –1 –1 –1 –1 –1 –1 –1 –1 0 –1 0 –1 –1 –1 –1 –1 –1
–1 –1 –1 –1 –1 –1 0 –1 –1 –1 –1 –1 –1 –18 –1 –1 –1 42
–1 –1 –1 –1 50 –1 –1 –1 –18 –1 –1 –1 –1 –1 –1 –1 –1 –1
–1 –1 0 –1 0 –1 –1 –1 –1 –1 –1 –1 –1 –1 –1 –1 –1 0 –1 –1
–1 –1 –1 –1 –18 –1 –1 –1 42 –1 –1 50 –1 –1 –1 –1 –1 –1
8 –1 –1 –1 –1 –1 –1 –1 –1 –1 –1 –1 0 –1 0 –1 –1 –1 –1
–1 –1 –1 –1 –1 –1 69 –1 79 –1 79 –1 –1 –1 –1 –1 –1 –1
–1 56 –1 –1 52 –1 –1 –1 –1 –1 –1 –1 0 –1 –1 –1 –1 –1 –1
–1 –1 –1 –1 –1 0 –1 0 –1 –1 –1 –1 –1 –1 –1 –1 –1 –1 69
–1 79 –1 79 –1 –1 –1 –1 –1 –1 56 –1 –1 –1 –1 52 –1 –1
–1 –1 –1 –1 –1 0 –1 –1 –1 –1 –1 –1 –1 –1 –1 –1 0 –1
0 –1 –1 –1 –1 –1 –1 –1 65 –1 –1 –1 –1 –1 –1 38 –1
57 –1 –1 –1 –1 –1 72 –1 –1 –1 27 –1 –1 –1 –1 –1 –1
–1 –1 –1 –1 –1 –1 –1 –1 –1 –1 0 –1 0 –1 –1 –1 –1 –1 –1
–1 –1 65 –1 –1 –1 –1 –1 –1 38 –1 57 –1 –1 –1 –1 –1
72 –1 –1 –1 27 –1 –1 –1 –1 –1 –1 –1 –1 –1 –1 –1 –1 –1
–1 –1 –1 –1 0 –1 0 –1 –1 –1 –1 –1 –1 –1 –1 64 –1 –1 –1 –1
–1 –1 –1 14 52 –1 –1 –1 –1 –1 –1 –1 30 –1 –1 –1 –1 –1 32
–1 –1 –1 –1 –1 –1 –1 –1 –1 –1 –1 –1 –1 –1 –1 –1 0 –1 0
–1 –1 –1 –1 –1 64 –1 –1 –1 –1 –1 –1 14 –1 –1 52 –1
–1 –1 –1 30 –1 –1 –1 –1 32 –1 –1 –1 –1 –1 –1 –1 –1
–1 –1 –1 –1 –1 –1 –1 0 –1 0 –1 –1 –1 –1 –1 –1 –1 45
–1 –1 –1 70 0 –1 –1 –1 –1 –1 –1 –1 77 –1 9 –1 –1 –1 –1
–1 –1 –1 –1 –1 –1 –1 –1 –1 –1 –1 –1 –1 –1 –1 –1 –1 –1
–1 0 –1 0 –1 –1 –1 –1 –1 45 –1 –1 –1 70 –1 –1 0 –1 –1
–1 –1 –1 –1 –1 77 –1 9 –1 –1 –1 –1 –1 –1 –1 –1 –1 –1
–1 –1 –1 –1 –1 –1 –1 –1 –1 –1 –1 –1 0 –1 0 –1 –1 –1 2
56 –1 –1 –1 –1 57 35 –1 –1 –1 –1 –1 –1 –1 –1 –1 –1
12 –1 –1 –1 –1 –1 –1 –1 –1 –1 –1 –1 –1 –1 –1 –1 –1 –1
–1 –1 –1 –1 –1 0 –1 0 –1 2 –1 –1 56 –1 –1 57 –1 –1 35
–1 –1 –1 –1 –1 –1 –1 –1 –1 –1 –1 12 –1 –1 –1 –1 –1 –1
–1 –1 –1 –1 –1 –1 –1 –1 –1 –1 –1 –1 –1 –1 –1 –1 –1 0 –1
0 –1 24 –1 –1 –1 61 –1 –1 –1 60 –1 –1 –1 –1 27 51 –1
–1 –1 –1 –1 16 –1 1 –1 –1 –1 –1 –1 –1 –1 –1 –1 –1 –1
–1 –1 1 –1 –1 –1 0 –1 24 –1 –1 –1 61 –1 –1 –1 60 –1 –1
–1 –1 –1 27 –1 –1 51 –1 –1 –1 –1 –1 16 –1 1 –1 –1 –1 –1
–1 –1 –1 –1 –1 –1 1 –1 –1 1 1 –1 –1 –1 –1 –1 0].

In some implementations, the binary matrix may include the following set of values: [1 1 1 1 1 1 0 1 0 1 1 1 0 0 1
1 1 1 1 1 1 1 1 1 1 1 1 1 1 1 1 0 1 1 1 1 0 0 1 1 1 1 1 1
1 1 1 0 1 1 1 1 0 1 1 0 1 1 1 1 1 0 0 1 1 1 1 1 1 1 1 0 1 1
1 1 0 1 1 1 1 1 1 1 1 0 0 1 1 1 1 1 1 1 1 1 1 0 0 1 1 1 1
1 1 1 1 1 1 0 0 1 1 1 1 1 1 0 1 1 1 0 1 0 1 1 1 0 1 1 1
1 1 0 0 1 1 1 1 0 0 0 1 1 1 1 0 1 1 1 0 1 1 1 1 1 0 0 1
1 1 1 0 1 1 1 0 0 1 1 0 1 0 1 1 1 1 1 1 1 0 0 1 1 1 1 1
1 0 0 1 1 1 1 1 1 1 1 1 1 1 1 1 0 0 1 1 1 1 1 1 0 1 1 1 1
1 1 1 1 1 1 1 1 1 0 0 1 1 1 0 0 1 1 0 1 1 1 1 1 0 1 1 1 1
1 1 1 1 1 1 0 0 1 1 1 1 1 1 1 1 0 1 1 0 0 1 1 1 1 1 1 1 1
1 1 0]; and the second exponent matrix of the second parity check matrix corresponding to the binary matrix may include the following set of values: [–1 57 –1 –1 –1 –1 –1
–1 –1 50 –1 –1 1 1 –1 –1 –1 50 –1 –1 –1 –1 79 –1 –1 1 1
–1 0 –1 –1 –1 –1 –1 –1 –1 –1 –1 –1 –1 –1 –1 –1 –1 –1 –1 –1
–1 –1 –1 57 –1 –1 –1 –1 –1 –1 50 –1 –1 –1 –1 1 1
–1 –1 –1 50 –1 –1 79 –1 –1 –1 –1 1 1 –1 0 –1 –1 –1 –1
–1 –1 –1 –1 –1 –1 –1 –1 –1 –1 –1 –1 –1 –1 –1 –1 3 –1 –1
–1 28 –1 –1 –1 0 –1 0 –1 –1 –1 –1 –1 –1 –1 –1 –1 –1
–1 –1 –1 –1 3 –1 –1 –1 28 –1 –1 –1 0 –1 –1 –1 –1 –1
–1 –1 –1 –1 55 7 –1 –1 –1 –1 –1 –1 –1 –1 0 –1 0 –1 –1

−1 −1 −1 −1 −1 −1 −1 −1 −1 −1 −1 −1 −1 −1 −1 30 −1
−1 −1 −1 −1 −1 −1 −1 24 37 −1 −1 −1 −1 −1 56 −1 −1 14
−1 −1 −1 −1 −1 −1 −1 −1 1 0 −1 0 −1 −1 −1 −1 −1 −1
−1 −1 −1 −1 −1 −1 −1 −1 −1 −1 30 −1 −1 −1 −1 −1 −1 −1
24 −1 −1 37 −1 −1 −1 −1 −1 56 14 −1 −1 −1 −1 −1 −1 −1
−1 −1 −1 0 −1 0 −1 −1 −1 −1 −1 −1 −1 −1 −1 −1 −1 −1
−1 −1 −1 62 −1 53 −1 −1 −1 −1 −1 −1 53 −1 −1 −1 −1 −1
3 −1 35 −1 −1 −1 −1 −1 −1 −1 −1 −1 −1 −1 −1 0 −1 0 −1
−1 −1 −1 −1 −1 −1 −1 −1 −1 −1 −1 −1 −1 −1 62 −1 53
−1 −1 −1 −1 53 −1 −1 −1 −1 −1 3 −1 35 −1 −1 −1 −1 −1
−1 −1 −1 −1 −1 −1 −1 −1 0 −1 0 −1 −1 −1 −1 −1 −1 −1
−1 −1 −1 −1 −1 −1 −1 40 −1 −1 −1 −1 20 −1 66 −1 −1 −1
−1 −1 −1 22 −1 28 −1 −1 −1 −1 −1 −1 −1 −1 −1 −1 −1 −1
−1 −1 0 −1 0 −1 −1 −1 −1 −1 −1 −1 −1 −1 −1 −1 −1 40
−1 −1 −1 −1 −1 −1 20 −1 66 −1 −1 −1 −1 22 −1 28 −1 −1
−1 −1 −1 −1 −1 −1 −1 −1 −1 −1 −1 −1 −1 −1 0 −1 0 −1 −1
−1 −1 −1 −1 −1 −1 −1 −1 −1 −1 0 −1 −1 −1 −1 −1 −1 −18
−1 −1 −1 42 −1 −1 −1 −1 50 −1 −1 −1 −18 −1 −1 −1 −1 −1
−1 −1 −1 −1 −1 −1 0 −1 0 −1 −1 −1 −1 −1 −1 −1 −1 −1
−1 0 −1 −1 −1 −1 −1 −1 −18 −1 −1 −1 42 −1 −1 50 −1 −1
−1 −1 −1 −1 8 −1 −1 −1 −1 −1 −1 −1 −1 −1 −1 −1 0 −1 0
−1 −1 −1 −1 −1 −1 −1 −1 −1 −1 69 −1 79 −1 79 −1 −1 −1
−1 −1 −1 −1 −1 56 −1 −1 52 −1 −1 −1 −1 −1 −1 −1 0 −1 −1
−1 −1 −1 −1 −1 −1 −1 −1 −1 −1 0 −1 0 −1 −1 −1 −1 −1 −1
−1 −1 −1 69 −1 79 −1 79 −1 −1 −1 −1 −1 56 −1 −1 −1 −1
−1 52 −1 −1 −1 −1 −1 −1 −1 0 −1 −1 −1 −1 −1 −1 −1 −1
−1 −1 0 −1 0 −1 −1 −1 −1 −1 −1 −1 −1 65 −1 −1 −1 −1 −1
−1 −1 38 −1 57 −1 −1 −1 −1 −1 72 −1 −1 −1 27 −1 −1 −1
−1 −1 −1 −1 −1 −1 −1 −1 −1 −1 −1 −1 −1 0 −1 0 −1 −1 −1
−1 −1 −1 −1 −1 −1 65 −1 −1 −1 −1 −1 −1 38 −1 57 −1
−1 −1 −1 −1 72 −1 −1 −1 27 −1 −1 −1 −1 −1 −1 −1 −1 −1
−1 −1 −1 −1 −1 −1 −1 −1 0 −1 0 −1 −1 −1 −1 −1 −1 64
−1 −1 −1 −1 −1 −1 14 −1 52 −1 −1 −1 −1 −1 30 −1 −1 −1
−1 −1 −1 32 −1 −1 −1 −1 −1 −1 −1 −1 −1 1 −1 −1 −1 −1 −1
0 −1 0 −1 −1 −1 −1 −1 64 −1 −1 −1 −1 −1 −1 14 −1 52
−1 −1 −1 −1 30 −1 −1 −1 −1 −1 32 −1 −1 −1 −1 −1 −1 −1
−1 −1 −1 −1 −1 −1 −1 −1 −1 −1 −1 0 −1 0 −1 −1 −1 −1 −1
−1 −1 45 −1 −1 −1 70 0 −1 −1 −1 −1 −1 −1 −1 77 −1 9 −1
−1 −1 −1 −1 −1 −1 −1 −1 −1 −1 −1 −1 −1 −1 −1 −1 −1 −1
−1 −1 −1 −1 0 −1 0 −1 −1 −1 −1 −1 45 −1 −1 −1 70 −1 −1
0 −1 −1 −1 −1 −1 −1 −1 77 −19 −1 −1 −1 −1 −1 −1 −1 −1
−1 −1 −1 −1 −1 −1 −1 −1 −1 −1 −1 −1 −1 −1 −1 0 −1 0 −1
−1 2 −1 56 −1 −1 −1 −1 57 35 −1 −1 −1 −1 −1 −1 −1 −1 −1
−1 −1 1 12 −1 −1 −1 −1 −1 −1 −1 −1 −1 −1 −1 −1 −1 −1 −1
−1 −1 −1 −1 −1 −1 −1 0 −1 0 −1 −1 2 −1 56 −1 −1 −1 57
−1 −1 35 −1 −1 −1 −1 −1 −1 −1 −1 −1 −1 −1 12 −1 −1 −1 −1
−1 −1 −1 −1 −1 −1 −1 −1 −1 −1 −1 −1 −1 −1 −1 −1 −1 −1
−1 −1 0 −1 0 −1 24 −1 −1 −1 61 −1 −1 −1 60 −1 −1 −1 −1
−1 27 51 −1 −1 −1 −1 −1 16 −1 1 −1 −1 −1 −1 −1 −1 −1 −1
−1 −1 −1 −1 −1 −1 −1 −1 −1 −1 −1 −1 −1 0 −1 24 −1 −1 −1
61 −1 −1 −1 60 −1 −1 −1 −1 −1 27 −1 −1 51 −1 −1 −1 −1
−1 16 −1 1 −1 −1 −1 −1 −1 −1 −1 −1 −1 −1 −1 −1 −1 −1
−1 −1 −1 −1 −1 −1 0].

In some implementations, the binary matrix may include the following set of values: [1 1 1 1 1 1 0 1 0 1 1 1 0 0 1
1 1 1 1 1 1 1 1 1 1 1 1 0 1 1 1 0 1 1 1 1 0 0 1 1 1 1 1 1
1 1 1 0 1 1 1 1 0 1 1 0 1 1 1 1 1 0 0 1 1 1 1 1 1 1 1 0 0 1
1 1 1 1 1 1 1 1 1 1 1 0 0 1 1 1 1 1 1 1 1 1 0 0 1 1 0 0
1 1 1 1 1 1 0 0 1 1 1 1 1 1 0 1 1 1 0 1 0 1 1 1 0 1 1 1
1 1 0 0 1 1 1 1 1 0 0 0 1 1 1 0 1 0 1 1 1 0 1 1 1 1 0 0 1
1 1 1 0 1 1 1 0 0 1 1 0 1 0 1 1 1 1 1 1 1 0 0 1 1 1 1 1 1
1 1 0 1 1 1 1 1 1 1 1 1 1 1 1 1 1 0 0 1 1 1 1 1 1 0 1 1 1 0
0 1 1 1 1 1 1 1 1 1 1 0 0 1 0 0 1 1 0 1 1 1 1 1 0 1 1 1 1
1 1 1 1 1 1 0 0 1 1 1 1 1 1 1 1 0 1 1 0 0 1 1 1 1 1 1 1
1 1 0]; and the second exponent matrix of the second parity check matrix corresponding to the binary matrix may include the following set of values: [−1 57 −1 −1 −1 −1 −1

−1 −1 50 −1 −1 1 1 −1 −1 −1 50 −1 −1 −1 −1 79 −1 −1 1 1
−1 0 −1 −1 −1 −1 −1 −1 −1 −1 −1 −1 −1 −1 −1 −1 −1 −1
−1 −1 57 −1 −1 −1 −1 −1 −1 −1 50 −1 −1 −1 −1 1 1 −1 −1
−1 50 −1 −1 79 −1 −1 −1 −1 1 1 −1 0 −1 −1 −1 −1 −1 −1 −1
−1 −1 −1 −1 −1 −1 −1 −1 −1 −1 −1 −1 −1 3 −1 −1 −1 28 −1
−1 0 −1 −1 −1 −1 −1 −1 −1 55 −1 −1 1 7 −1 −1 −1 −1 −1 −1
0 −1 0 −1 −1 −1 −1 −1 −1 −1 −1 −1 −1 −1 −1 −1 −1 −1 −1
−1 −1 −1 3 −1 −1 −1 28 −1 −1 −1 −1 0 −1 −1 −1 −1 −1 −1 −1
−1 55 7 −1 −1 −1 −1 −1 −1 −1 −1 −1 0 −1 0 −1 −1 −1 −1 −1
−1 −1 −1 −1 −1 −1 −1 −1 −1 −1 −1 −1 −1 30 −1 −1 −1 −1 −1
−1 −1 −1 −1 24 37 −1 −1 −1 −1 −1 56 −1 −1 14 −1 −1 −1
−1 −1 −1 −1 −1 1 1 0 −1 0 −1 −1 −1 −1 −1 −1 −1 −1 −1 −1
−1 −1 −1 −1 −1 −1 −1 30 −1 −1 −1 −1 −1 −1 24 −1 −1
37 −1 −1 −1 −1 −1 56 14 −1 −1 −1 −1 −1 −1 −1 −1 −1 −1
0 −1 0 −1 −1 −1 −1 −1 −1 −1 −1 −1 −1 −1 −1 −1 −1 −1 −1
62 −1 53 −1 −1 −1 −1 −1 −1 53 −1 −1 −1 −1 −1 3 −1 35 −1
−1 −1 −1 −1 −1 −1 −1 −1 −1 −1 −1 −1 0 −1 0 −1 −1 −1 −1 −1
−1 −1 −1 −1 −1 −1 −1 −1 −1 −1 −1 62 −1 53 −1 −1 −1 −1
53 −1 −1 −1 −1 −1 3 −1 35 −1 −1 −1 −1 −1 −1 −1 −1 −1 −1
−1 −1 −1 −1 0 −1 0 −1 −1 −1 −1 −1 −1 −1 −1 −1 −1 −1 −1
−1 −1 −1 40 −1 −1 −1 −1 20 −1 66 −1 −1 −1 −1 −1 22 −1
28 −1 −1 −1 −1 −1 −1 −1 −1 −1 −1 −1 −1 −1 −1 −1 0 −1 0
−1 −1 −1 −1 −1 −1 −1 −1 −1 −1 −1 −1 −1 −1 40 −1 −1 −1 −1
−1 −1 20 −1 66 −1 −1 −1 −1 −1 22 −1 28 −1 −1 −1 −1 −1
−1 −1 −1 −1 −1 −1 −1 −1 0 −1 0 −1 −1 −1 −1 −1 −1 −1 −1
1 −1 −1 −1 0 −1 −1 −1 −1 −1 −1 −1 −18 −1 −1 −1 42 −1 −1
−1 −1 50 −1 −1 −1 −18 −1 −1 −1 −1 −1 −1 −1 −1 −1 −1 −1
0 −1 0 −1 −1 −1 −1 −1 −1 −1 −1 −1 −1 −1 −1 −1 0 −1 −1 −1
−1 −1 −1 −18 −1 −1 −1 42 −1 −1 50 −1 −1 −1 −1 −1 −1 8
−1 −1 −1 −1 −1 −1 −1 −1 −1 −1 −1 0 −1 0 −1 −1 −1 −1 −1 −1
−1 −1 −1 −1 −1 69 −1 79 −1 79 −1 −1 −1 −1 −1 −1 56
−1 −1 −1 52 −1 −1 −1 −1 −1 −1 0 −1 −1 −1 −1 −1 −1 −1
−1 −1 −1 −1 0 −1 0 −1 −1 −1 −1 −1 −1 −1 −1 −1 69 −1
79 −1 79 −1 −1 −1 −1 −1 −1 56 −1 −1 −1 52 −1 −1 −1
−1 −1 −1 −1 0 −1 −1 −1 −1 −1 −1 −1 −1 −1 −1 0 −1 0
−1 −1 −1 −1 −1 −1 −1 −1 65 −1 −1 −1 −1 −1 −1 38 −1
57 −1 −1 −1 −1 −1 72 −1 −1 −1 27 −1 −1 −1 −1 −1 −1 −1
−1 −1 −1 −1 −1 −1 −1 −1 −1 0 −1 0 −1 −1 −1 −1 −1 −1
−1 −1 65 −1 −1 −1 −1 −1 −1 38 −1 57 −1 −1 −1 −1 −1
72 −1 −1 −1 27 −1 −1 −1 −1 −1 −1 −1 −1 −1 −1 −1 −1 −1
−1 −1 −1 −1 0 −1 0 −1 −1 −1 −1 −1 −1 −1 64 −1 −1 −1 −1
−1 −1 −1 14 52 −1 −1 −1 −1 −1 −1 30 −1 −1 −1 −1 −1 −1 32
−1 −1 −1 −1 −1 −1 −1 −1 −1 −1 −1 −1 −1 −1 −1 0 −1 0
−1 −1 −1 −1 −1 64 −1 −1 −1 −1 −1 −1 −1 14 −1 52 −1
−1 −1 −1 30 −1 −1 −1 −1 −1 32 −1 −1 −1 −1 −1 −1 −1 −1
−1 −1 −1 −1 −1 −1 −1 −1 −1 0 −1 0 −1 −1 −1 −1 −1 −1
−1 45 −1 −1 −1 70 0 −1 −1 −1 −1 −1 −1 −1 77 −1 9 −1 −1
−1 −1 −1 −1 −1 −1 −1 −1 −1 −1 −1 −1 −1 −1 −1 −1 −1 −1
1 −1 −1 1 1 0 −1 0 −1 −1 −1 −1 −1 45 −1 −1 −1 70 −1 −1 0
−1 −1 −1 −1 −1 −1 −1 77 −19 −1 −1 −1 −1 −1 −1 −1 −1
−1 −1 −1 −1 −1 −1 −1 −1 −1 −1 −1 −1 −1 0 −1 0 −1 −1 −1
2 −1 56 −1 −1 −1 −1 57 35 −1 −1 −1 −1 −1 −1 −1 −1 −1
−1 12 −1 −1 −1 −1 −1 −1 −1 −1 −1 −1 −1 −1 −1 −1 −1 −1
−1 −1 −1 −1 −1 −1 −1 0 −1 0 −1 −1 2 −1 56 −1 −1 57 −1
−1 35 −1 −1 −1 −1 −1 −1 −1 −1 −1 −1 12 −1 −1 −1 −1
−1 −1 −1 −1 −1 −1 −1 −1 −1 −1 −1 −1 −1 −1 −1 −1 −1 −1
−1 0 −1 0 −1 24 −1 −1 −1 61 −1 −1 −1 60 −1 −1 −1 −1 −1
27 51 −1 −1 −1 −1 −1 16 −1 1 1 −1 −1 −1 −1 −1 −1 −1 −1
−1 −1 −1 −1 −1 −1.1.1 −1 −1 −1 −1 0 −1 24 −1 −1 −1 61
−1 −1 −1 60 −1 −1 −1 −1 −1 27 −1 −1 51 −1 −1 −1 −1 −1
16 −1 1 1 −1 −1. −1 −1 −1 −1 −1 −1 −1 −1 −1 −1 −1 −1
−1 0].

Generally, a parity check matrix for a code represents equations that determine whether errors have occurred during transmission. More formally, for all valid codewords (i.e., bits produced by the encoder with no errors), the following equation can be true:

$$Hc = 0 \qquad \text{(Equation 1)}$$

In Equation 1, "H" is the parity check matrix, "c" is a codeword vector, and "0" is a vector of all zeroes. The parity check matrix, H, is one way of describing a code.

A generator matrix for a code, G, satisfies the following equation:

$$sG = c \qquad \text{(Equation 2)}$$

In Equation 2, "s" is a vector of information bits, "G" is a generator matrix and "c" is the codeword that corresponds to "s." In some embodiments, a system (e.g., a communication system 108 including a decoder 160 in FIG. 1) can decode the codeword c to obtain the decoded data s using Equation 2.

The parity check and generator matrices for a code are related per the above matrix equations. Generally, if a parity check matrix is low density, the corresponding generator matrix will be high density, and vice versa. LCPC codes are accordingly characterized by low density parity check matrices and high density generator matrices. The density of a matrix relates to the number of operations that must be performed to implement one of the above equations. Although it was recognized by 1995 that LDPC codes could be used to transmit data with very few errors, i.e., with error rates as good or better than turbo codes, one disadvantage of LDPC codes is that their generator matrices were high density and that made encoding computationally intensive, rending the codes impractical for many applications.

In some implementations, a parity check matrix may have a quasi-cyclic structure, for example, a parity check matrix for QC-LDPC code (n=3888, k=1944, R=3/4). Given a lifting size z, the parity check matrix may have a plurality of sub-matrices such that each submatrix is cyclically shifted version of an identity matrix of size (z×z), where z=162, for example. A parity check matrix can be represented in two equivalent forms: (1) parity check matrix H and (2) a block matrix or an exponent matrix P=E(H).

In some implementations, a parity check matrix H may be a binary matrix whose size is m×n (each of m and n is an integer). Elements of the parity check matrix are binary values. Given a block length n and a code rate R, an LDPC code (or QC-LDPC code) LDPC (n, R) satisfies the following equations:

$$k = nR \qquad \text{(Equation 3)}$$

$$m = n(1 - R) \qquad \text{(Equation 4)}$$

In some implementations, a block matrix or an exponent matrix (QC-LDPC exponent matrix) may be obtained. Given a lifting size z, the exponent matrix P=E(H) may have a size of m/z×n/z. If n=24z (e.g., n=3888, z=162), then the size of P=E(H) is 24 (1−R)×24 (=n(1−R)/z×n/z). Elements of the exponent matrix may be integer values which correspond to cyclic shift values of identity matrix of size z×z. A parity check matrix H may be a sparse binary matrix that can be derived from an exponent matrix P-E(H). The generator matrix G may have a size n×k in binary form (e.g., elements of the generator matrix G are binary values). The exponent matrix P=E(H) may have a structure including a plurality of sub-matrices (e.g., A, B, C, D, E, T).

In some implementations, a binary QC-LDPC code LDPC (n, R) may be characterized by the null space of an n(1−R)×n parity check matrix H. The parity check matrix H may be a binary sparse matrix which includes a set of circulant matrices of size z×z. The parity-check matrix H of a QC-LDPC code can be represented equivalently by an exponent matrix P=E(H). This representation can help to illustrate the graphical structure of the underlying code as a base graph along with coefficient of shifting.

In some implementations, a parity check matrix H may be generated from an exponent matrix P=E(H). The exponent matrix P=E(H) may include (as elements) shift values d in the range 0<=d<z along with d=−1. For example, if z=7, the shift values d may include −1, 0, 1, 2, 3, 4, 5, 6. The shift value d=0 may correspond (or map) to an identity matrix of size z×z, denoted by I(z). The shift value d=−1 may correspond (or map) to a null matrix (all elements zero) of size z×z, denoted by 0*I(z). Any other integer value d in [1,z−1] may correspond (or map) to a matrix cyclically right shifted from I(z). The parity check matrix H can be obtained from the exponent matrix P=E(H) by expanding the exponent matrix P such that each element of the exponent matrix P (as a shift value d) is replaced by a matrix corresponding to the shift value.

In some implementations, the exponent matrix P=E(H) may include a plurality of elements P1,1, P1,2, P1,3, . . . , P1,ń; P2,1, P2,2, P2,3, . . . , P2,ń; . . . , P1,1, P1,2, P1,3, . . . , Pṁ,ń, which correspond to (m×n) values where m and n satisfy the following equations:

$$\acute{m} = n(1 - R)/z \qquad \text{(Equation 5)}$$

$$\acute{n} - n/z \qquad \text{(Equation 6)}$$

The exponent matrix (or permutation matrix) P=E(H) may be expressed as following:

$$P \equiv E(H) = \begin{pmatrix} P_{1,1} & P_{1,2} & P_{1,3} & \cdots & \cdots & P_{1,\acute{n}} \\ P_{2,1} & P_{2,2} & P_{2,3} & \cdots & \cdots & P_{2,\acute{n}} \\ \cdots & \ddots & \ddots & \cdots & \cdots & \vdots \\ P_{\acute{m},1} & P_{\acute{m},2} & P_{\acute{m},3} & \cdots & \cdots & P_{\acute{m},\acute{n}} \end{pmatrix} \qquad \text{(Equation 7)}$$

The corresponding parity check matrix H may be obtained by replacing each element of the matrix (as a shift value d) by a matrix C(d) corresponding to the shift value as follows:

$$H = \begin{pmatrix} C(P_{1,1}) & C(P_{1,2}) & C(P_{1,3}) & \cdots & \cdots & C(P_{1,\acute{n}}) \\ C(P_{2,1}) & C(P_{2,2}) & C(P_{2,3}) & \cdots & \cdots & C(P_{2,\acute{n}}) \\ \cdots & \ddots & \ddots & \cdots & \cdots & \vdots \\ C(P_{\acute{m},1}) & C(P_{\acute{m},2}) & C(P_{\acute{m},3}) & \cdots & \cdots & C(P_{\acute{m},\acute{n}}) \end{pmatrix} \qquad \text{(Equation 8)}$$

For example, a matrix C(1) may be expressed as follows:

$$C(1) = \begin{pmatrix} 0 & 1 & 0 & \ldots & \ldots & 0 \\ 0 & 0 & 1 & \ldots & \ldots & \ddots \\ \ddots & \ddots & \ddots & \ldots & \ldots & \vdots \\ 0 & 0 & 0 & \ldots & \ldots & 1 \\ 1 & 0 & 0 & \ldots & \ldots & 0 \end{pmatrix}$$

(Equation 9)

In some implementations, an encoder can produce codewords using a generator matrix (e.g., using Equation 2). In some embodiments, an encoder can use the parity check matrix (rather than the generator matrix) to produce codewords from vectors of information bits. After a parity check matrix H is obtained, the parity check matrix H may have sub-matrices A, B, C, D, T, E. An upper area O of the sub-matrix T may correspond to an area in which the matrix contains all zeroes, and the other areas may represent locations that can contain ones.

In some implementations, the codeword c can be obtained by the following expression:

$$c = [s\ p1\ p2],$$

(Equation 10)

where "s" is the vector of information bits to be encoded, "$p_1$" is a vector of the first g parity bits and "$p_2$" is a vector of the remaining m-g parity bits.

The vectors p1 and p2 can be obtained by the following equations:

$$\Phi = -ET^{-1}B + D;$$

(Equation 11)

$$p_{1T} = -\Phi^{-1}\left(-ET^{-1}A + C\right)s^T;\ \text{and}$$

(Equation 12)

$$p_{2T} = -T^{-1}\left(As^T + Bp_1^T\right).$$

(Equation 13)

Although various embodiments disclosed herein are described for encoding data for a wireless communication (e.g., wireless local area network (WLAN) conforming to any IEEE 802.11 standard), principles disclosed herein are applicable to other types of communication (e.g., wired communication) or any process that performs encoding for LDPC codes.

In some implementations, a system and/or a method can generate LDPC codes having code rate of 3/4 using Khatri-Rao lifting (e.g., using Khatri-Rao product). For example, the system can use a base LDPC code (as mother code) to recursively construct LDPC codes having a block length that is double the block length of the base LDPC code. The mother code can be defined by a parity check matrix H or an exponent matrix P=E(H) as in QC-LDPC code. Each entry in P may be an integer value, corresponding to a cyclic shift value of an identity matrix of size z×z.

In some implementations, the system can determine (e.g., calculate, compute, obtain) a binary matrix Γ, which has the same size (or dimension) as P=E(H). The binary matrix Γ may internally include sub-matrices which are powers of exchange matrix $$J(2) = \begin{pmatrix} 0 & 1 \\ 1 & 0 \end{pmatrix},$$

e.g., an exchange matrix of order 2. The matrix Γ whose non-zero values (1) may be randomized such that the rank of the binary matrix maintains to be full rank while the binary matrix conforms to good LDPC code performances (e.g., achieving low packet error rates). The system can perform a computer search (e.g., search using one or more processors) to identify the most optimal Γ that can yield the least packet error performance (e.g., packet error rate (PER)). For example, the matrix Γ can maintain to have full rank, which equals 24/(1−R), for a Wi-Fi code with code rate R. For example, for a code rate of R=3/4, the binary matrix Γ may have a dimension of 12×24 (12 rows, 24 columns) and have full rank of 12 (=24/(1−1/2)). The rank of a matrix refers to a maximal number of linearly independent columns of the matrix or a dimension of the vector space generated by the columns of the matrix.

In some implementations, LDPC codes generated (e.g., constructed, created) using a Khatri-Rao lifting scheme can be used to design Wi-Fi LDPC codes of block length=3888 bits from existing LDPC codes of block length=1944 bits.

Khatri-Rao product is an extension to the operation of block wise Kronecker products when the involved matrices are suitably partitioned. Khatri-Rao product can be defined as follows. Consider two matrices A, B of orders (dimensions or sizes) u×v and p×q, respectively. In compart form, $A=(a_{i,j})$ and $B=(b_{k,l})$. Further let $A=(A_{i,j})$ be partitioned with $A_{i,j}$ of order $u_i×v_j$ as (i, j)$^{th}$ sub-matrix block, and $B=(B_{i,j})$ be partitioned with $B_{i,j}$ of order $P_k×q_l$ as (k, l)$^{th}$ sub-matrix block, where $\Sigma_i u_i=u$, $\Sigma_j v_j=v$, $\Sigma_k p_k=p$, $\Sigma_l q_l=q$. Khatri-Rao product operation of two matrices A and B can be defined as follows:

$$A \odot B = (A_{i,j} \otimes B_{i,j})_{i,j}$$

(Equation 14)

where ⊛ is the Khatri-Rao product operation, $A_{i,j} \otimes B_{i,j}$ is the Kronecker product of order $u_i p_i×v_j q_j$ and the overall output A⊛B has order $\Sigma_i u_i p_i×\Sigma_j v_j q_j$. Extension to block wise Kronecker products when the involved matrices can be well partitioned. An example of calculating Khatri-Rao product is shown as follows. Let $$A = \begin{pmatrix} 1 & 0 & 2 & 7 \\ 3 & 6 & 2 & 3 \end{pmatrix}$$

$$B = \begin{pmatrix} -1 & -2 & 5 & 9 & 9 & 2 & 8 & 1 \\ 5 & 1 & 0 & 4 & 3 & 8 & 9 & 3 \\ 3 & -1 & 8 & 8 & 3 & 9 & 0 & 2 \\ 2 & 0 & 9 & 3 & 9 & 1 & 6 & 5 \end{pmatrix}$$

Then, with $u_i=1, v_i=1$, $1<i\leq2$, $1\leq j\leq4$ and $p_k=q_l=2$, $1\leq k\leq2$, $1\leq l<4$, the Khatri-Rao product of A and B is given by $$A \odot B = \begin{pmatrix} -1 & -2 & 0 & 0 & 18 & 4 & 56 & 7 \\ 5 & 1 & 0 & 0 & 6 & 16 & 63 & 21 \\ 9 & -3 & 48 & 48 & 6 & 18 & 0 & 6 \\ 6 & 0 & 54 & 18 & 18 & 2 & 18 & 15 \end{pmatrix}$$

In some embodiments, the system can perform (e.g., calculate, compute) Khatri-Rao lifting as follows. Let P=E(H) be an exponent matrix corresponding to a parity check matrix H of a QC-LDPC code. The exponent matrix may include integer values between −1, 0, . . . , z−1 where z is a design parameter of the code. For block length of 1944, the system may use z=81 for Wi-Fi error correction codes. The parity check matrix H can be obtained from the P matrix, by cyclic shifting identity matrix $\|I^{Z\times Z}$ by the constituent entries of P. The system can determine (e.g., calculate, compute, obtain) a new code matrix $\acute{P}$ using Equation 15 as follows.

$$H' = H \odot J^{\odot\Gamma} - J^{\odot(1_{u\times v} - \Gamma)}. \qquad \text{(Equation 15)}$$

where $\circledast$ is the Khatri-Rao product operation, $\Gamma$ is a binary matrix, 1 is the all one matrix whose order (dimension or size) is the same as the $\Gamma$ matrix (e.g., u×v), and $$J = J(2) = \begin{pmatrix} 0 & 1 \\ 1 & 0 \end{pmatrix}$$

is called the exchange matrix of order 2. $\odot$ is an operation involving matrix exponent defined as follows:

$$A^{\odot B} \triangleq \left(A^{B_{i,j}}\right)_{i=1:u,j=1:v}, B \in \mathbb{F}_2^{u\times v}. \qquad \text{(Equation 16)}$$

where B has a dimension of (u×v).

In some implementations, the system can generate (e.g., calculate, compute, obtain) a (new) parity check code by calculating a Khatri-Rao product of a parity check matrix (of size m×n) of a base code and a binary (random) matrix $\Gamma$ (using Equation 16). In some implementations, the system may determine the binary matrix $\Gamma$ by iteratively changing an entry of the matrix and finding one or more best matrices in terms of the number of shortest loops and/or packet error performance (see FIG. 10).

In some implementations, the system can define (e.g., calculate, compute, obtain, generate) the base code as a parity check matrix H or an exponent matrix E(H) as in QC-LDPC code. The system can calculate (e.g., generate, compute, obtain, determine) the binary matrix $\Gamma$, which has the same size as E(H). In some implementations, if H is chosen as the representation of the parity check matrix, the matrix $\Gamma$ can have the same size as H. The matrix $\Gamma$ can internally include sub-matrices which are powers of exchange matrix J (2). The binary matrix $\Gamma$ whose non-zero values (e.g., value "1") can be randomized such that the resulting matrix conforms to good LDPC code performances (e.g., packet error performance). For example, the system can randomize non-zero values of the binary matrix $\Gamma$ (which has a dimension of (u×v)) such that the matrix $\Gamma$ can maintain full rank which equals min (u,v)=24/(1−R), for Wi-Fi error correction codes with a code rate of R. Examples of binary matrix $\Gamma$ are shown in FIG. 7, but the present disclosure is not limited thereto and any suitable binary matrix $\Gamma$ can be used to generate a QC-LDPC code. Examples of exponent matrix E(H) and parity check matrix H are shown in FIG. 8A and FIG. 8B, respectively, but the present disclosure is not limited thereto (e.g., not restricted to Wi-Fi error correction code alone) and the techniques according to some embodiments can apply to any generic parity check matrix or its equivalent cyclic representation. In some embodiments, the system can validate a binary $\Gamma$ matrix from a given parity check matrix and a base matrix. For example, the system can validate a binary $\Gamma$ matrix based on performance of the a given parity check matrix and the base matrix. In some embodiments, the binary $\Gamma$ matrix can be any binary matrix $\Gamma$ which are full rank. A matrix (say matrix A) is full rank if the rank of the matrix A is the highest possible for a matrix of the same size as the matrix A.

Embodiments in the present disclosure have at least the following advantages and benefits.

First, embodiments in the present disclosure can provide useful techniques for providing significant gains across all modulation schemes. For example, the block length (e.g., 3888 bits) of an QC-LDPC code according to some implementations is at least 2 times that of the longest code supported in 802.11n-802.11be standards (e.g., 1994 bits). This QC-LDPC code can provide about 2 dB gain in 2×2 MIMO (multiple input multiple output) channels and the gains are consistent across all modulation schemes with or without beamforming.

Second, embodiments in the present disclosure can provide useful techniques for providing significant gains (e.g., 0.5 dB~1.2 dB gain in SNR (signal to noise ratio) over existing codes) across all modulation schemes. For example, the block length (e.g., 3888 bits) of an QC-LDPC code according to some implementations is at least 2 times that of the longest code supported in 802.11n-802.11be standards (e.g., 1994 bits). This QC-LDPC code can provide about 2 dB gain in 2×2 MIMO channels and the gains are consistent across all modulation schemes with or without beamforming.

Third, codes generated using systems and/or methods according to embodiments in the present disclosure can help in parallel decoding and re-use of several blocks of mother code.

Referring to FIG. 1, illustrated is a diagram depicting an example communication environment 100 including communication systems (or communication apparatuses) 105, 108, according to one or more embodiments. In one embodiment, the communication system 105 includes a baseband circuitry 110 and a transmitter circuitry 120, and the communication system 108 includes a baseband circuitry 150 and a receiver circuitry 140. In one aspect, the communication system 105 is considered a transmitter communication system, and the communication system 108 is considered a receiver communication system. These components operate together to exchange data (e.g., messages or frames) through a wireless medium. These components are embodied as application specific integrated circuit (ASIC), field programmable gate array (FPGA), or any combination of these, in one or more embodiments. In some embodiments, the communication systems 105, 108 include more, fewer, or different components than shown in FIG. 1. For example, each of the communication systems 105, 108 includes transceiver circuitry to allow bi-directional communication between the communication systems 105, 108 or with other communication systems. In some embodiments, each of the communication systems 105, 108 may have configuration similar to that of a computing system 2000 as shown in FIG. 2.

The baseband circuitry 110 of the communication system 105 is a circuitry that generates the baseband data 115 for transmission. The baseband data 115 includes information data (e.g., signal(s)) at a baseband frequency for transmission. In one approach, the baseband circuitry 110 includes an encoder 130 that encodes the data, and generates or outputs parity bits. In one aspect, the baseband circuitry 110 (or encoder 130) obtains a generator matrix or a parity check matrix, or uses a previously produced generator matrix or a previously produced parity check matrix, and encodes the information data by applying the information data to the generator matrix or the parity check matrix to obtain a codeword. In some embodiments, the baseband circuitry 110 stores one or more generator matrices or one or more parity check matrices that conform to any IEEE 802.11 standard for WLAN communication. The baseband circuitry 110 retrieves the stored generator matrix or the stored parity check matrix in response to detecting information data to be transmitted, or in response to receiving an instruction to encode the information data. In one approach, the baseband circuitry 110 generates the parity bits according to a portion of the generator matrix or using the parity check matrix, and appends the parity bits to the information bits to form a codeword. The baseband circuitry 110 generates the baseband data 115 including the codeword for the communication system 108, and provides the baseband data 115 to the transmitter circuitry 120.

The transmitter circuitry 120 of the communication system 105 includes or corresponds to a circuitry that receives the baseband data 115 from the baseband circuitry 110 and transmits a wireless signal 125 according to the baseband data 115. In one configuration, the transmitter circuitry 120 is coupled between the baseband circuitry 110 and an antenna (not shown). In this configuration, the transmitter circuitry 120 up-converts the baseband data 115 from the baseband circuitry 110 onto a carrier signal to generate the wireless signal 125 at an RF frequency (e.g., 10 MHz to 60 GHz), and transmits the wireless signal 125 through the antenna.

The receiver circuitry 140 of the communication system 108 is a circuitry that receives the wireless signal 125 from the communication system 105 and obtains baseband data 145 from the received wireless signal 125. In one configuration, the receiver circuitry 140 is coupled between the baseband circuitry 150 and an antenna (not shown). In this configuration, the receiver circuitry 140 receives the wireless signal 125 though an antenna, and down-converts the wireless signal 125 at an RF frequency according to a carrier signal to obtain the baseband data 145 from the wireless signal 125. The receiver circuitry 140 then provides the baseband data 145 to the baseband circuitry 150.

The baseband circuitry 150 of the communication system 108 includes or corresponds to a circuitry that receives the baseband data 145 from the receiver circuitry 140 and obtains information data from the received baseband data 145. In one embodiment, the baseband circuitry 150 includes a decoder 160 that extracts information and parity bits from the baseband data 145. The decoder 160 decodes the baseband data 145 to obtain the information data generated by the baseband circuitry 110 of the communication system 105.

In some embodiments, each of the baseband circuitry 110 (including the encoder 130), the transmitter circuitry 120, the receiver circuitry 140, and the baseband circuitry 150 (including the decoder 160) may be as one or more processors, application specific integrated circuit (ASIC), field programmable gate array (FPGA), or any combination of them.

FIG. 2 is a schematic block diagram of a computing system, according to an embodiment. An illustrated example computing system 2000 includes one or more processors 2010 in direct or indirect communication, via a communication system 2040 (e.g., bus), with memory 2060, at least one network interface controller 2030 with network interface port for connection to a network (not shown), and other components, e.g., input/output ("I/O") components 2050. Generally, the processor(s) 2010 will execute instructions (or computer programs) received from memory. The processor(s) 2010 illustrated incorporate, or are connected to, cache memory 2020. In some instances, instructions are read from memory 2060 into cache memory 2020 and executed by the processor(s) 2010 from cache memory 2020. The computing system 2000 may not necessarily contain all of these components shown in FIG. 2, and may contain other components that are not shown in FIG. 2.

In more detail, the processor(s) 2010 may be any logic circuitry that processes instructions, e.g., instructions fetched from the memory 2060 or cache 2020. In many implementations, the processor(s) 2010 are microprocessor units or special purpose processors. The computing device 2050 may be based on any processor, or set of processors, capable of operating as described herein. The processor(s) 2010 may be single core or multi-core processor(s). The processor(s) 2010 may be multiple distinct processors.

The memory 2060 may be any device suitable for storing computer readable data. The memory 2060 may be a device with fixed storage or a device for reading removable storage media. Examples include all forms of volatile memory (e.g., RAM), non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, or Blu-Ray® discs). A computing system 2000 may have any number of memory devices 2060.

The cache memory 2020 is generally a form of computer memory placed in close proximity to the processor(s) 2010 for fast read times. In some implementations, the cache memory 2020 is part of, or on the same chip as, the processor(s) 2010. In some implementations, there are multiple levels of cache 2020, e.g., L2 and L3 cache layers.

The network interface controller 2030 manages data exchanges via the network interface (sometimes referred to as network interface ports). The network interface controller 2030 handles the physical and data link layers of the OSI model for network communication. In some implementations, some of the network interface controller's tasks are handled by one or more of the processor(s) 2010. In some implementations, the network interface controller 2030 is part of a processor 2010. In some implementations, the computing system 2000 has multiple network interfaces controlled by a single controller 2030. In some implementations, the computing system 2000 has multiple network interface controllers 2030. In some implementations, each network interface is a connection point for a physical network link (e.g., a cat-5 Ethernet link). In some implementations, the network interface controller 2030 supports wireless network connections and an interface port is a wireless (e.g., radio) receiver or transmitter (e.g., for any of the IEEE 802.11 protocols, near field communication "NFC", Bluetooth, ANT, or any other wireless protocol). In some implementations, the network interface controller 2030 implements one or more network protocols such as Ethernet. Generally, a computing device 2050 exchanges data with other computing devices via physical or wireless links through a network interface. The network interface may link directly to another device or to another device via an intermediary device, e.g., a network device such as a hub, a bridge, a switch, or a router, connecting the computing device 2000 to a data network such as the Internet.

The computing system 2000 may include, or provide interfaces for, one or more input or output ("I/O") devices. Input devices include, without limitation, keyboards, microphones, touch screens, foot pedals, sensors, MIDI devices, and pointing devices such as a mouse or trackball. Output devices include, without limitation, video displays, speakers, refreshable Braille terminal, lights, MIDI devices, and 2-D or 3-D printers.

Other components may include an I/O interface, external serial device ports, and any additional co-processors. For example, a computing system 2000 may include an interface (e.g., a universal serial bus (USB) interface) for connecting input devices, output devices, or additional memory devices (e.g., portable flash drive or external media drive). In some implementations, a computing device 2000 includes an additional device such as a co-processor, e.g., a math co-processor can assist the processor 2010 with high precision or complex calculations.

The components 2090 may be configured to connect with external media, a display 2070, an input device 2080 or any other components in the computing system 2000, or combinations thereof. The display 2070 may be a liquid crystal display (LCD), an organic light emitting diode (OLED) display, a flat panel display, a solid state display, a cathode ray tube (CRT) display, a projector, a printer or other now known or later developed display device for outputting determined information. The display 2070 may act as an interface for the user to see the functioning of the processor(s) 2010, or specifically as an interface with the software stored in the memory 2060.

The input device 2080 may be configured to allow a user to interact with any of the components of the computing system 2000. The input device 2080 may be a plurality pad, a keyboard, a cursor control device, such as a mouse, or a joystick. Also, the input device 2080 may be a remote control, touchscreen display (which may be a combination of the display 2070 and the input device 2080), or any other device operative to interact with the computing system 2000, such as any device operative to act as an interface between a user and the computing system 2000.

Figure 3:
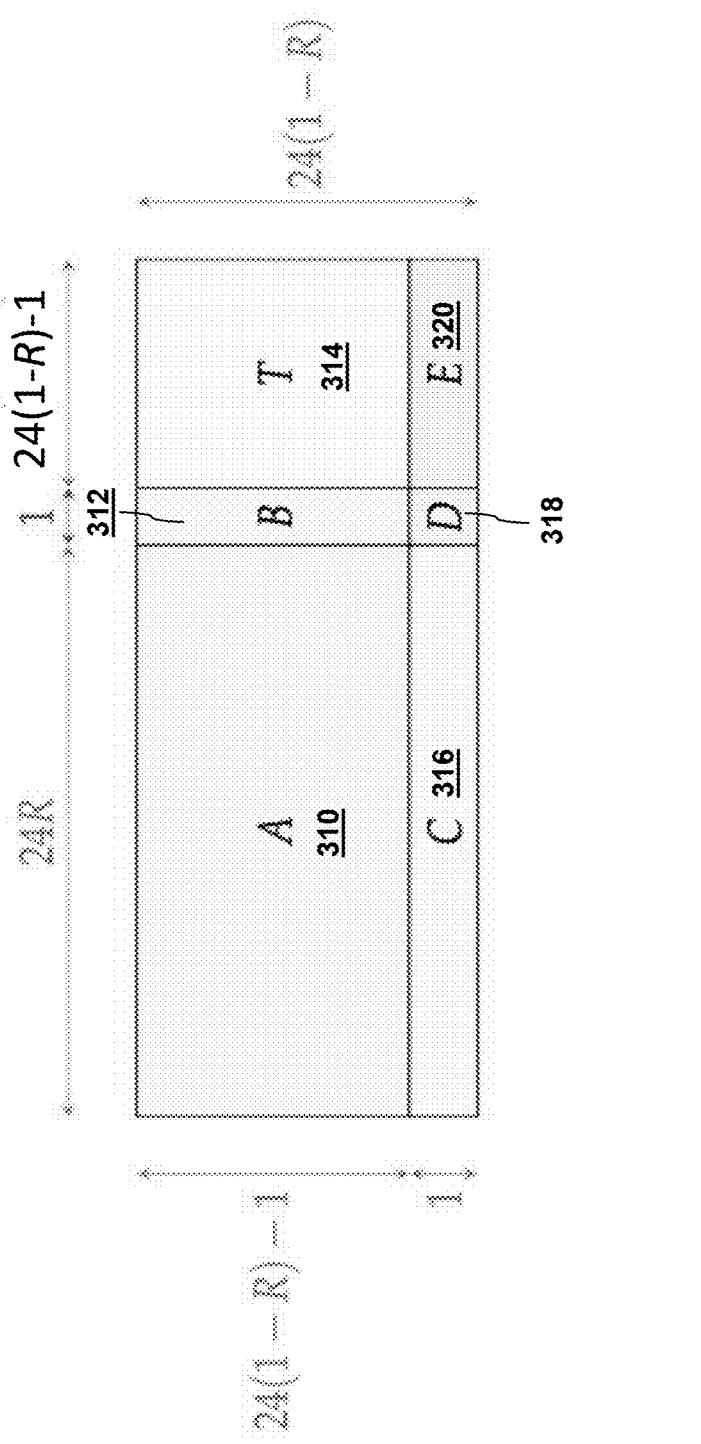
FIG. 3 is a diagram depicting an example exponent matrix, according to one or more embodiments.

FIG. 3 is a diagram depicting an example exponent matrix (QC-LDPC exponent matrix) 300, according to one or more embodiments. Given a lifting size z, the exponent matrix 300 may have a size of m/z×n/z. If n=24z (e.g., n=3888, z=162), then the size of P=E(H) is 24 (1−R)×24 (=n(1−R)/ z×n/z). Elements of the exponent matrix may be integer values which correspond to cyclic shift values of identity matrix of size z×z. A parity check matrix H (see FIG. 5) may be a sparse binary matrix that can be derived from an exponent matrix P=E(H). The generator matrix G may have a size n×k in binary form (e.g., elements of the generator matrix G are binary values). Referring to FIG. 3, the exponent matrix P=E(H) may have a structure including a plurality of sub-matrices (e.g., A 310, B 312, C 316, D 318, E 320, T 314).

Figure 4:
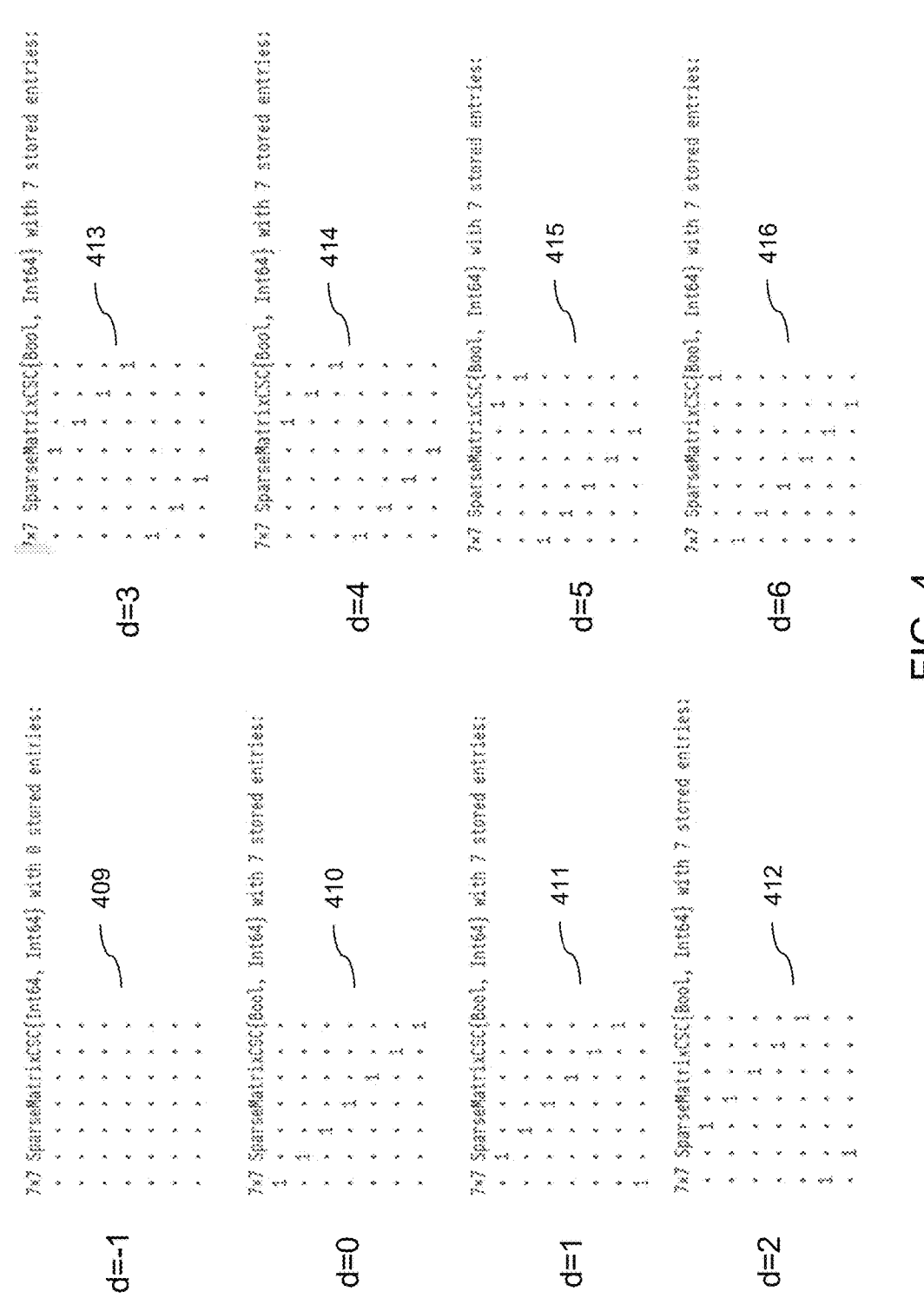
FIG. 4 is a diagram depicting example shifted identity matrices for generating a parity check matrix, according to one or more embodiments.

FIG. 4 is a diagram 400 depicting example shifted identity matrices 409, 410, 411, 412, 413, 414, 415, 416 for generating a parity check matrix, according to one or more embodiments. A parity check matrix H may be generated from an exponent matrix P=E(H) (e.g., exponent matrix 300) or may be identified using a codebook. As shown in Equation 7, the exponent matrix P=E(H) may include (as elements) shift values d in the range (<=d<z along with d=−1. See Equation For example, if z=7, the shift values d may include −1, 0, 1, 2, 3, 4, 5, 6 (see FIG. 4). The shift value d=0 may correspond (or map) to an identity matrix of size z×z, denoted by I(z) (e.g., matrix 410). The shift value d=−1 may correspond (or map) to a null matrix (all elements zero) of size z×z, denoted by 0*I(z) (e.g., matrix 409). Any other integer value d in [1,z-1] may correspond (or map) to a matrix cyclically right shifted from I(z) (e.g., matrices 411, 412, 413, 414, 415, 416). As shown in Equation 8, the parity check matrix H can be obtained from the exponent matrix P=E(H) by expanding the exponent matrix P such that each element of the exponent matrix P (as a shift value d) is replaced by a matrix corresponding to the shift value.

Figure 5:
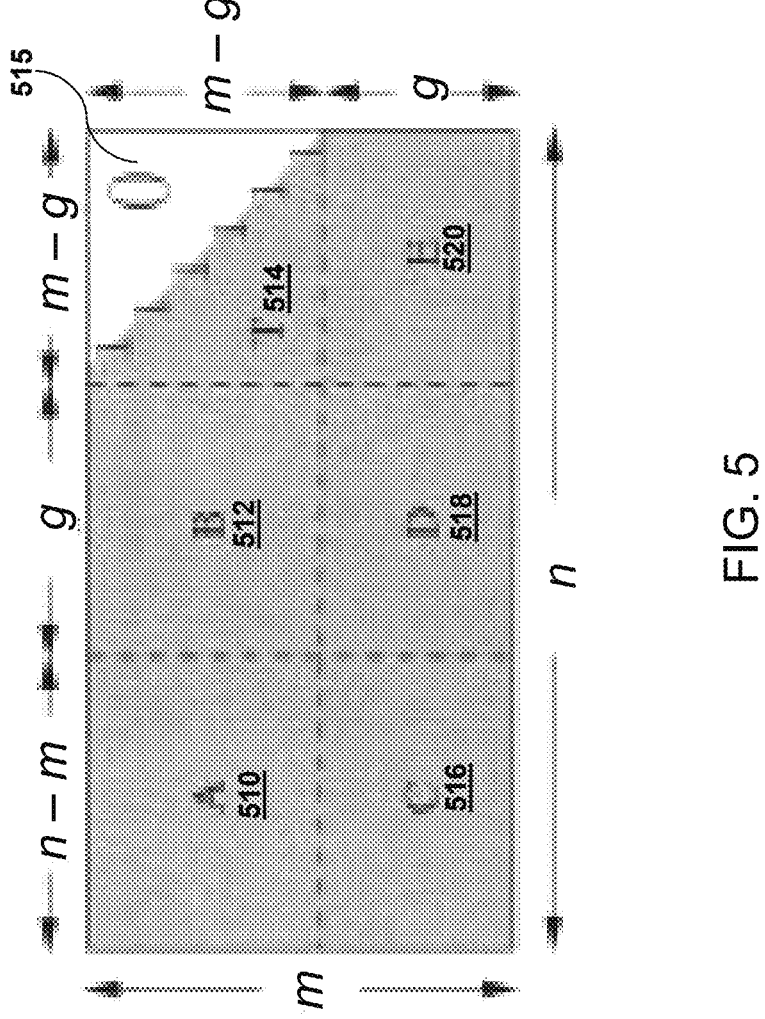
FIG. 5 is a diagram depicting an example parity check matrix, according to one or more embodiments.

FIG. 5 is a diagram depicting an example parity check matrix 500, according to one or more embodiments. In some implementations, an encoder (e.g., encoder 130) can produce codewords using a generator matrix (e.g., using Equation 2). In some implementations, an encoder (e.g., encoder 130) can use the parity check matrix (rather than the generator matrix) to produce codewords from vectors of information bits. After a parity check matrix H is obtained (e.g., using a codebook), the parity check matrix H (e.g., parity check matrix 500) may have sub-matrices A 510, B 512, C 516, D 518, T 514, E 520. An upper area O 515 of the sub-matrix T 514 (e.g., white area in FIG. 5) may correspond to an area in which the matrix contains all zeroes, and the other areas (e.g., grey area in FIG. 5) may represent locations that can contain ones. The size of the parity check matrix 500 may be m×n where the size of the sub-matrix D 518 is g×g, and the size of the sub-matrix T is (m−g)×(m−g). In some implementations, given a vector s of information bits to be encoded, the encoder can obtain a codeword c using Equation 10, Equation 11, Equation 12 and Equation 13.

In some implementations, a codebook for R=1/2 LDPC code of blocklength=3888 bits can provide high performance error correction and/or provide up to 1.2 dB gain over existing LDPC codes specified in the Wi-Fi standards. In some implementations, a collection of LDPC codes with a block length of 3888 bits (2×1944), supporting all the code rates in a Wi-Fi standard (e.g., 802.11be). The code (e.g., R=1/2 LDPC code of blocklength=3888 bits) can be directly used in an existing modulation of 64-QAM in the IEEE 802.11be and potentially in combination with more combinations of QAM sizes in the IEEE 802.bn.

In some implementations, a codebook for R=1/2 LDPC code of blocklength=3888 bits can be directly used in an existing modulation as in existing modulation scheme like binary phase-shift keying (BPSK), quadrature phase-shift keying (BPSK), 16-QAM, 64-QAM, 256-QAM, 1024-QAM, and 4096-QAM, as seen in standards such as IEEE 802.11be or IEEE 802.11bn. Moreover, a codebook for R=1/2 LDPC code of blocklength=3888 bits can have the potential to be employed in conjunction with one or more combinations of QAM sizes, whether similar or different, across OFDMA resource units (RU), distributed RU (DRU), punctured RUs (MRU), within a single stream and or across multiple spatial streams, as provisioned in MIMO configurations.

The collection of LDPC codes with a block length of 3888 bits (2×1944) can deliver considerable performance improvements in various communication scenarios in ultra high reliability (UHR), while maintaining manageable complexity. Performance comparisons are conducted between these codes and LDPC codes specified in the IEEE 802.11be standards, as well as recently proposed codes with a block length of 4×1944. Results of the performance comparisons show demonstrable gains across the board (e.g., channels, PHY bandwidth, MIMO, modulation coding scheme (MCS), Transmit Beamforming). For example, LDPC codes with a block length of 3888 bits according to some implementations can provides 0.5-1.0 dB gains over the present 802.11 LDPC codes, depending on channel conditions. LDPC codes with a block length of 4×1944 bits can provide additional 0.0-0.5 dB gain, depending on channel conditions.

The longest LDPC codes specified in 802.11be standards have block length=1944 bits. Performance wise, the LDPC codes specified in 802.11be standards are about 2.7 dB away from the optimum random codes (e.g., bit-interleaved coded modulation (BICM)-additive white Gaussian noise (AWGN)-QAM (Quadrature Amplitude Modulation) R=1/2 limits). Longer blocklength random codes (e.g., the Shannon limit deals with the asymptotic case when the blocklength grows unboundedly large) can lead to enhanced coding gains, in accordance with the finite-length scaling laws. Deterministic codes, which are suboptimal, can exhibit scaling gains that are significantly larger than those of optimal random codes. For example, in AWGN a doubling effect is known to be true.

In some implementations, LDPC codes with block-length=2×1944=3888 bits (which double the size of maximum supported blocklength in the present 802.11be standards). In some implementations, LDPC codes with blocklength=3888 bits can support all the existing code rates (e.g., R=1/2, 2/3, 3/4 and 5/6). In some implementations, LDPC codes with blocklength=3888 bits can keep the structure of the 802.11be code, QC-LDPC specifically, unchanged, except for the matrix size expansion. This adaptation can facilitate the reutilization of existing implementations and to empower concurrent encoding and decoding functionalities.

Figure 6:
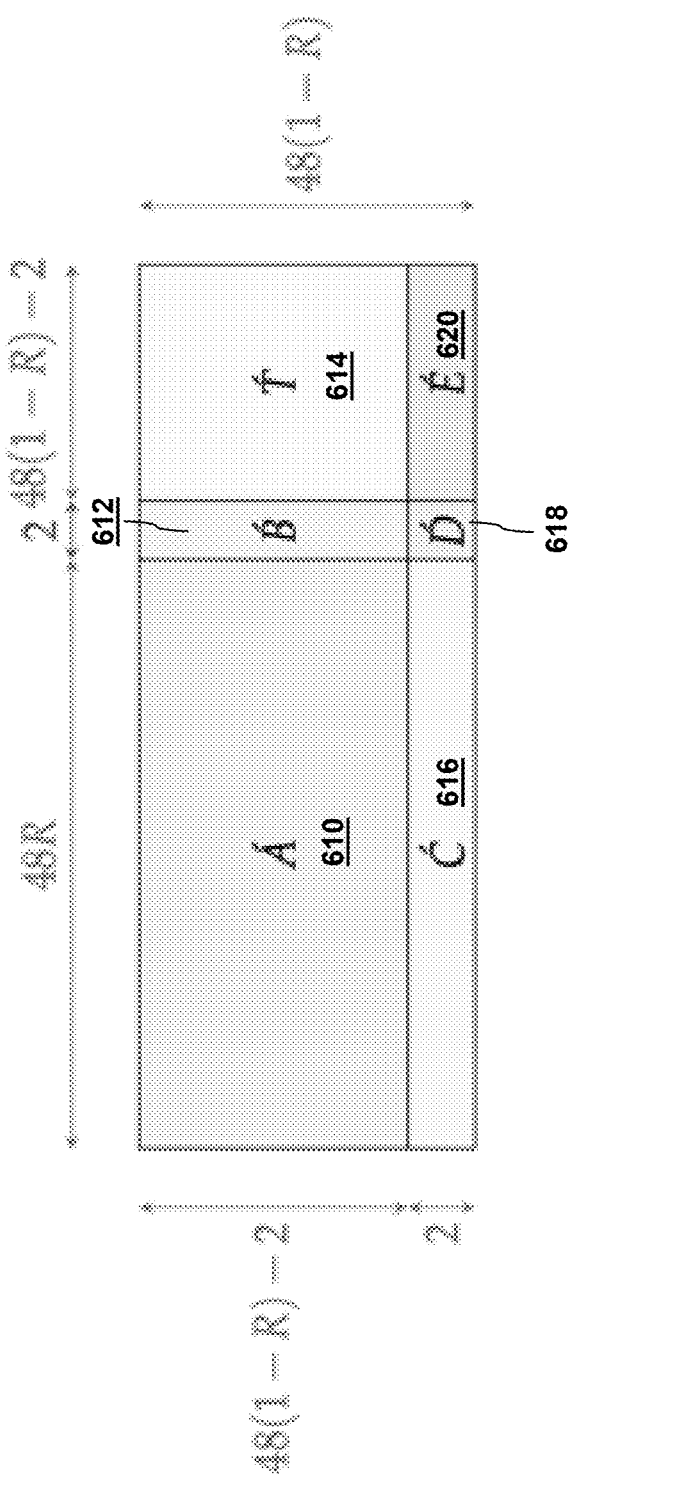
FIG. 6 is a diagram depicting an example exponent matrix, according to one or more embodiments.

FIG. 6 is a diagram depicting an example exponent matrix (QC-LDPC exponent matrix) 600, according to one or more embodiments. Given a lifting size z, the exponent matrix 600 may have a size of m/z×n/z. If n=48z (e.g., n=3888, z=81), then the size of P=E(H) matrix for n=3888 is 48 (1−R)×48 (=n(1−R)/z×n/z). Elements of the exponent matrix may be integer values which correspond to cyclic shift values of identity matrix of size z×z. A parity check matrix H may be a sparse binary matrix that can be derived from an exponent matrix P=E(H). The generator matrix G may have a size n×k in binary form (e.g., elements of the generator matrix G are binary values). Referring to FIG. 6, the exponent matrix P=E(H) may have a structure including a plurality of sub-matrices (e.g., $\acute{A}$ 610, $\grave{B}$ 612, $\acute{C}$ 616, $\grave{D}$ 618, $\acute{E}$ 620, $\acute{T}$ 614).

Figure 7A:
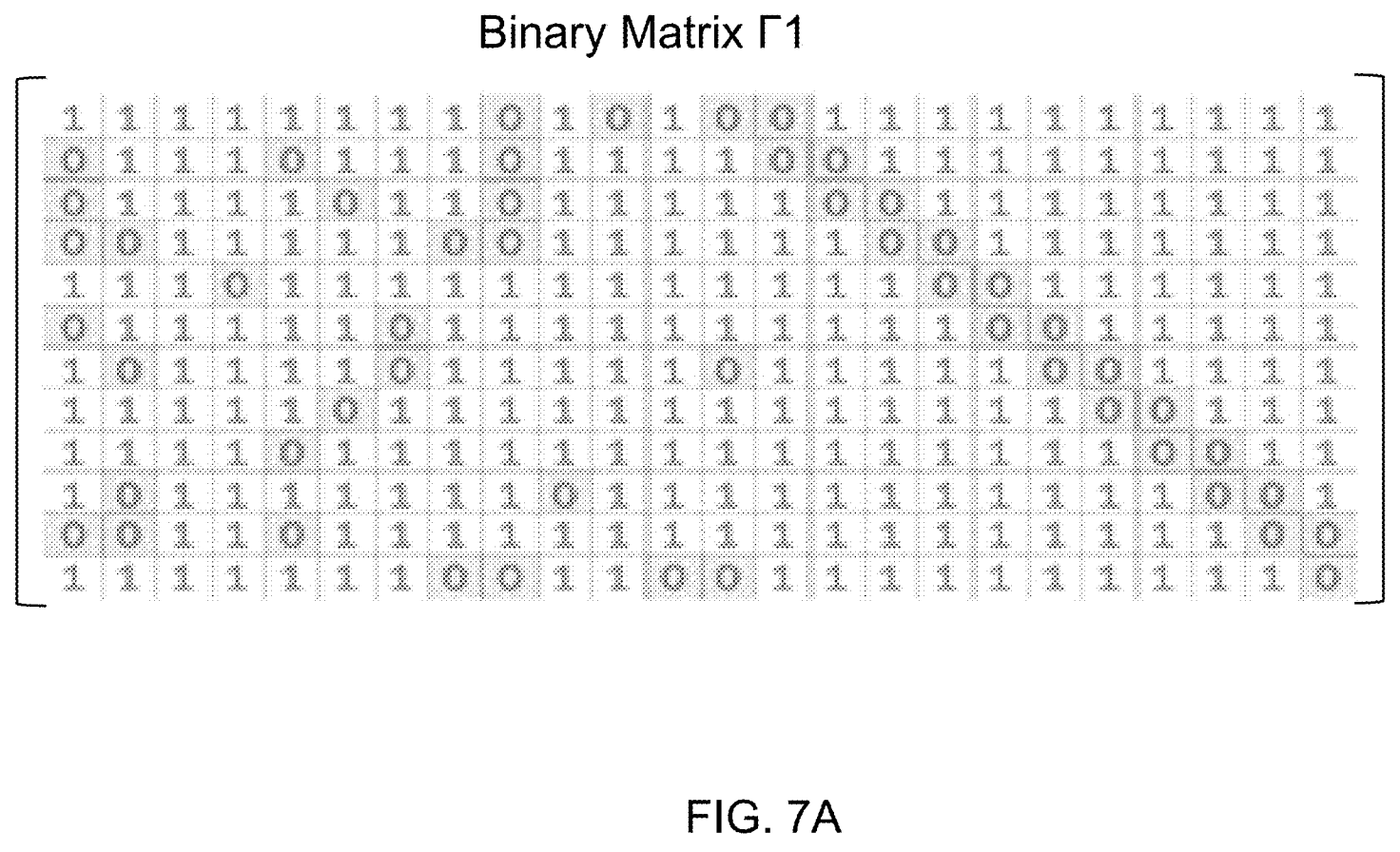
Figure 7B:
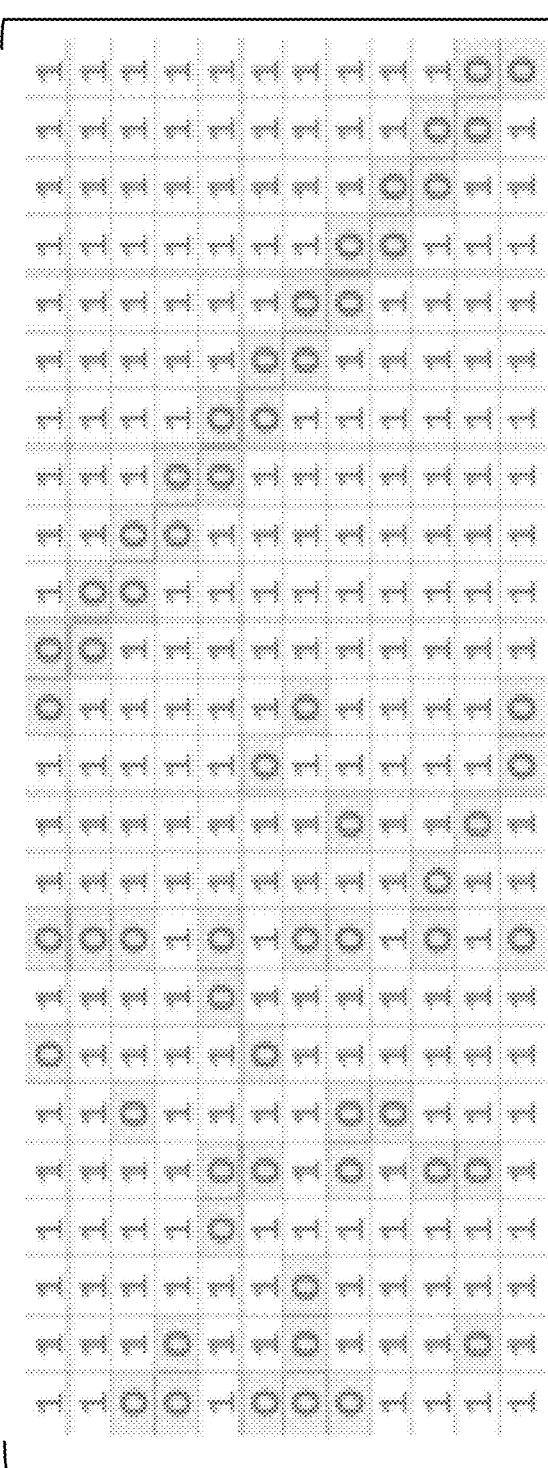
Figure 7D:
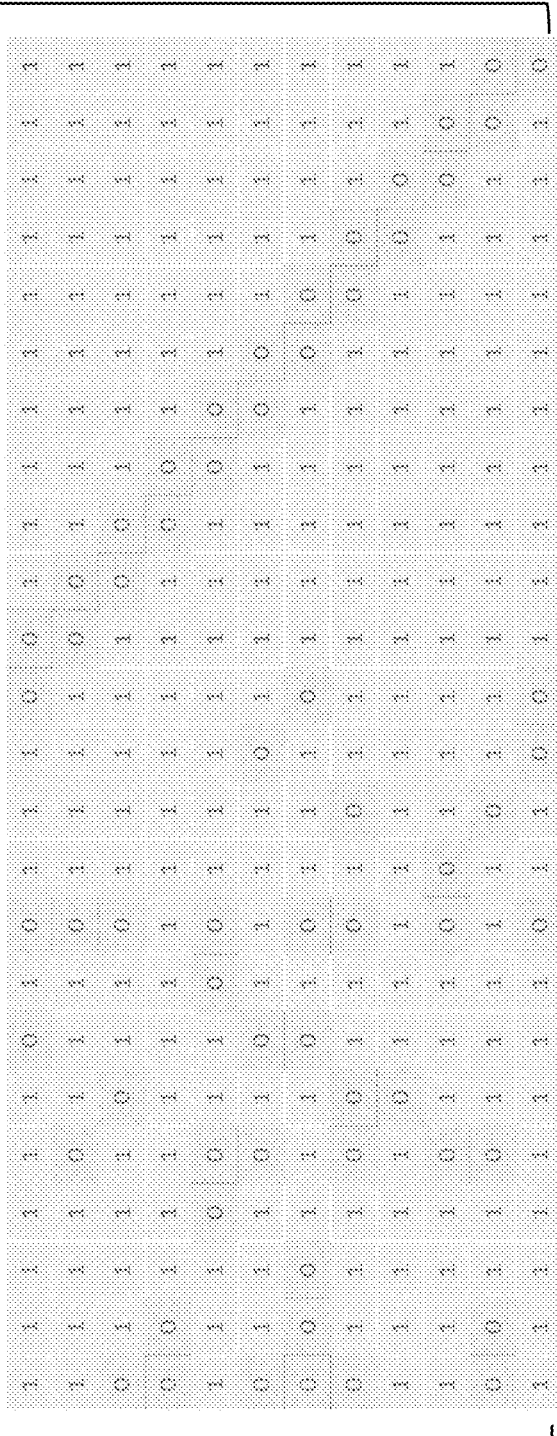
Figure 8A:
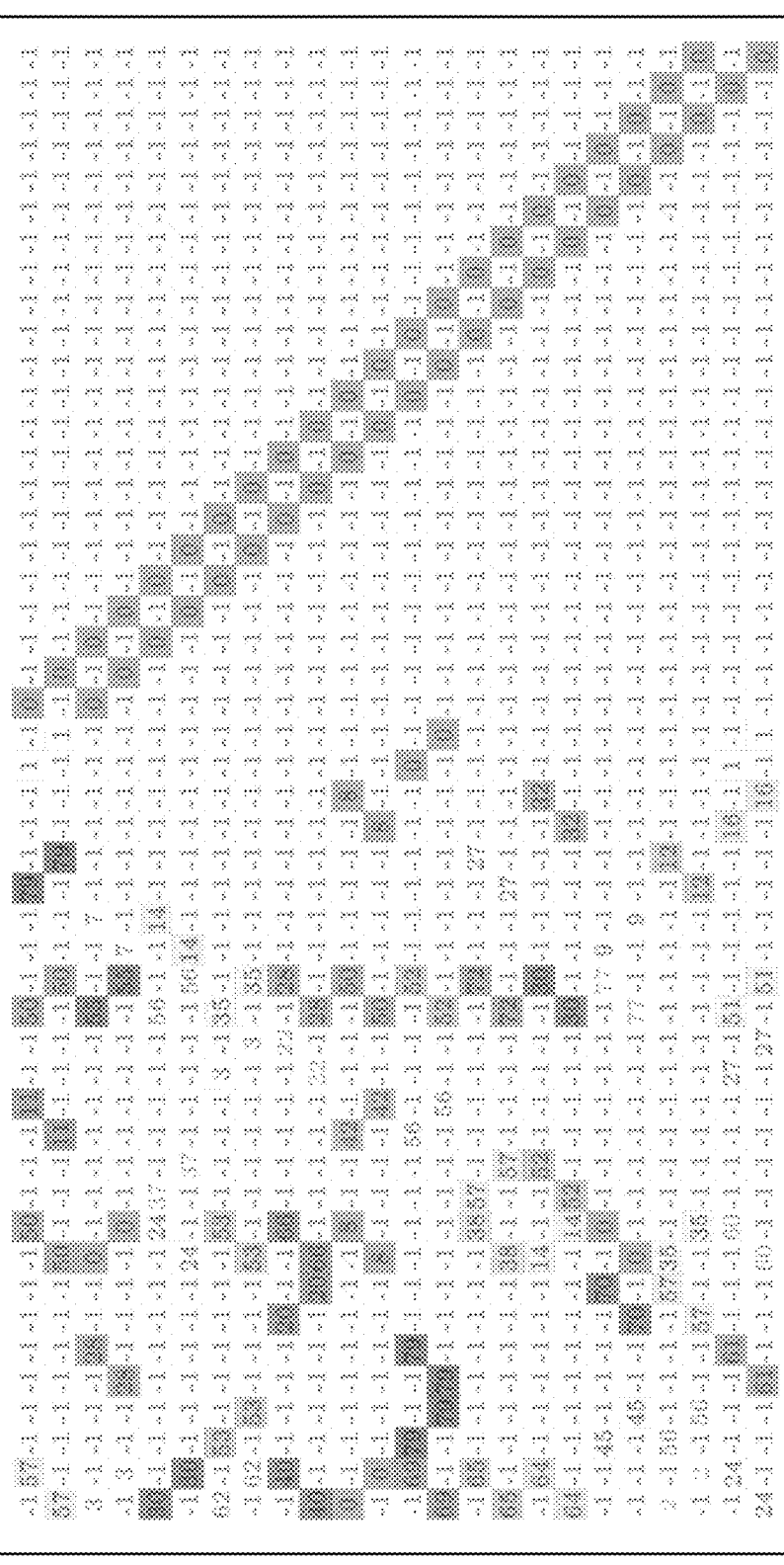
FIG. 8A to FIG. 8E are diagrams depicting example exponent matrices and an example parity check matrix, according to one or more embodiments.
Figure 8B:
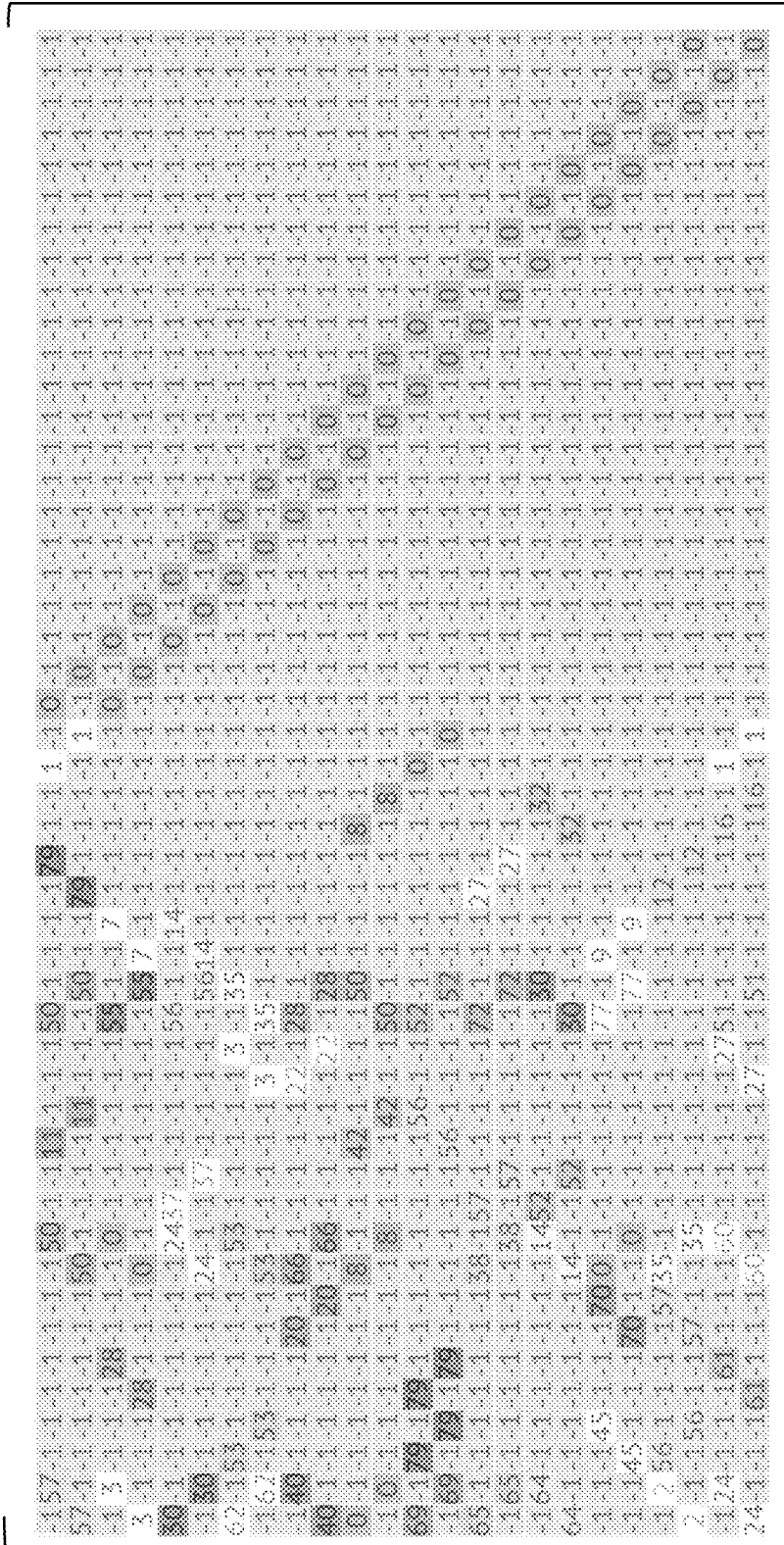

FIG. 7A to FIG. D7 and FIG. 8A to FIG. 8E show a new Wi-Fi LDPC code of block length=3888 constructed using Wi-Fi LDPC codes of block length=1944 as a base matrix (or a base/mother code). FIG. 7A is a diagram 700 depicting an example binary matrix $\Gamma$1 having a size (dimension) of (12×24), according to one or more embodiments. In some implementations, a system or a method can calculate (obtain, compute, generate) a base parity check matrix H using a base exponent (or permutation) matrix P E(H) corresponding to the code block size n=1994 and a code rate R=1/2, using Equation 8. The size (dimension) of the exponent matrix P may be the same as that of example binary matrix $\Gamma$1 (12×24) and the size (dimension) of the base parity check matrix H may be (12*z, 24*z) where z is a lifting size, e.g., z=81. Using the binary matrix $\Gamma$1 shown in FIG. 7A, the system according to some embodiments can determine (e.g., calculate, compute, obtain) a new parity check matrix H by performing Khatri-Rao lifting with the base parity check matrix H and the binary matrix $\Gamma$1 using Equation 15. FIG. 7B, FIG. 7C, FIG. 7D are diagrams 720, 740, 760 depicting example binary matrices $\Gamma$2, $\beta$, $\Gamma$4, respectively, which have the same size (dimension) as the binary matrix $\Gamma$1 but have different entries from the binary matrix $\Gamma$1, according to one or more embodiments.

Figure 8C:
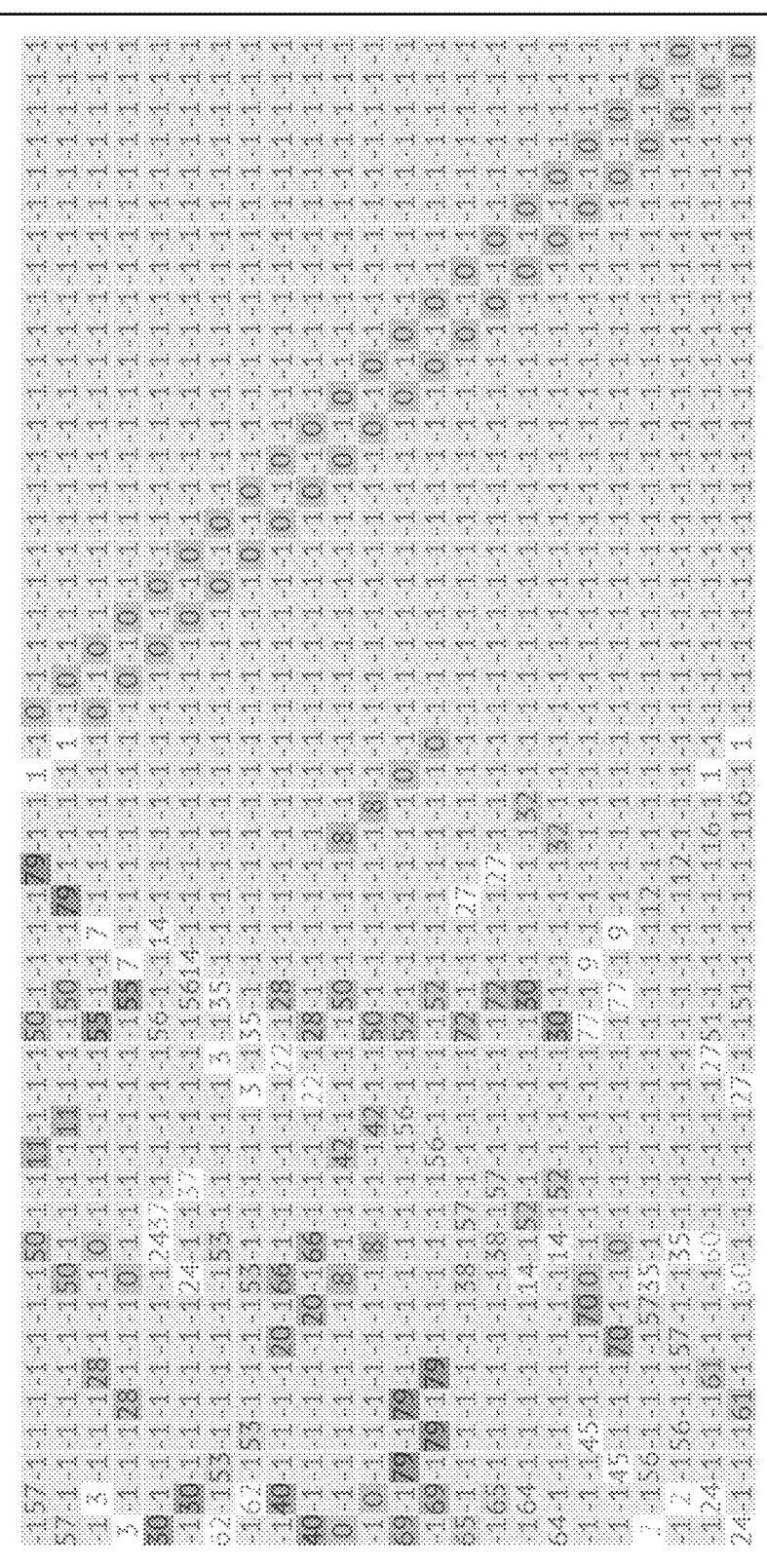
Figure 8D:
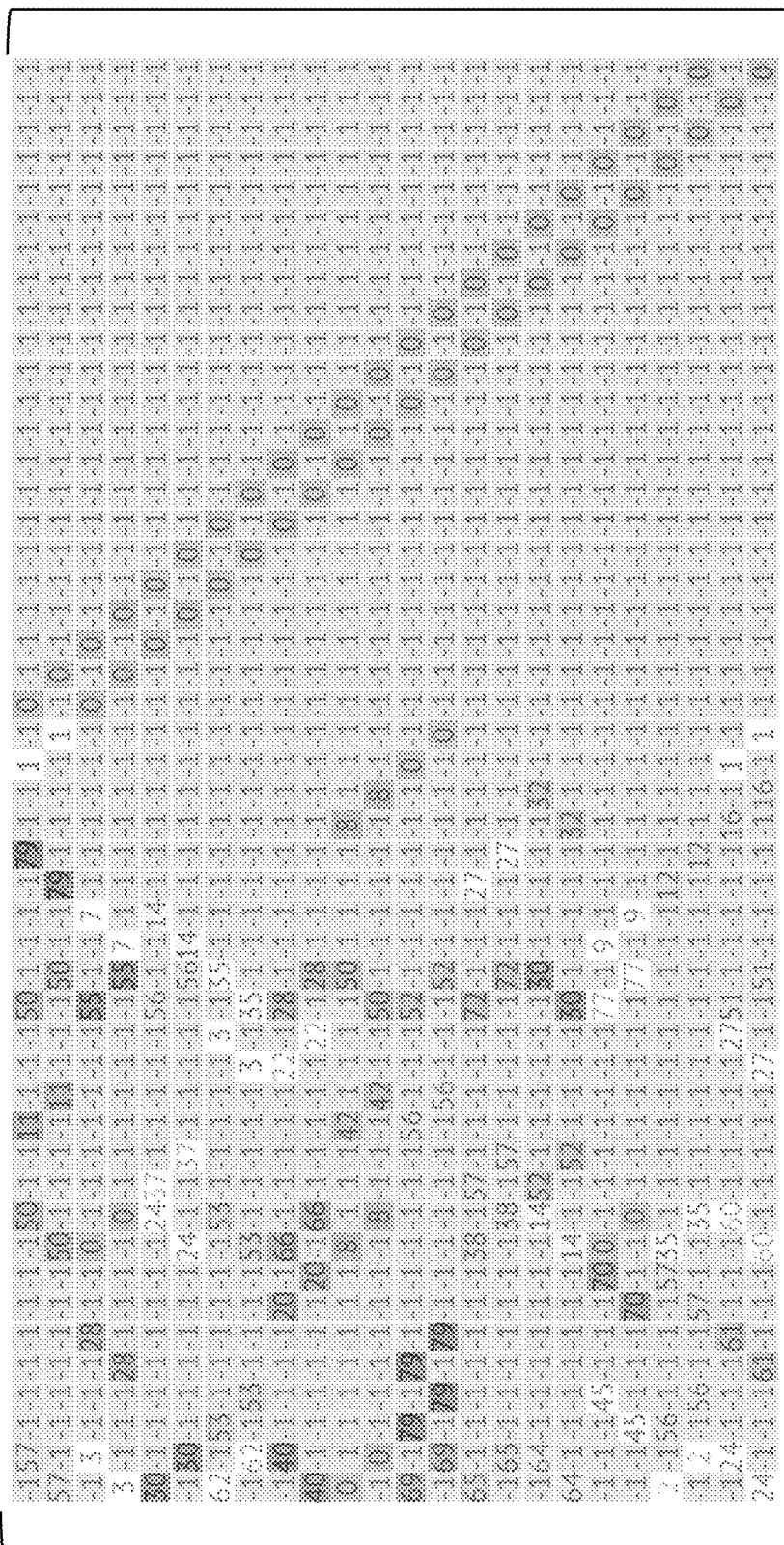

FIG. 8A is a diagram 800 depicting an example new code matrix (e.g., exponent matrix) $\acute{P}$=E(H) constructed as a result of performing Khatri-Rao lifting using the base parity check matrix H and the binary matrix $\Gamma$1 shown in FIG. 7A. The example new exponent matrix $\acute{P}$=E($\acute{H}$) may have a size (dimension) of (24×48) and correspond to the code block size n=3888 (which is twice the code block size of the base matrix P) and a code rate R=1/2 (which is the same as the code rate of the base matrix P). FIG. 8B, FIG. 8C, FIG. 8D are diagrams 820, 840, 860 depicting example exponent matrices constructed as a result of performing Khatri-Rao lifting using the base parity check matrix H and the binary matrices $\Gamma$2, $\beta$3, $\Gamma$4, respectively.

Figure 8E:
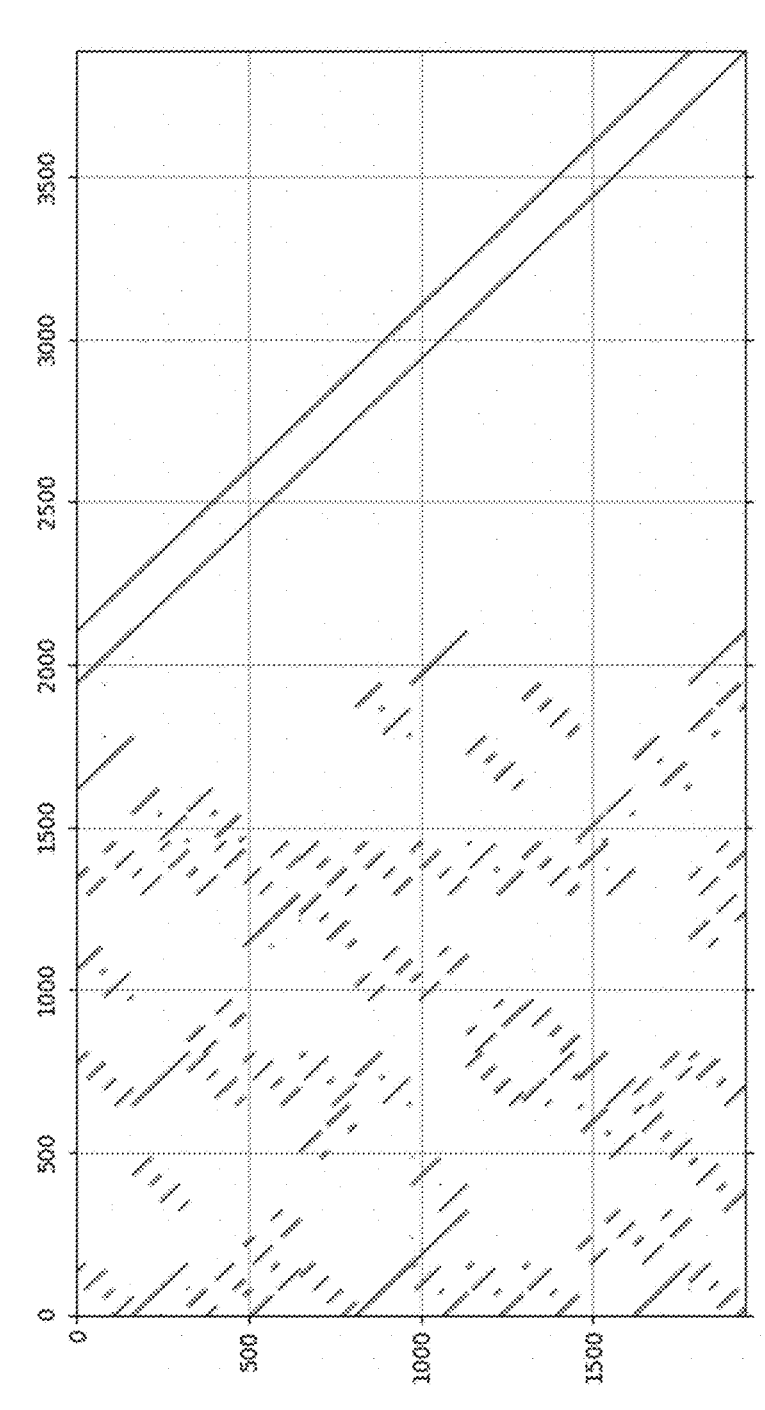

FIG. 8E is a diagram 860 depicting the new parity check matrix $\acute{H}$ corresponding to the exponent matrix $\acute{P}$=E($\acute{H}$) shown in FIG. 8A and the binary matrix $\Gamma$1 shown in FIG. 7A, according to one or more embodiments. The new parity check matrix $\acute{H}$ corresponding to the exponent matrix $\acute{P}$=E($\acute{H}$) shown in FIG. 8A and the binary matrix $\Gamma$1 shown in FIG. 7A may have a size (dimension) of (24*z, 48*z) where z is a lifting size, e.g., z=81, and correspond to the code block size n=3888 (which is twice the code block size of the base parity check matrix H) and a code rate R=1/2 (which is the same as the code rate of the base parity check matrix H). The new parity check matrix $\tilde{H}$ may be a sparse matrix. Referring to FIG. 8E, each black dot/line may represent a value 1 and each empty space may represent a value 0.

FIG. 9 is a diagram 900 depicting an example implementation (a program source code in a programming language) of generating a new parity check matrix using a binary matrix $\Gamma$, according to one or more embodiments. The program source code in FIG. 9 includes line 1 to line 12. For example, the program source code shown in FIG. 9 defines a binary matrix $\Gamma$ (e.g., variable "$\Gamma$12") corresponding to a code rate of 1/2 at line 2; defines an exchange matrix J (2) (e.g., variable "J") at line 3; defines a Khatri-Rao product operation in lines 8-12; and performs Khatri-Rao lifting using a base parity check matrix H (e.g., variable "EH1944") and the binary matrix $\Gamma$ to generate a new parity check matrix H (e.g., variable "EH3888") in lines 4-6. In this manner, a system according to some embodiments can generate a new Wi-Fi LDPC code of block length=3888 (e.g., variable "EH3888") using Wi-Fi LDPC codes of block length=1944 as a base code (e.g., variable "EH1944").

In some implementations, the system can derive one or more matrices $\Gamma$ using multiple levels of optimizations by exploiting a combination of graph theoretic constraints (e.g., the number of shortest loops/cycles in a protograph) and simulations. In some implementations, the system can calculate the number of shortest loop in a protograph corresponding to a new parity check matrix based on a $\Gamma$ matrix and then perform simulations (e.g., packet error rates) on the new parity check matrix, to evaluate the performance/quality of the $\Gamma$ matrix. A "protograph" may refer to a bipartite graph having two disjoint and independent vertex sets (e.g., a set of left vertexes indicated by circles and a set of right vertexes indicated by rectangles in the protograph 1100 shown in FIG. 11A) to represent a matrix (e.g., parity check matrix). For example, the system can apply some graph theoretic constraints to choose/select better $\Gamma$ matrices that can eliminate or reduce short cycles in the protograph, or delete problematic nodes (e.g., trapping sets) which cause the iterative decoding performance to get stuck (jammed, trapped). In some implementations, the cycles in a protograph generated using a $\Gamma$ matrix may be weighted in the descending order of degrees of the cycles to evaluate the matrix T. In some implementations, the system can shortlist a plurality of candidate $\Gamma$ matrices, perform simulations (e.g., PER simulations or codeword simulations) on respective parity check matrices generated using plurality of candidate $\Gamma$ matrices, and select (identify, choose, determine) from the shortlisted (candidate) $\Gamma$ matrices, one or more "optimal" $\Gamma$ matrix (e.g., optimal in terms of satisfying graph theoretic constraints and/or simulation constraints (e.g., above a threshold).

FIG. 10 is a flow diagram showing a process 1000 for determining one or more binary matrices $\Gamma$, according to one or more embodiments. A system can perform the process 1000 to derive (generate, determine, obtain) one or more (optimal) binary matrices $\Gamma$ to use the derived matrices in generating a new parity check matrix $\acute{H}$ (using Khatri-Rao lifting). In some implementations, the process 1000 is performed by one or more processors of an apparatus (e.g., an encoder 130 or a processor 2010 of a communication system 105, or a decoder 160 or a processor 2010 of a communication system 108). In other embodiments, the process 1000 is performed by other entities (e.g., a computing system other than the system 105 or the system 108). In some embodiments, the process 1000 includes more, fewer, or different steps than shown in FIG. 10.

At step 1002, the one or more processors may initialize a $\Gamma$ matrix corresponding to a code rate (e.g., 1/2, 2/3, 3/4, 5/6) with an arbitrary random binary matrix. For example, if z=5, u=3, v=4, a system (e.g., communication system 105 or 108) can initialize a $\Gamma$ matrix with the following matrix (referred to as "$\Gamma1$") with a size (dimension) of (3×4):

$$\Gamma1 = \begin{bmatrix} 1 & 1 & 1 & 0 \\ 1 & 0 & 1 & 1 \\ 0 & 1 & 0 & 0 \end{bmatrix}. \qquad \text{(Equation 17)}$$

The system can identify (receive, obtain, calculate) a base parity check matrix H1 corresponding to an exponent (or permutation) matrix E(H1) as follows:

$$E(H1) = \begin{bmatrix} -1 & 2 & 3 & -1 \\ 0 & 3 & 1 & 1 \\ 2 & 1 & 0 & -1 \end{bmatrix}. \qquad \text{(Equation 18)}$$

Figure 11A:
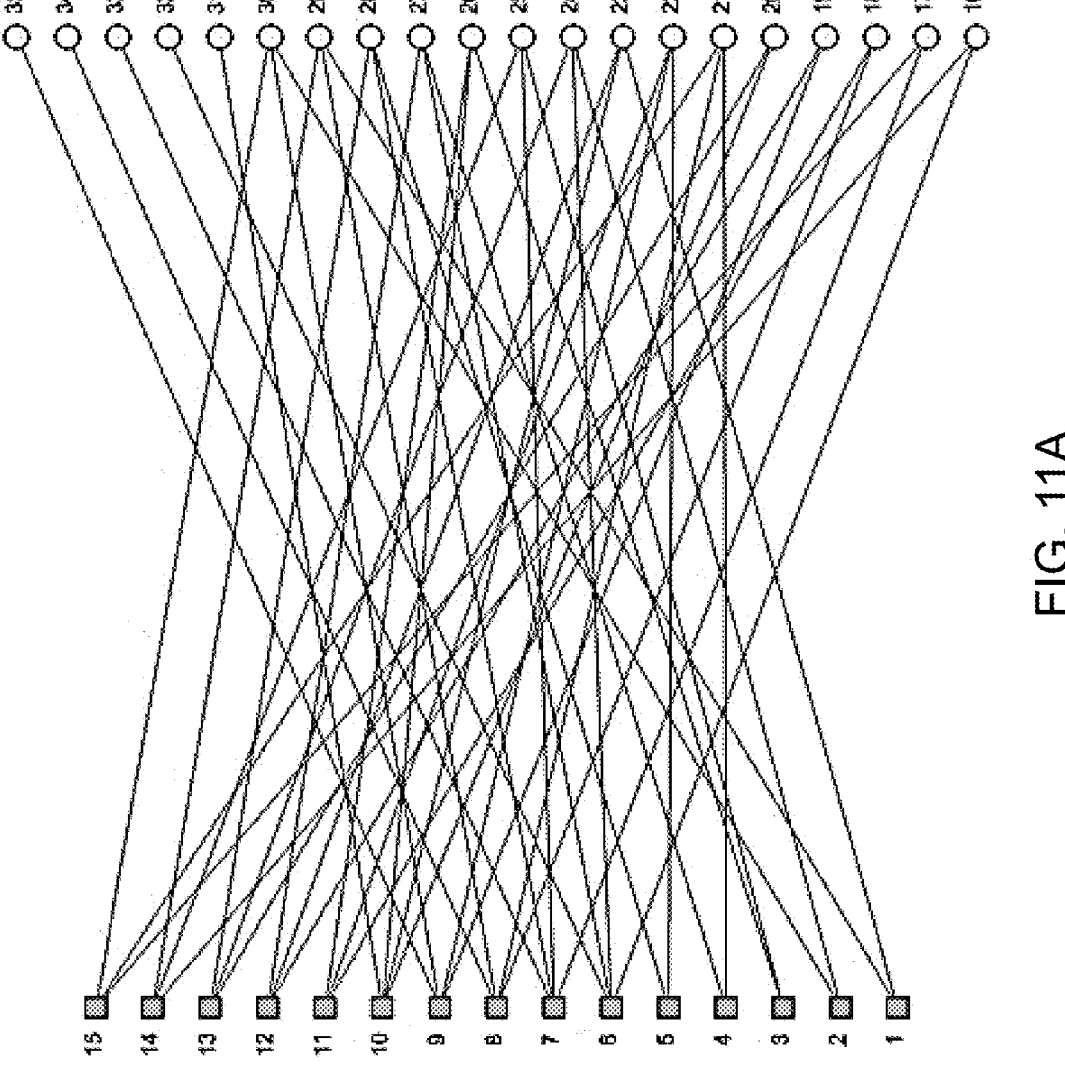
FIG. 11A to FIG. 11F are diagrams depicting graph representations of binary parity check matrices, according to one or more embodiments.
Figure 11B:
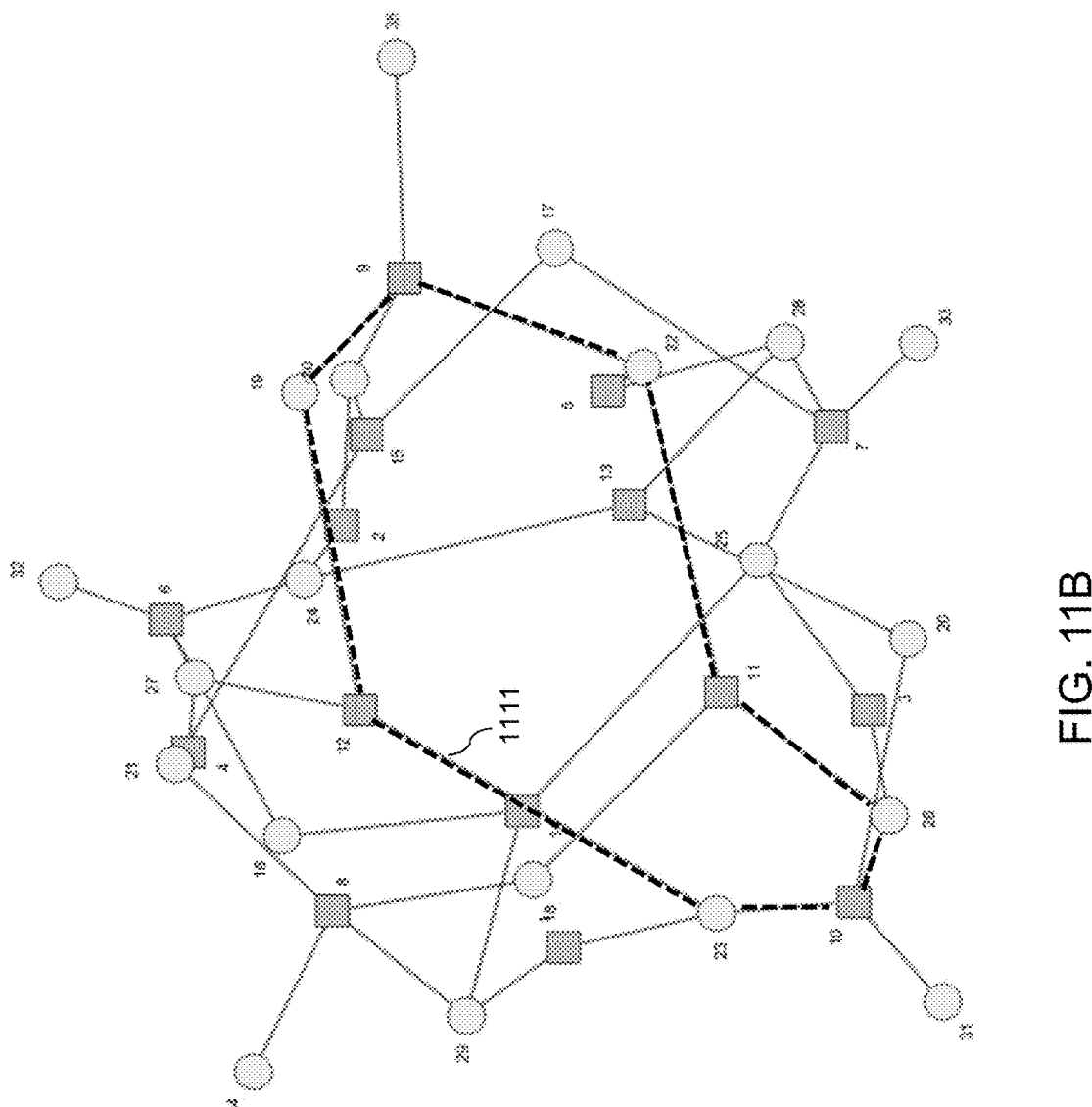

Referring to FIG. 11A and FIG. 11B, the H1 matrix may correspond to a protograph 1100 and a different graph representation 1110 of the protograph 1100. As the H1 matrix can be obtained by cyclic shifting 5×5 identity matrix by the values of E(H1), the protograph 1100 (and the graph 1110) may include 3*5 check nodes 1-15 (indicated by rectangles) and 4*5 variable nodes 16-35 (indicated by circles). As shown in FIG. 11B, the H1 matrix (and the corresponding graph 1110) may contain 20 shortest cycles with length=8 (one of the shortest cycles is indicated by the reference number 1111).

At step 1004, the system may perform (apply, compute, calculate) Khatri-Rao lifting to the base parity check matrix H1 using the $\Gamma1$ matrix initialized at step 1002, to generate (obtain, calculate, compute) a new parity check matrix H2 as a new QC-LDPC code. An exponent (or permutation matrix E(H2) can be generated as follows:

$$E(H2) = \begin{bmatrix} -1 & -1 & -1 & 2 & -1 & 3 & -1 & -1 \\ -1 & -1 & 2 & -1 & 3 & -1 & -1 & -1 \\ -1 & 0 & 3 & -1 & -1 & 1 & -1 & 1 \\ 0 & -1 & -1 & 3 & 1 & -1 & 1 & -1 \\ 2 & -1 & -1 & 1 & 0 & -1 & -1 & -1 \\ -1 & 2 & 1 & -1 & -1 & 0 & -1 & -1 \end{bmatrix}. \qquad \text{(Equation 19)}$$

Figure 11C:
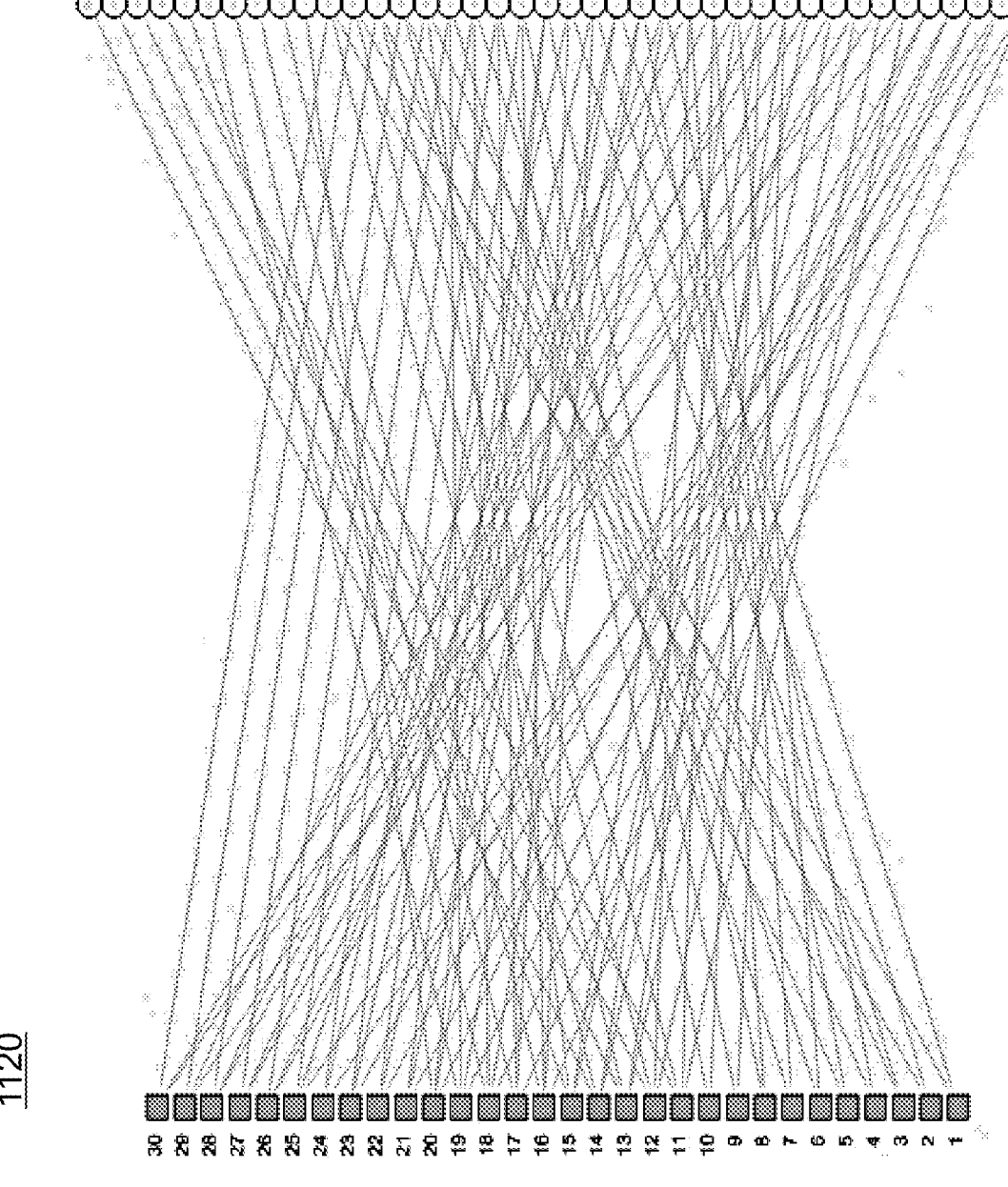
Figure 11D:
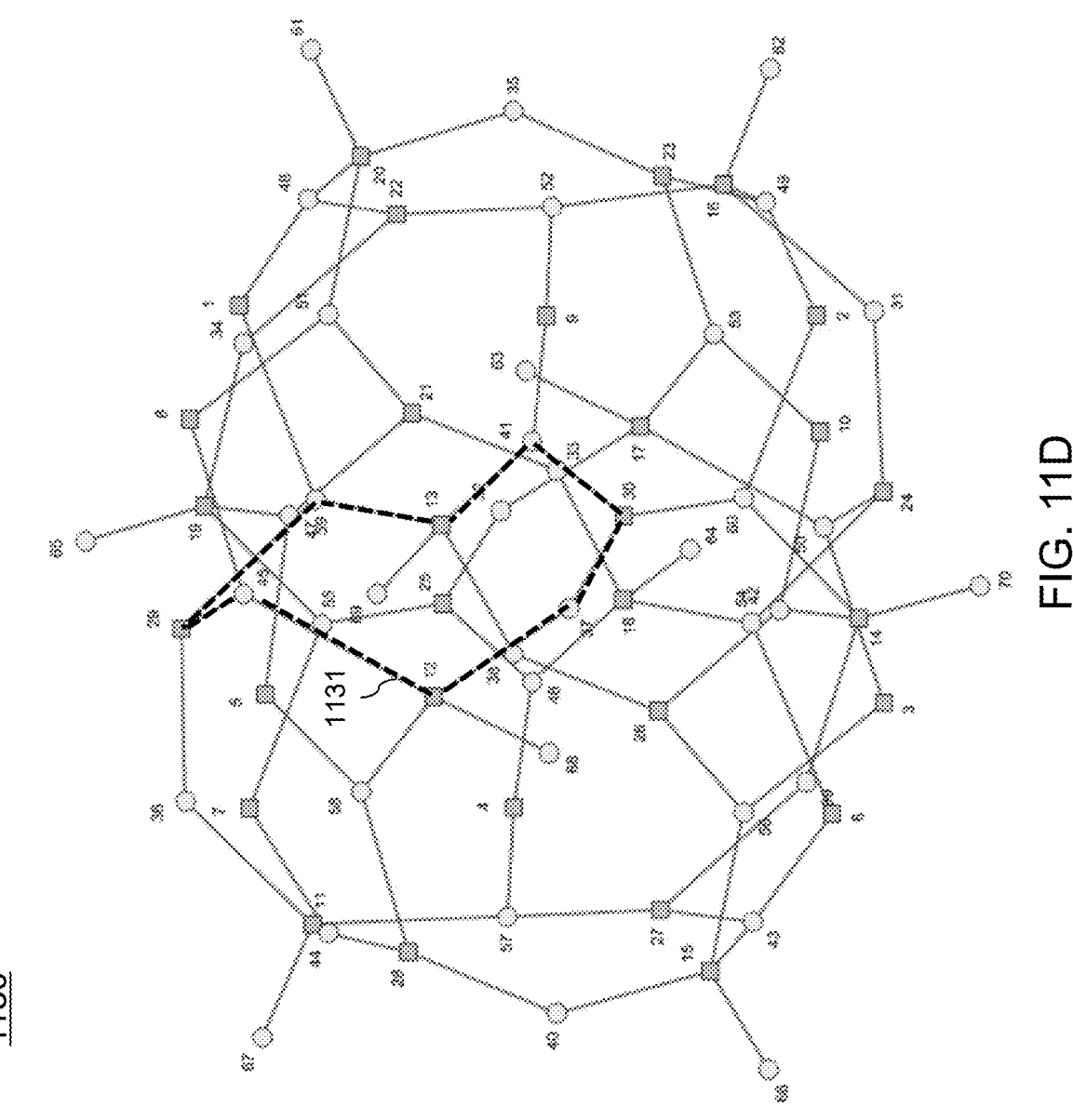

Referring to FIG. 11C and FIG. 11D, the H2 matrix may correspond to a protograph 1120 and a different graph representation 1130 of the protograph 1100. As the H2 matrix can be obtained by cyclic shifting 5×5 identity matrix by the values of E(H2), the protograph 1120 (and the graph 1130) may include 6*5 check nodes 1-30 (indicated by rectangles) and 8*5 variable nodes 31-70 (indicated by circles). As shown in FIG. 11D, the H2 matrix (and the corresponding graph 1130) may contain 20 shortest cycles with length=8 (one of the shortest cycles is indicated by the reference number 1131). That is, when using the $\Gamma1$ matrix (see Equation 17), the H2 matrix may contain the same number (20) of short cycles with the same length (8) as the H1 matrix.

At step 1006, the system may identify and enumerate all the shortest loops of the new graph corresponding to the H2 matrix (e.g., graph 1130 in FIG. 11D). For example, the system may identify, from the graph 1130, 20 shortest cycles with length=8, and enumerate each cycle (e.g., the cycle 1131 may be enumerated as "13↔41, 41↔30, 30↔37, 37↔12, 12↔45, 45↔29, 29↔59, 59↔13").

At step 1008, the system may determine (check) whether the size (length) of shortest cycle (loop) in the graph corresponding to the H2 matrix <6. At step 1010, in response to determining that the size (length) of shortest cycle (loop) <a threshold (e.g., 6), the system may discard the $\Gamma$ matrix. At step 1014, in response to determining that the size (length) of shortest cycle (loop)≥the threshold (e.g., 6), the system may add the current $\Gamma$ matrix (e.g., $\Gamma1$) to a shortlist of candidate gamma matrices.

At step 1014, the system may change one entry in the current $\Gamma$ matrix (e.g., $\Gamma1$). For example, in response to determining that the length of shortest cycle (8) ≥6, the system may change one entry in the $\Gamma1$ matrix to obtain a new $\Gamma$ matrix (referred to as "$\Gamma2$") as follows.

$$\Gamma2 = \begin{bmatrix} 1 & 1 & 1 & 0 \\ 1 & 0 & 1 & 1 \\ 0 & 1 & 1 & 0 \end{bmatrix}. \qquad \text{(Equation 20)}$$

Next, the system may proceed to step 1004 and perform (apply, compute, calculate) Khatri-Rao lifting to the base parity check matrix H1 using the $\Gamma2$ matrix updated/changed at step 1014, to generate (obtain, calculate, compute) a new parity check matrix H2' as a new QC-LDPC code. An exponent (or permutation matrix E(H2') can be generated as follows:

$$E(H2') = \begin{bmatrix} -1 & -1 & -1 & 2 & -1 & 3 & -1 & -1 \\ -1 & -1 & 2 & -1 & 3 & -1 & -1 & -1 \\ -1 & 0 & 3 & -1 & -1 & 1 & -1 & 1 \\ 0 & -1 & -1 & 3 & 1 & -1 & 1 & -1 \\ 2 & -1 & -1 & 1 & -1 & 0 & -1 & -1 \\ -1 & 2 & 1 & -1 & 0 & -1 & -1 & -1 \end{bmatrix}. \qquad \text{(Equation 21)}$$

Figure 11E:
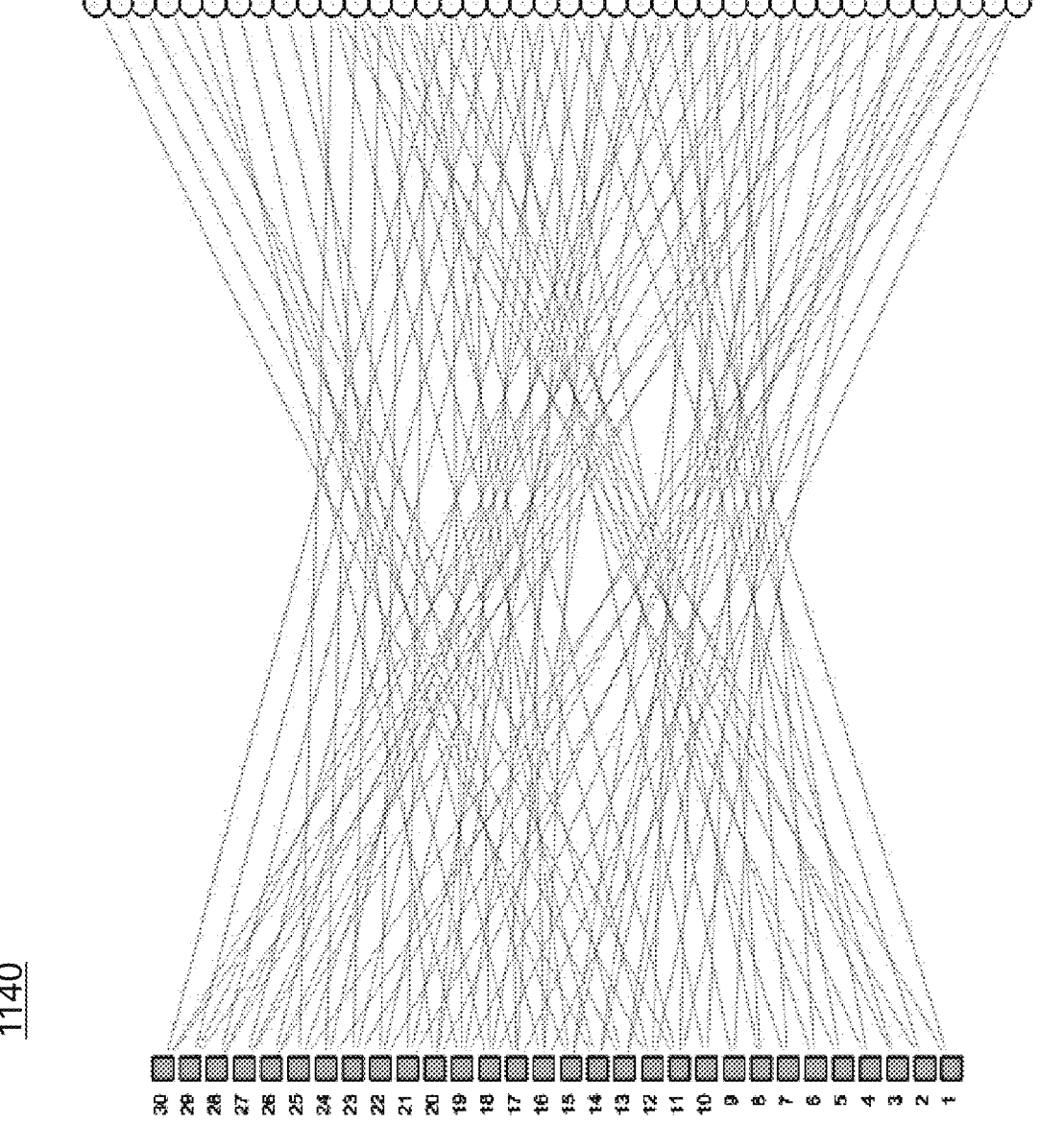
Figure 11F:
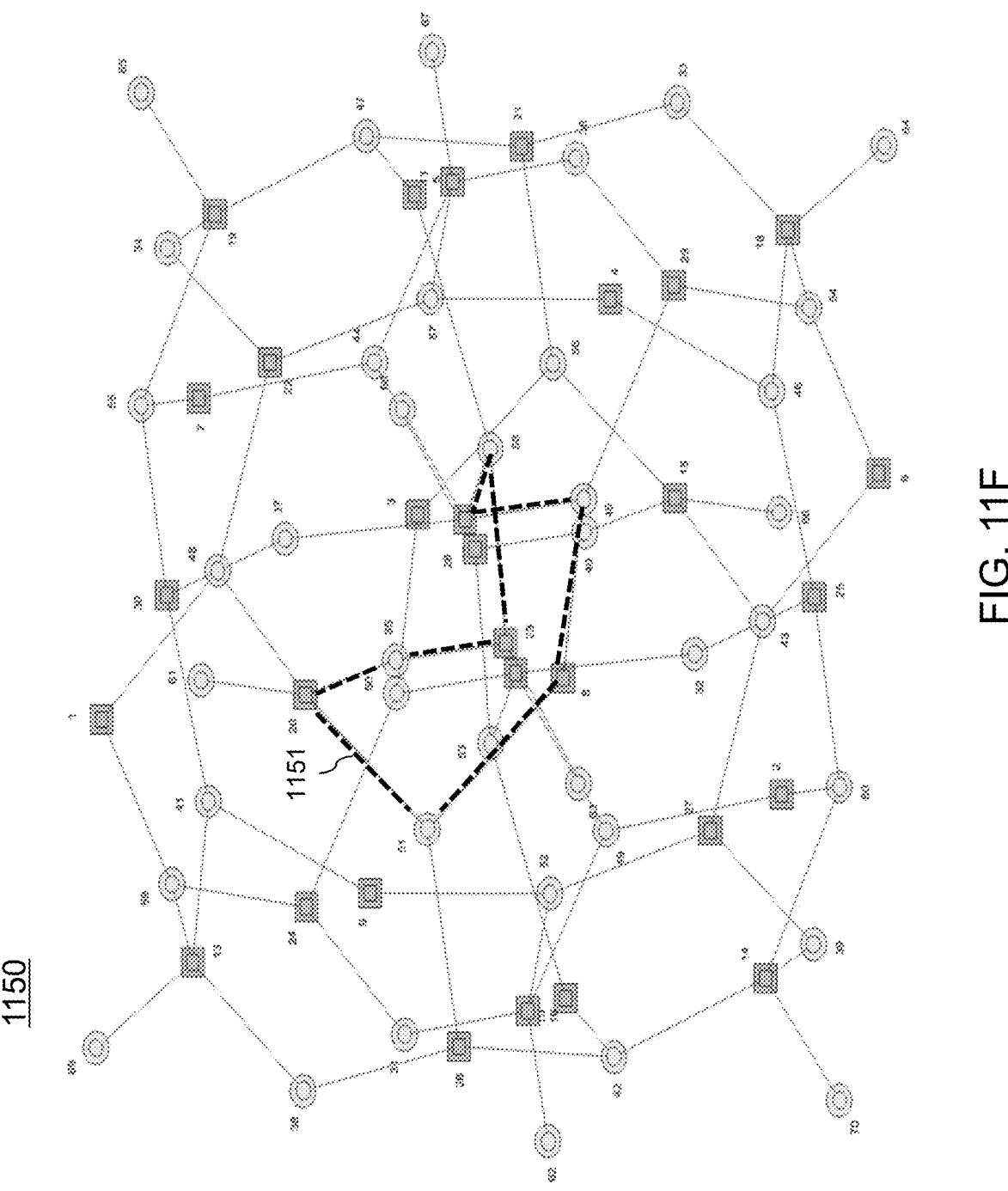

Referring to FIG. 11E and FIG. 11F, the H2' matrix may correspond to a protograph 1140 and a different graph representation 1150 of the protograph 1140. As the H2' matrix can be obtained by cyclic shifting 5×5 identity matrix by the values of E(H2'), the protograph 1140 (and the graph 1150) may include 6*5 check nodes 1-30 (indicated by rectangles) and 8*5 variable nodes 31-70 (indicated by circles). As shown in FIG. 11F, the H2' matrix (and the corresponding graph 1130) may contain 10 shortest cycles with length=8 (one of the shortest cycles is indicated by the reference number 1151). That is, when using the Γ2 matrix (see Equation 20), the H2' matrix may contain less number (10) of short cycles than the number (20) of short cycles of the H2 matrix which was generated using the Γ1 matrix (see Equation 17).

At step 1006, the system may identify and enumerate all the shortest loops of the new graph corresponding to the H2' matrix (e.g., graph 1150 in FIG. 11F). For example, the system may identify, from the graph 1150, 10 shortest cycles with length=8, and enumerate each cycle (e.g., the cycle 1151 may be enumerated as "8↔51, 51↔20, 20↔35, 35↔23, 23↔58, 58↔12, 12↔45, 45↔8"). At step 1014, in response to determining that the size (length) of shortest cycle (loop)≥the threshold (e.g., 6), the system may add the current Γ matrix (e.g., Γ2) to the shortlist of candidate gamma matrices.

At step 1016, the system may perform one or more simulations (e.g., PER simulation or codeword simulation) on candidate Γ matrices in the shortlist. In some implementations, the system may determine that the number of candidate Γ matrices in the shortlist reaches a threshold (e.g., 10), and perform the simulations. In some implementations, the system may determine that the number of iterations (e.g., iterations over steps 1004 to 1012) reaches a threshold (e.g., 100), and perform the simulations.

At step 1018, the system may select (determine, choose) one or more Γ matrices as "optimal" Γ matrices from the shortlist based on results of the simulations. In some implementations, the system may select one or more Γ matrices that satisfy a simulation constraint (e.g., average PER is less than a threshold).

FIG. 12 is a flow diagram showing a process 1200 for encoding data using an LDPC code, in accordance with an embodiment. In some embodiments, the process 1200 is performed by one or more processors of an apparatus (e.g. communication system 105, encoder 130, or processor 2010). In other embodiments, the process 1200 is performed by other entities. In some embodiments, the process 1200 includes more, fewer, or different steps than shown in FIG. 12.

At step 1202, the one or more processors may determine a first parity check matrix (e.g., base parity check matrix H) of a first quasi-cyclic-low-density parity-check (QC-LDPC) code having a first code block size (e.g., n=1944) and a code rate of 1/2.

At step 1204, the one or more processors may determine a binary matrix (e.g., binary matrix Γ or Γ matrix) having the same size as a size of an exponent matrix E(H) of the first parity check matrix. In some embodiments, in determining the binary matrix, the one or more processors may be configured to determine a plurality of sub-matrices of the binary matrix (e.g., using Equation 16), each sub-matrix being a power of an exchange matrix of order 2 (e.g., matrix J (2)). The one or more processors may be configured to randomize non-zero values of the binary matrix such that the binary matrix maintains to have full rank. For example, the matrix Γ having a size (dimension) of (u×v) can maintain to have full rank, which equals min (u, v)=24/(1−R), for a Wi-Fi code with code rate R.

At step 1206, the one or more processors may generate, based on the first parity check matrix and the binary matrix, a second parity check matrix (e.g., a new parity check matrix H) of a second QC-LDPC code having a second code block size (e.g., n=3888) and the code rate of 1/2. In some embodiments, the first code block size may be 1944 bits, and the second code block size may be 3888 bits.

In some embodiments, each of the first parity check matrix and the second parity check matrix may have an exponent matrix including a plurality of integers (e.g., P1,1, P1,2, P1,3, . . . , P1,ń; P2,1, P2,2, P2,3, . . . . P2,ń; . . . , P1, 1, P1,2, P1,3, . . . , Pṁ,ń as shown in Equation 7), the number of the plurality of integers being equal to the number of elements of the parity check matrix divided by z, where z is an integer representing a lifting size of the QC-LDPC code (e.g., z=81). See Equation 5 and Equation 6. Each element of the exponent matrix may correspond to a cyclic shift value of an identity matrix. A size of the identity matrix is z×z, and the cyclic shift value d is an integer such that −1≤d<z, where z is an integer representing a lifting size of the QC-LDPC code. The cyclic shift value d may represent a shifted identity matrix that is obtained by right-shifting the identity matrix by d (see FIG. 4 when z=7). The cyclic shift value −1 may represent a null matrix of the identity matrix (see matrix 412 in FIG. 4).

In some embodiments, in generating, based on the first parity check matrix and the binary matrix, the second parity check matrix, the one or more processors may be configured to determine a first exponent matrix of the first parity check matrix, determine a Khatri-Rao product of the first exponent matrix and the binary matrix (e.g., using Equation 16), and determine, based on a result of the Khatri-Rao product, a second exponent matrix of the second parity check matrix (e.g., using Equation 14).

In some embodiments, in generating, based on the first parity check matrix and the binary matrix, the second parity check matrix, the one or more processors may be configured to generate, for each element of the second exponent matrix, a shifted identity matrix of an identity matrix (e.g., matrices 410, 411, 412, 413, 414, 415, 416) based on a value of each element of the second exponent matrix (e.g., d=0, 1, 2, 3, 4, 5, 6). The one or more processors may be configured to generate the second parity check matrix such that the second parity check matrix includes, as an element corresponding to each element of the second exponent matrix, the generated shifted identity matrix (see Equation 8).

At step 1208, the one or more processors may encode data using the generated second parity check matrix (e.g., using Equation 10, Equation 11, Equation 12 and Equation 13). At step 1210, the one or more processors may transmit, via a transmitter of the apparatus (e.g., transmitter circuitry 120 of the communication system 105), the encoded data to another apparatus (e.g., communication system 108).

In one approach, an apparatus (e.g., encoder 130 or processor 2010 of communication system 105) may include a transmitter (e.g., transmitter circuitry 120) and one or more processors (e.g., processor 2010 or baseband circuitry 110). The one or more processors may be configured to identify, based on a first parity check matrix (e.g., base parity check matrix H) of a first quasi-cyclic-low-density parity-check (QC-LDPC) code according to a code rate of 1/2, a second parity check matrix (e.g., new parity check matrix H) corresponding to a first exponent matrix (e.g., E(H)) including 1152 values for a second QC-LDPC code. The second QC-LDPC code may have a code block size (e.g., n=3888) that is twice a code block size of the first QC-LDPC code (e.g., n=1944). The one or more processors may be configured to encode data using the second parity check matrix. The transmitter may be configured to transmit the encoded data to another apparatus (e.g., decoder 160 or processor 2010 of communication system 108).

In some implementations, the one or more processors may be configured to identify (e.g., from a codebook) the first parity check matrix of the first QC-LDPC code having the code rate of 1/2. The one or more processors may be configured to determine a first binary matrix (e.g., Γ1 matrix) having the same dimensions (e.g., m/Z×n/Z if the first parity check matrix has a dimension of (m×n)) as dimensions of an exponent matrix (e.g., E(H)) of the first parity check matrix. The one or more processors may be configured to determine a Khatri-Rao product of the first parity check matrix and the first binary matrix (e.g., using Equation 15). The one or more processors may be configured to determine, based on a result of the Khatri-Rao product, the second parity check matrix (e.g., new parity check matrix H).

In some implementations, in determining the first binary matrix, the one or more processors may be configured to determine a second binary matrix having the same dimensions as dimensions of the first binary matrix. The one or more processors may be configured to determine the first binary matrix including at least (1) one or more rows of a second binary matrix or (2) one or more columns of the second binary matrix.

In some implementations, in determining the second parity check matrix, the one or more processors may be configured to determine, based on the result of the Khatri-Rao product, a second exponent matrix having the same dimensions as dimensions of the first exponent matrix. The one or more processors may be configured to determine, based on the second exponent matrix, the first exponent matrix. For example, the first exponent matrix may have the same entries as the second exponent matrix except one or two entries. The one or more processors may be configured to determine, based on the first exponent matrix, the second parity check matrix (e.g., using Equation 8).

In some implementations, the second binary matrix may include the following set of values: [1 1 1 1 1 1 1 0 1 0 1 0 0 1 1 1 1 1 1 1 1 0 1 1 0 1 1 0 1 1 1 0 0 1 1 1 1 1 1 1 1 0 1 1 1 0 1 1 0 1 1 1 1 0 0 1 1 1 1 1 1 1 1 0 0 1 1 1 1 1 1 0 0 1 1 1 1 1 1 1 1 1 1 0 1 1 1 1 1 1 1 1 1 1 1 0 0 1 1 1 1 1 1 1 1 0 0 1 1 1 1 1 0 1 1 1 1 0 1 1 1 1 1 1 1 1 0 0 1 1 1 1 1 1 1 1 1 0 1 1 1 1 1 1 1 1 1 1 1 1 0 0 1 1 1 1 1 1 0 1 1 1 1 1 1 1 1 1 1 1 1 1 1 1 0 0 1 1 1 0 1 1 1 1 1 1 1 1 1 1 1 1 1 1 0 0 1 1 1 0 1 1 1 1 1 1 1 1 1 1 1 0 0 1 0 0 1 1 0 1 1 1 1 1 1 1 1 1 1 1 1 0 0 1 1 1 1 1 1 1 1 1 1 1 0]. The second exponent matrix May include the following set of values: [−1 57 −1 −1 −1 −1 −1 −1 −1 50 −1 −1 −1 1 1 −1 −1 50 −1 −1 −1 79 −1 −1 −1 1 −1 0 −1 −1 −1 −1 −1 −1 −1 −1 −1 −1 −1 −1 −1 −1 −1 −1 −1 57 −1 −1 −1 −1 −1 −1 −1 50 −1 −1 −1 1 1 −1 −1 −1 −1 50 −1 −1 −1 79 −1 −1 −1 1 1 −1 0 −1 −1 −1 −1 −1 −1 −1 −1 −1 −1 −1 −1 −1 −1 −1 −1 −1 −1 −1 −3 −1 −1 −1 −1 28 −1 −1 0 −1 −1 −1 −1 −1 −1 −1 55 −1 −1 7 −1 −1 −1 −1 −1 0 −1 0 −1 −1 −1 −1 −1 −1 −1 −1 −1 −1 −1 −1 −1 −1 −1 −1 −1 −1 −1 −1 −1 3 −1 −1 28 −1 −1 −1 −1 0 −1 −1 −1 −1 −1 −1 −1 55 7 −1 −1 −1 −1 −1 −1 −1 −1 0 −1 0 −1 −1 −1 −1 −1 −1 −1 −1 −1 −1 −1 −1 −1 −1 −1 −1 −1 30 −1 −1 −1 −1 −1 −1 −1 −1 24 37 −1 −1 −1 −1 −1 56 −1 −1 14 −1 −1 −1 −1 −1 −1 −1 −1 0 −1 0 −1 −1 −1 −1 −1 −1 −1 −1 −1 −1 −1 −1 −1 −1 −1 −1 −1 30 −1 −1 −1 −1 −1 24 −1 −1 37 −1 −1 −1 −1 −1 56 14 −1 −1 −1 −1 −1 −1 −1 −1 −1 −1 −1 −1 0 −1 0 −1 −1 −1 −1 −1 −1 −1 −1 −1 −1 −1 −1 −1 −1 −1 62 −1 53 −1 −1 −1 −1 −1 −1 53 −1 −1 −1 −1 3 −1 35 −1 −1 −1 −1 −1 −1 −1 −1 −1 −1 −1 −1 −1 0 −1 0 −1 −1 −1 −1 −1 −1 −1 −1 −1 −1 −1 −1 −1 −1 −1 62 −1 53 −1 −1 −1 −1 53 −1 −1 −1 −1 −1 −1 −1 −1 3 −1 35 −1 −1 −1 −1 −1 −1 −1 −1 −1 −1 −1 −1 −1 0 −1 0 −1 −1 −1 −1 −1 −1 −1 −1 −1 −1 −1 −1 −1 40 −1 −1 −1 −1 20 −1 −1 66 −1 −1 −1 −1 −1 22 −1 28 −1 −1 −1 −1 −1 −1 −1 −1 −1 −1 −1 −1 −1 −1 −1 0 −1 0 −1 −1 −1 −1

−1 −1 −1 −1 −1 −1 −1 −1 −1 −1 40 −1 −1 −1 −1 −1 −1 20 66 −1 −1 −1 −1 −1 22 −1 28 −1 −1 −1 −1 −1 −1 −1 −1 −1 −1 −1 −1 −1 −1 −1 −1 −1 0 −1 0 −1 −1 −1 −1 −1 −1 −1 −1 −1 −1 −1 −1 −1 0 −1 −1 −1 −1 −1 −1 −1 −18 −1 −1 42 −1 −1 −1 −1 50 −1 −1 −1 −1 −1 8 −1 −1 −1 −1 −1 −1 −1 −1 −1 0 −1 0 −1 −1 −1 −1 −1 −1 −1 −1 −1 −1 −1 0 −1 −1 −1 −1 −1 18 −1 −1 −1 −1 42 −1 −1 50 −1 −1 −1 −1 −18 −1 −1 −1 −1 −1 −1 −1 −1 −1 0 −1 0 −1 −1 −1 −1 −1 −1 −1 −1 −1 1 69 79 −1 −1 79 −1 −1 −1 −1 −1 −1 56 −1 −1 −1 −1 52 −1 −1 −1 −1 −1 −1 0 −1 −1 −1 −1 −1 −1 −1 −1 −1 0 −1 0 −1 −1 −1 −1 −1 −1 −1 −1 −1 −1 −1 69 −1 −1 79 79 −1 −1 −1 −1 −1 −1 −1 −1 56 −1 −1 52 −1 −1 −1 −1 −1 −1 −1 0 −1 −1 −1 −1 −1 −1 −1 −1 −1 0 −1 0 −1 −1 −1 −1 −1 −1 −1 −1 −1 −1 −1 −1 65 −1 −1 −1 −1 −1 −1 38 57 −1 −1 −1 −1 −1 −1 72 −1 −1 −1 27 −1 −1 −1 −1 −1 −1 −1 −1 −1 −1 −1 −1 −1 −1 −1 0 −1 0 −1 −1 −1 −1 −1 −1 65 −1 −1 −1 −1 −1 −1 38 −1 −1 57 −1 −1 −1 −1 72 −1 −1 −1 27 −1 −1 −1 −1 −1 −1 −1 −1 −1 −1 −1 −1 −1 −1 −1 −1 −1 −1 0 −1 0 −1 −1 −1 −1 −1 −1 −1 64 −1 −1 −1 −1 −1 14 −1 −1 52 −1 −1 −1 −1 −1 30 −1 −1 −1 −1 −1 32 −1 −1 −1 −1 −1 −1 −1 −1 −1 −1 −1 −1 −1 0 −1 0 −1 −1 −1 −1 −1 64 −1 −1 −1 −1 −1 −1 −1 14 52 −1 −1 −1 −1 −1 30 −1 −1 −1 −1 −1 32 −1 −1 −1 −1 −1 −1 −1 −1 −1 −1 −1 −1 −1 0 −1 0 −1 −1 −1 −1 −1 −1 45 −1 −1 −1 70 −1 0 −1 −1 −1 −1 −1 −1 77 9 −1 −1 −1 −1 −1 −1 −1 −1 −1 −1 −1 −1 −1 −1 −1 −1 −1 −1 −1 0 −1 0 −1 −1 −1 −1 −1 −1 −1 45 −1 −1 70 −1 0 −1 −1 −1 −1 −1 −1 −1 77 −1 −1 9 −1 −1 −1 −1 −1 −1 −1 −1 −1 −1 −1 −1 −1 −1 −1 −1 −1 0 −1 0 −1 −1 2 −1 56 −1 −1 −1 −1 57 35 −1 −1 −1 −1 −1 −1 −1 −1 −1 −1 −1 12 −1 −1 −1 −1 −1 −1 −1 −1 −1 −1 −1 −1 −1 −1 −1 −1 −1 −1 −1 0 −1 0 −1 −1 2 −1 56 −1 −1 57 −1 −1 35 −1 −1 −1 −1 −1 −1 −1 −1 −1 12 −1 −1 −1 −1 −1 −1 −1 −1 −1 −1 −1 −1 −1 −1 0 −1 0 −1 24 −1 −1 −1 61 −1 −1 −1 60 −1 −1 −1 −1 27 −1 51 −1 −1 −1 −1 −1 16 −1 1 −1 −1 −1 −1 −1 1 −1 −1 −1 −1 −1 −1 −1 −1 −1 −1 −1 0 −1 24 −1 −1 −1 61 −1 −1 −1 60 −1 −1 −1 27 −1 51 −1 −1 −1 −1 16 −1 1 −1 −1 −1 −1 −1 1 −1 −1 −1 −1 −1 −1 −1 −1 −1 −1 −1 0].

In some implementations, in determining the first exponent matrix, the one or more processors may be configured to select, from values of the second exponent matrix, at least 1150 values as values of the first exponent matrix. The one or more processors may be configured to shift one or two values of the first exponent matrix from one or more corresponding positive values of the second exponent matrix by −1 or +1. The one or more corresponding positive values of the second exponent matrix may not be selected as the at least 1150 values. The first exponent matrix (e.g., permutation matrix P̂) may be generated by perturbating one or two values from the second exponent matrix. For example, based on the second exponent matrix, the first matrix may be generated as [−1 56 −1 −1 −1 −1 −1 −1 −1 49 −1 −1 −1 1 1 −1 −1 50 −1 −1 −1 79 −1 −1 −1 1 1 −1 0 −1 −1 −1 −1 −1 −1 −1 −1 −1 −1 −1 −1 −1 −1 −1 −1 57 −1 −1 −1 −1 −1 −1 −1 50 −1 −1 −1 1 1 1 −1 −1 −1 50 −1 −1 −1 79 −1 −1 −1 1 1 −1 0 −1 −1 −1 −1 −1 −1 −1 −1 −1 −1 −1 −1 −1 −1 −1 3 −1 −1 −1 −1 28 −1 −1 0 −1 −1 −1 −1 −1 −1 55 −1 −1 7 −1 −1 −1 −1 −1 0 −1 0 −1 −1 −1 −1 −1 −1 −1 −1 −1 −1 −1 −1 −1 −1 −1 −1 −1 −1 −1 3 −1 −1 28 −1 −1 −1 0 −1 −1 −1 −1 −1 −1 55 7 −1 −1 −1 −1 −1 −1 −1 0 −1 0 −1 −1 −1 −1 −1 −1 −1 −1 −1 −1 −1 −1 30 −1 −1 −1 −1 −1 −1 24 37 −1 −1 −1 −1 −1 56 −1 −1 14 −1 −1 −1 −1 −1 −1 −1 −1 0 −1 0 −1 −1 −1 −1 −1 −1 −1 −1 −1 −1 −1 30 −1 −1 −1 −1 −1 24 −1 −1 37 −1 −1 −1 −1 −1 56 14 −1 −1 −1 −1 −1 −1 −1 −1 −1 0 −1 0 −1].

–1 –1 –1 –1 –1 –1 –1 –1 –1 –1 –1 –1 –1 –1 –1 62 –1 53
–1 –1 –1 –1 –1 –1 53 –1 –1 –1 –1 –1 3 –1 35 –1 –1 –1 –1 –1
–1 –1 –1 –1 0 –1 0 –1 –1 –1 –1 –1 –1 –1 1 1 –1 –1 –1 –1
–1 –1 62 –1 53 –1 –1 –1 –1 53 –1 –1 –1 –1 –1 –1 1 3 –1 35
–1 –1 –1 –1 –1 –1 –1 –1 –1 –1 –1 –1 –1 –1 0 –1 0 –1 –1 –1
–1 –1 –1 –1 –1 –1 –1 –1 –1 –1 –1 –140 –1 –1 –1 –1 20
–1 –1 66 –1 –1 –1 –1 –1 22 –1 28 –1 –1 –1 –1 –1 –1 –1
–1 –1 –1 –1 –1 –1 –1 0 –1 0 –1 –1 –1 –1 –1 –1 –1 –1
–1 –1 –1 –1 40 –1 –1 –1 –1 –1 20 66 –1 –1 –1 –1 –1
22 –1 28 –1 –1 –1 –1 –1 –1 –1 –1 –1 –1 –1 –1 0 –1 0 –1
–1 –1 –1 –1 –1 –1 –1 –1 –1 –1 –1 0 –1 –1 –1 –1 –1 –1
–18 –1 –1 42 –1 –1 –1 –1 50 –1 –1 –1 –1 –1 8 –1 –1 –1
–1 –1 –1 –1 –1 –1 0 –1 0 –1 –1 –1 –1 –1 –1 –1 –1 –1
–1 –1 –1 0 –1 –1 –1 –1 –1 –18 –1 –1 –1 –1 42 –1 –1 50
–1 –1 –1 –1 –1 8 –1 –1 –1 –1 –1 –1 –1 –1 –1 –1 –1 –1 0
–1 0 –1 –1 –1 –1 –1 –1 –1 –1 –1 –1 –1 69 79 –1 –1 79 –1
–1 –1 –1 –1 –1 56 –1 –1 –1 –1 52 –1 –1 –1 –1 –1 –1 0 –1
–1 –1 –1 –1 –1 –1 –1 –1 –1 –1 0 –1 0 –1 –1 –1 –1 –1 –1
–1 –1 –1 69 –1 –1 79 79 –1 –1 –1 –1 –1 –1 –1 –1 56 –1
–1 52 –1 –1 –1 –1 –1 –1 –1 –10 –1 –1 –1 –1 –1 –1 –1 –1
–1 –1 –1 0 –1 0 –1 –1 –1 –1 –1 –1 –1 –1 65 –1 –1 –1 –1
–1 –1 –1 –1 38 57 –1 –1 –1 –1 –1 –1 72 –1 –1 –1 27 –1
–1 –1 –1 –1 –1 –1 –1 –1 –1 –1 1 1 –1 –1 –1 –1 0 –1 0 –1
–1 –1 –1 –1 –1 65 –1 –1 –1 –1 –1 –1 38 –1 –1 57 –1
–1 –1 –1 72 –1 –1 –1 27 –1 –1 –1 –1 –1 –1 –1 –1 –1 –1 –1
–1 –1 –1 –1 –1 –1 0 –1 0 –1 –1 –1 –1 –1 –1 –1 64 –1 –1
–1 –1 –1 –1 14 –1 –1 52 –1 –1 –1 –1 –1 30 –1 –1 –1 –1 –1
–1 32 –1 –1 –1 –1 –1 –1 –1 –1 –1 –1 –1 –1 –1 –1 –1 –1
0 –1 0 –1 –1 –1 –1 –1 64 –1 –1 –1 –1 –1 –1 –1 –1 14 52
–1 –1 –1 –1 –1 30 –1 –1 –1 –1 –1 32 –1 –1 –1 –1 –1 –1
–1 –1 –1 –1 –1 –1 –1 –1 –1 –1 –1 –1 0 –1 0 –1 –1 –1 –1 –1
–1 –1 45 –1 –1 –1 –1 70 –1 0 –1 –1 –1 –1 –1 –1 –1 77 9
–1 –1 –1 –1 –1 –1 –1 –1 –1 –1 –1 –1 –1 –1 –1 –1 –1 –1 –1
–1 –1 –1 –1 –1 0 –1 0 –1 –1 –1 –1 –1 –1 45 –1 –1 70 –1
0 –1 –1 –1 –1 –1 –1 –1 77 –1 –19 –1 –1 –1 –1 –1 –1 –1
–1 –1 –1 –1 –1 –1 –1 –1 –1 –1 –1 –1 –1 –1 –1 –1 0 –1 0
–1 –1 2 –1 56 –1 –1 –1 –1 57 35 –1 –1 –1 –1 –1 –1 –1 –1
–1 –1 –1 –1 12 –1 –1 –1 –1 –1 –1 –1 –1 –1 –1 –1 –1 –1 –1
–1 –1 –1 –1 –1 –1 –1 –1 –1 0 –1 0 –1 –1 2 –1 56 –1 –1
57 –1 –1 35 –1 –1 –1 –1 –1 –1 –1 –1 –1 –1 –1 12 –1 –1 –1 –1
–1 –1 –1 –1 –1 –1 –1 –1 –1 –1 –1 –1 –1 –1 –1 –1 –1 –1 –1
–1 –1 –1 0 –1 0 –1 24 –1 –1 –1 61 –1 –1 –1 60 –1 –1 –1 –1
–1 27 –1 51 –1 –1 –1 –1 –1 16 –1 1 1 –1 –1 –1 –1 –1 –1 –1 –1
–1 –1 –1 –1 –1 –1 –1 –1 –1 –1 –1 –1 –1 –1 0 –1 24 –1 –1
–1 61 –1 –1 –1 60 –1 –1 –1 –1 –1 27 –1 51 –1 –1 –1 –1
–1 –1 16 –1 1 1 –1 –1 –1 –1 –1 –1 –1 –1 –1 –1 –1 –1 –1 –1
–1 –1 –1 –1 –1 –1 –1 0] in which the second value 56 and
the tenth value 49 are shifted from 57 and 50, respectively.
The one or more processors may be configured to determine
a resulting matrix of the shifting as the first exponent matrix.

In some implementations, the second binary matrix may
include the following set of values: [1 1 1 1 1 1 0 1 0 1 1 1
0 0 1 1 1 1 1 1 1 1 1 1 1 1 1 1 1 1 1 0 1 1 1 1 0 0 1 1 1
1 1 1 1 1 1 0 1 1 1 1 0 1 1 0 1 1 1 1 1 0 0 1 1 1 1 1 1 1 1
0 0 1 1 1 1 1 1 1 1 1 1 1 1 0 0 1 1 1 1 1 1 1 1 1 1 0 0 1
1 0 0 1 1 1 1 1 1 1 0 0 1 1 1 1 1 0 1 1 1 0 1 0 1 1 1 1 0
1 1 1 1 1 0 0 1 1 1 1 0 0 0 1 1 1 1 0 1 1 1 0 1 1 1 1 1
0 0 1 1 1 1 0 1 1 0 0 1 1 0 1 0 1 1 1 1 1 1 1 1 0 0 1 1 1
1 1 1 1 0 1 1 1 1 1 1 1 1 1 1 1 1 1 0 0 1 1 1 1 1 1 0 1
1 0 0 1 1 1 1 1 1 1 1 1 1 0 0 1 1 0 1 1 0 1 1 1 1 1 0 1
1 1 1 1 1 1 1 1 1 0 0 1 1 1 1 1 1 1 1 0 1 1 0 0 1 1 1 1 1
1 1 1 1 1 0]. The second exponent matrix may include the
following set of values: [–1 57 –1 –1 –1 –1 –1 –1 –1 50 –1
–1 1 1 –1 –1 –1 50 –1 –1 –1 –1 79 –1 –1 1 1 –1 0 –1 –1 –1
–1 –1 –1 –1 –1 –1 –1 –1 –1 –1 –1 –1 –1 –1 –1 –1 –1 57
–1 –1 –1 –1 –1 –1 –1 50 –1 –1 –1 –1 1 1 –1 –1 –1 50 –1
–1 79 –1 –1 –1 –1 1 –1 0 –1 –1 –1 –1 –1 –1 –1 –1 –1 –1

–1 –1 –1 –1 –1 –1 –1 –1 –1 –1 –1 3 –1 –1 –1 28 –1 –1 –1
0 –1 –1 –1 –1 –1 –1 55 –1 –1 7 –1 –1 –1 –1 –1 –1 0 –1
0 –1 –1 –1 –1 –1 –1 –1 –1 –1 –1 –1 –1 –1 –1 –1 –1 –1 –1
–1 3 –1 –1 –1 28 –1 –1 –1 0 –1 –1 –1 –1 –1 –1 –1 –1 55
7 –1 –1 –1 –1 –1 –1 –1 –1 0 –1 0 –1 –1 –1 –1 –1 –1 –1 –1
–1 –1 –1 –1 –1 –1 –1 –1 –1 –1 –1 30 –1 –1 –1 –1 –1 –1
–1 –1 24 37 –1 –1 –1 –1 –1 56 –1 –1 14 –1 –1 –1 –1 –1
–1 –1 –1 0 –1 0 –1 –1 –1 –1 –1 –1 –1 –1 –1 –1 –1 –1 –1
–1 –1 –1 –1 –1 30 –1 –1 –1 –1 –1 –1 24 –1 –1 37 –1 –1
–1 –1 –1 56 14 –1 –1 –1 –1 –1 –1 –1 –1 –1 –1 –1 0 –1 0 –1
–1 –1 –1 –1 –1 –1 –1 –1 –1 –1 –1 –1 –1 –1 –1 –1 62 –1 53
–1 –1 –1 –1 –1 –1 53 –1 –1 –1 –1 –1 3 –1 35 –1 –1 –1 –1
–1 –1 –1 –1 –1 –1 –1 –1 0 –1 0 –1 –1 –1 –1 –1 –1 –1 –1
–1 –1 –1 –1 62 –1 53 –1 –1 –1 –1 53 –1 –1 –1 –1 –1 3 –1
35 –1 –1 –1 –1 –1 –1 –1 –1 –1 –1 –1 –1 –1 –1 –1 0 –1 0 –1
–1 –1 –1 –1 –1 –1 –1 –1 –1 –1 –1 –1 –1 –1 40 –1 –1 –1
–1 20 –1 66 –1 –1 –1 –1 –1 22 –1 28 –1 –1 –1 –1 –1 –1
–1 –1 –1 –1 –1 –1 –1 –1 –1 0 –1 0 –1 –1 –1 –1 –1 –1 –1
–1 –1 –1 –1 –1 –1 40 –1 –1 –1 –1 –1 20 –1 66 –1 –1 –1
–1 –1 –1 22 –1 28 –1 –1 –1 –1 –1 –1 –1 –1 –1 –1 –1 –1
–1 –1 –1 0 –1 0 –1 –1 –1 –1 –1 –1 –1 –1 –1 –1 –1 –1 –1 0
–1 –1 –1 –1 –1 –1 –18 –1 –1 –1 42 –1 –1 –1 –1 50 –1 –1
–1 –1 8 –1 –1 –1 –1 –1 –1 –1 –1 –1 –1 –1 –1 –1 0 –1 0 –1 –1
–1 –1 –1 –1 –1 –1 –1 –1 –1 –1 0 –1 –1 –1 –1 –1 –1 –1 –18
–1 –1 –1 42 –1 –1 50 –1 –1 –1 –1 –1 –18 –1 –1 –1 –1 –1
–1 –1 –1 –1 –1 –1 0 –1 0 –1 –1 –1 –1 –1 –1 –1 –1 –1 –1
69 –1 79 –1 79 –1 –1 –1 –1 –1 –1 –1 –1 56 –1 –1 52 –1
–1 –1 –1 –1 –1 –1 0 –1 –1 –1 –1 –1 –1 –1 –1 –1 –1 –1 0
–1 0 –1 –1 –1 –1 –1 –1 –1 –1 –1 69 –1 79 –1 79 –1 –1
–1 –1 –1 –1 56 –1 –1 –1 –1 52 –1 –1 –1 –1 –1 –1 –1 0 –1
–1 –1 –1 –1 –1 –1 –1 –1 –1 0 –1 0 –1 –1 –1 –1 –1 –1 –1
–1 –1 65 –1 –1 –1 –1 –1 –1 38 –1 57 –1 –1 –1 –1 –1
72 –1 –1 –1 27 –1 –1 –1 –1 –1 –1 –1 –1 –1 –1 –1 –1 –1
–1 –1 –1 –1 0 –1 0 –1 –1 –1 –1 –1 –1 –1 –1 –1 65 –1 –1 –1
–1 –1 –1 –1 38 –1 57 –1 –1 –1 –1 –1 72 –1 –1 –1 27 –1
–1 –1 –1 –1 –1 –1 –1 –1 –1 –1 –1 –1 –1 –1 –1 –1 0 –1 0
–1 –1 –1 –1 –1 –1 –1 64 –1 –1 –1 –1 –1 –1 –1 14 52 –1
–1 –1 –1 –1 30 –1 –1 –1 –1 –1 32 –1 –1 –1 –1 –1 –1 –1
–1 –1 –1 –1 –1 –1 –1 –1 –1 0 –1 0 –1 –1 –1 –1 –1 64 –1
–1 –1 –1 –1 –1 14 –1 –1 52 –1 –1 –1 –1 30 –1 –1 –1 –1
–1 –1 32 –1 –1 –1 –1 –1 –1 –1 –1 –1 –1 –1 –1 –1 –1 –1
–1 –1 –1 0 –1 0 –1 –1 –1 –1 –1 –1 –1 45 –1 –1 –1 70 0
–1 –1 –1 –1 –1 –1 –1 77 –19 –1 –1 –1 –1 –1 –1 –1 –1 –1
–1 –1 –1 –1 –1 –1 –1 –1 –1 –1 –1 0 –1 0 –1 –1 –1 –1 –1
–1 –145 –1 –1 –1 70 –1 –1 0 –1 –1 –1 –1 –1 –1 –1 77 –19
–1 –1 –1 1 1 –1 –1 –1 –1 –1 –1 1 1 –1 –1 –1 –1 –1 0 –1 0 –1
–1 –1 2 56 –1 –1 –1 –1 57 35 –1 –1 –1 –1 –1 –1 –1 –1 –1
–1 –1 12 –1 –1 –1 –1 –1 –1 –1 –1 –1 –1 –1 –1 –1 –1 –1
–1 –1 –1 –1 –1 –1 –1 –1 0 –1 0 –1 2 –1 –1 56 –1 –1 57
–1 –1 35 –1 –1 –1 –1 –1 –1 –1 –1 –1 –1 –1 12 –1 –1 –1
–1 –1 –1 –1 –1 –1 –1 –1 –1 –1 –1 –1 –1 –1 –1 –1 –1 –1
–1 –1 0 –1 0 –1 24 –1 –1 –1 61 –1 –1 –1 60 –1 –1 –1 –1
–1 27 51 –1 –1 –1 –1 –1 16 –1 1 –1 –1 –1 –1 –1 –1 –1 –1
–1 –1 –1 –1 –1 –1 –1 –1 –1 –1 –1 –1 0 –1 24 –1 –1 –1
61 –1 –1 –1 60 –1 –1 –1 –1 27 –1 51 –1 –1 –1 –1
–1 16 –1 1 –1 –1 –1 –1 1 –1 –1 –1 –1 –1 –1 –1 –1 –1
–1 –1 –1 –1 –1 –1 0].

In some implementations, the second binary matrix may
include the following set of values: [1 1 1 1 1 1 0 1 0 1 1 1
0 0 1 1 1 1 1 1 1 1 1 1 1 1 1 1 1 1 1 1 0 1 1 1 0 0 1 1 1
1 1 1 1 1 1 0 1 1 1 1 0 1 1 0 1 1 1 1 1 0 0 1 1 1 1 1 1 1
0 1 1 1 1 0 1 1 1 1 1 1 1 1 0 0 1 1 1 1 1 1 1 1 1 1 1 0 0 1
1 1 1 1 1 1 1 1 1 0 0 1 1 1 1 1 1 0 1 1 1 0 1 1 0 1 0 1 1 1 1 0
1 1 1 1 1 0 0 1 1 1 1 0 1 1 1 0 0 1 1 0 1 0 1 1 1 1 1 1 1 1 0 0 1 1 1
1 1 1 1 0 0 1 1 1 1 1 1 1 1 1 1 1 1 1 0 0 1 1 1 1 1 1 0 1
1 1 1 0 0 1 1 1 1 1 1 1 1 1 1 1 1 1 1 0 0 1 1 1 0 0 1 1 0 1 1 1 1 1 0 1


1 1 1 1 1 1 1 1 1 1 1 0 0 1 1 1 1 1 1 1 1 0 1 1 0 0 1 1 1 1 1
1 1 1 1 1 0]. The second exponent matrix may include the
following set of values: [−1 57 −1 −1 −1 −1 −1 −1 −1 50 −1
−1 1 1 −1 −1 −1 50 −1 −1 −1 −1 79 −1 −1 1 −1 0 −1 −1 −1
−1 −1 −1 −1 −1 −1 1 1 −1−1 −1 −1 −1 −1 −1 57 −1 −1 −1 −1
−1 −1 −1 −1 50 −1 −1 −1 −1 1 1 −1 −1 −1 50 −1 −1 79 −1
−1 −1 −1 1 1 −1 0 −1 −1 −1 −1 −1 −1 −1 −1 −1 −1 −1 −1 −1
−1 −1 −1 −1 −1 −1 −1 −1 3 −1 −1 −1 28 −1 −1 −1 0 −1 −1
−1 −1 −1 −1 55 −1 −1 7 −1 −1 −1 −1 −1 −1 0 −1 0 −1 −1
−1 −1 −1 −1 −1 −1 −1 −1 −1 −1 −1 −1 −1 −1 −1 −1 −1 3 −1
−1 −1 28 −1 −1 −1 0 −1 −1 −1 −1 −1 −1 −1 −1 55 7 −1 −1
−1 −1 −1 −1 −1 −1 −1 0 −1 0 −1 −1 −1 −1 −1 −1 1 −1 −1 −1
−1 −1 −1 −1 −1 −1 −1 −1 30 −1 −1 −1 −1 −1 −1 −1 −1 24
37 −1 −1 −1 −1 −1 56 −1 −1 14 −1 −1 −1 −1 −1 −1 −1 −1
0 −1 0 −1 −1 −1 −1 −1 −1 −1 −1 −1 −1 −1 −1 −1 −1 −1 −1
−1 −1 30 −1 −1 −1 −1 −1 −1 24 −1 −1 37 −1 −1 −1 −1 −1
56 14 −1 −1 −1 −1 −1 −1 −1 −1 −1 −1 −1 0 −1 0 −1 −1 −1 −1
−1 −1 −1 −1 −1 −1 −1 −1 −1 −1 −1 −1 62 −1 53 −1 −1 −1
−1 −1 −1 53 −1 −1 −1 −1 −1 3 −1 35 −1 −1 −1 −1 −1 −1 −1
−1 −1 −1 −1 −1 0 −1 0 −1 −1 −1 −1 −1 −1 −1 −1 −1 −1 −1
−1 −1 −1 −1 −1 62 −1 53 −1 −1 −1 −1 53 −1 −1 −1 −1 −1
3 −1 35 −1 −1 −1 −1 −1 −1 −1 −1 −1 −1 −1 −1 −1 −1 0 −1
0 −1 −1 −1 −1 −1 −1 −1 −1 −1 −1 −1 −1 −1 −1 −1 40 −1 −1
−1 −1 20 −1 66 −1 −1 −1 −1 −1 −1 −1 22 −1 28 −1 −1 −1 −1
−1 −1 −1 −1 −1 −1 −1 −1 −1 −1 0 −1 0 −1 −1 −1 −1 −1 −1 −1
−1 −1 −1 −1 −1 −1 −1 40 −1 −1 −1 −1 −1 −1 −1 20 −1 66 −1
−1 −1 −1 22 −1 28 −1 −1 −1 −1 −1 −1 −1 −1 −1 −1 −1 −1 −1
−1 −1 −1 −1 0 −1 0 −1 −1 −1 −1 −1 −1 −1 −1 −1 −1 −1 −1
0 −1 −1 −1 −1 −1 −1 −18 −1 −1 −1 42 −1 −1 −1 −1 50 −1
−1 −1 −1 8 −1 −1 −1 −1 −1 −1 −1 −1 −1 −1 −1 0 −1 0 −1 −1
−1 −1 −1 −1 −1 −1 −1 −1 −1 −1 −1 0 −1 −1 −1 −1 −1 −1 −18
−1 −1 −1 42 −1 −1 50 −1 −1 −1 −1 −1 −18 −1 −1 −1 −1 −1
−1 −1 −1 −1 −1 −1 0 −1 0 −1 −1 −1 −1 −1 −1 −1 −1 −1 −1
69 −1 79 −1 79 −1 −1 −1 −1 −1 −1 −1 56 −1 −1 52 −1
−1 −1 −1 −1 −1 −1 0 −1 −1 −1 −1 −1 −1 −1 −1 −1 −1 −1 0
−1 0 −1 −1 −1 −1 −1 −1 −1 −1 −1 69 −1 79 −1 79 −1 −1 −1
−1 −1 −1 −1 56 −1 −1 −1 −1 52 −1 −1 −1 −1 −1 −1 0 −1
−1 −1 −1 −1 −1 1 1 −1 −1 −1 −1 0 −1 0 −1 −1 −1 −1 −1 −1
−1 −1 65 −1 −1 −1 −1 −1 −1 1 38 −1 57 −1 −1 −1 −1 −1
72 −1 −1 −1 27 −1 −1 −1 −1 −1 −1 −1 −1 −1 −1 −1 −1 −1 −1
−1 −1 −1 −1 0 −1 0 −1 −1 −1 −1 −1 −1 −1 −1 65 −1 −1 −1
−1 −1 −1 −1 38 −1 57 −1 −1 −1 −1 −1 72 −1 −1 −1 27 −1
−1 −1 −1 −1 −1 −1 −1 −1 −1 −1 −1 −1 −1 −1 −1 −1 −1 0 −1 0
−1 −1 −1 −1 −1 −1 −1 64 −1 −1 −1 −1 −1 −1 1 14 −1 52 −1
−1 −1 −1 −1 −1 30 −1 −1 −1 −1 −1 −1 32 −1 −1 −1 −1 −1 −1 −1
−1 −1 −1 −1 −1 −1 −1 −1 −1 −1 0 −1 0 −1 −1 −1 −1 −1 64
−1 −1 −1 −1 −1 −1 −1 14 −1 52 −1 −1 −1 −1 30 −1 −1
−1 −1 −1 32 −1 −1 −1 −1 −1 −1 −1 −1 −1 −1 −1 1 1 −1 −1 −1
−1 −1 −1 0 −1 0 −1 −1 −1 −1 −1 −1 −1 45 −1 −1 −1 70 0
−1 −1 −1 −1 −1 −1 −1 77 −19 −1 −1 −1 −1 −1 −1 −1 −1 −1
−1 −1 −1 −1 −1 −1 −1 −1 −1 −1 −1 −1 −1 −1 0 −1 0 −1 −1
−1 −1 −1 45 −1 −1 −1 70 −1 −1 0 −1 −1 −1 −1 −1 −1 −1 77
−1 9 −1 −1 −1 −1 −1 −1 −1 −1 −1 −1 −1 −1 −1 −1 −1 −1 −1
−1 −1 −1 −1 −1 0 −1 0 −1 −1 1 2 −1 56 −1 −1 −1 −1 57 35
−1 −1 −1 −1 −1 −1−1 −1 −1 −1 1 12 −1 −1 −1 −1 −1 −1 −1
−1 −1 −1 −1 −1 −1 1 1 −1 −1 −1 −1 0 −1 0 −1 −1 1 2 −1 56 −1
−1 57 −1 −1 35 −1 −1 −1 −1 −1 −1 −1 −1 −1 −1 12 −1
−1 −1 −1 −1 −1 −1 −1 −1 −1 −1 −1 −1 −1 −1 −1 −1 −1 −1 −1
−1 −1 −1 0 −1 0 −1 24 −1 −1 −1 61 −1 −1 −1 60 −1 −1 −1
−1 −1 27 51 −1 −1 −1 −1 −1 16 −1 1 1 −1 −1 −1 −1 −1 −1 −1
−1 −1 −1 −1 −1 −1 −1 −1 −1 1 1 0 −1 24 −1 −1 −1 61 −1
−1 −1 60 −1 −1 −1 −1 −1 27 −1 −1 51 −1 −1 −1 −1 −1 16
−1 1−1 −1 −1 −1 −1 −1 −1 −1 0].

In some implementations, in determining the first binary
matrix, the one or more processors may be configured to
permute (1) two or more rows of the second binary matrix
or (2) two or more columns of the second binary matrix. For example, the first binary matrix may correspond to a binary
matrix in which a first row and a second row of the second
binary matrix are permuted. The one or more processors
may be configured to determine a resulting binary matrix of
the permuting as the first binary matrix. The first binary
matrix may be determined such that the first binary matrix
maintains to have full rank.

In some implementations, the one or more processors may
be further configured to generate the second binary parity
check matrix (e.g., É matrix) corresponding to P̂=E(Ĥ) using
(1) a matrix product of the second binary parity check matrix
and the first exponent matrix (e.g., É×P̂), or (2) a matrix
product of the first exponent matrix and the second binary
parity check matrix (e.g., P×H). For example, the A matrix
may be generated by (right) multiplying the matrix product
H×P by an inverse matrix of the first exponent matrix (e.g.,
P̂⁻¹).

In one approach, an apparatus (e.g., decoder 160 or
processor 2010 of communication system 108) may include
a receiver (e.g., receiver circuitry 140) configured to receive
encoded data (e.g., from another apparatus such as commu-
nication system 105), and one or more processors (e.g.,
processor 2010). The one or more processors may be con-
figured to identify (e.g., from a codebook), based on a first
parity check matrix (e.g., base parity check matrix H) of a
first quasi-cyclic-low-density parity-check (QC-LDPC)
code according to a code rate of 1/2, a second parity check
matrix (e.g., new parity check matrix Ĥ) corresponding to a
first exponent matrix including 1152 values for a second
QC-LDPC code. The second QC-LDPC code may have a
code block size (e.g., n=3888) that is twice a code block size
of the first QC-LDPC code (e.g., n=1944). The one or more
processors may be configured to decode the received
encoded data using the second binary parity check matrix
(e.g., new parity check matrix Ĥ). For example, the encoded
data (e.g., codeword c) may be decoded to obtain informa-
tion bits s by using Equation 1, and Equations 10-13.

In some implementations, the first exponent matrix may
include at least 1150 values selected from a second exponent
matrix having the same dimensions as dimensions of the first
exponent matrix (e.g., m/Z×n/Z if the first parity check
matrix has a dimension of (m×n)). In some implementations,
the second exponent matrix may include the following set of
values: [−1 57 −1 −1 −1 −1 −1 −1 −1 50 −1 −1 −1 1 1 −1
−1 50 −1 −1 −1 79 −1 −1 1 1 −1 0 −1 −1 −1 −1 −1 −1 −1
−1 −1 −1 −1 −1 −1 −1 −1 −1 −1 −1 −1 −1 57 −1 −1 −1 −1
−1 −1 −1 −1 50 −1 −1 −1 1 1 1 −1 −1 −1 −1 50 −1 −1 79
−1 −1 −1 1 −1 0 −1 −1 −1 −1 −1 −1 −1 −1 −1 −1 −1 −1 −1
−1 3 −1 −1 −1 −1 28 −1 −1 0 −1 −1 −1 −1 −1 −1 55 −1
−1 7 −1 −1 −1 −1 −1 −1 0 −1 0 −1 −1 −1 −1 −1 −1 −1 −1
−1 −1 −1 −1 −1 −1 −1 −1 −1 −1 −1 3 −1 −1 28 −1 −1 −1
−1 0 −1 −1 −1 −1 −1 −1 −1 55 7 −1 −1 −1 −1 −1 −1 −1
0 −1 0 −1 −1 −1 −1 −1 −1 −1 −1 −1 −1 −1 −1 −1 −1 −1 −1
−1 −1 30 −1 −1 −1 −1 −1 −1 −1 24 37 −1 −1 −1 −1 −1
56 −1 −1 14 −1 −1 −1 −1 −1 −1 −1 0 −1 0 −1 −1 −1 −1
−1 −1 −1 −1 −1 −1 −1 −1 −1 −1 30 −1 −1 −1 −1 −1 −1
24 −1 −1 37 −1 −1 −1 −1 56 14 −1 −1 −1 −1 −1 −1 −1
−1 −1 −1 0 −1 0 −1 −1 −1 −1 −1 −1 −1 −1 −1 −1 −1 −1
−1 −1 −1 62 −1 53 −1 −1 −1 −1 −1 53 −1 −1 −1 −1 3 −1
35 −1 −1 −1 −1 −1 −1 −1 −1 −1 −1 −1 −1 0 −1 0 −1 −1
−1 −1 −1 −1 −1 −1 −1 −1 −1 −1 −1 −1 −1 62 −1 53 −1
−1 −1 −1 53 −1 −1 −1 −1 −1 3 −1 35 −1 −1 −1 −1 −1
−1 −1 −1 −1 −1 −1 −1 0 −1 0 −1 −1 −1 −1 −1 −1 −1 −1 −1
−1 −1 −1 −1 −1 −1 40 −1 −1 −1 −1 −1 20 −1 66 −1 −1 −1
−1 −1 22 −1 28 −1 −1 −1 −1 −1 −1 −1 −1 −1 −1 −1 −1 −1
−1 0 −1 0 −1 −1 −1 −1 −1 −1 −1 −1 −1 −1 −1 −1 40 −1
−1 −1 −1 −1 −1 20 66 −1 −1 −1 −1 −1 22 −1 28 −1 −1 −1

-1 -1 -1 -1 -1 -1 -1 -1 -1 -1 -1 -1 -1 0 -1 0 -1 -1 -1
-1 -1 -1 -1 -1 -1 -1 -1 -1 0 -1 -1 -1 -1 -1 -1 -1 -18
-1 -1 42 -1 -1 -1 -1 50 -1 -1 -1 -1 -18 -1 -1 -1 -1 -1
-1 -1 -1 -1 -1 0 -1 0 -1 -1 -1 -1 -1 -1 -1 -1 -1 -1
-1 0 -1 -1 -1 -1 -1 -18 -1 -1 -1 -1 42 -1 -1 50 -1 -1
-1 -1 -1 8 -1 -1 -1 -1 -1 -1 -1 -1 -1 -1 -1 -1 0 -1 0
-1 -1 -1 -1 -1 -1 -1 -1 -1 -1 -1 69 79 -1 -1 79 -1 -1
-1 -1 -1 -1 56 -1 -1 -1 -1 52 -1 -1 -1 -1 -1 -1 0 -1 -1
-1 -1 -1 -1 -1 -1 -1 -1 -1 0 -1 0 -1 -1 -1 -1 -1 -1 -1
-1 -1 69 -1 -1 79 79 -1 -1 -1 -1 -1 -1 -1 -1 56 -1 -1 -1
52 -1 -1 -1 -1 -1 -1 -1 -1 0 -1 -1 -1 -1 -1 -1 -1 -1 -1
-1 -1 0 -1 0 -1 -1 -1 -1 -1 -1 -1 -1 65 -1 -1 -1 -1 -1
-1 -1 38 57 -1 -1 -1 -1 -1 -1 72 -1 -1 -1 27 -1 -1 -1 -1
-1 -1 -1 -1 -1 -1 1 1 -1 -1 -1 -1 -1 0 -1 0 -1 -1 -1 -1
-1 -1 -1 65 -1 -1 -1 -1 -1 -1 -1 38 -1 -1 57 -1 -1 -1 -1
-1 72 -1 -1 -1 27 -1 -1 -1 -1 -1 -1 -1 -1 -1 -1 -1 -1 -1
-1 -1 -1 -1 -1 -1 0 -1 0 -1 -1 -1 -1 -1 -1 -1 64 -1 -1
-1 -1 -1 -1 14 -1 -1 52 -1 -1 -1 -1 30 -1 -1 -1 -1 -1
-1 32 -1 -1 -1 -1 -1 -1 -1 -1 -1 -1 -1 -1 -1 -1 -1 -1 -1
0 -1 0 -1 -1 -1 -1 -1 64 -1 -1 -1 -1 -1 -1 -1 14 52
-1 -1 -1 -1 -1 30 -1 -1 -1 -1 -1 32 -1 -1 -1 -1 -1 -1
-1 -1 -1 -1 -1 -1 -1 -1 -1 -1 -1 -1 0 -1 0 -1 -1 -1 -1
-1 -1 45 -1 -1 -1 -1 70 -1 0 -1 -1 -1 -1 -1 -1 -1 -1 779
-1 -1 -1 -1 -1 -1 -1 -1 -1 -1 -1 -1 -1 -1 -1 -1 -1 -1 -1
-1 -1 -1 -1 -1 0 -1 0 -1 -1 -1 -1 -1 -1 45 -1 -1 70 -1
0 -1 -1 -1 -1 -1 -1 -1 77 -1 -1 9 -1 -1 -1 -1 -1 -1 -1
-1 -1 -1 -1 -1 -1 -1 -1 -1 -1 -1 -1 -1 -1 -1 0 -1 0 -1
-1 2 -1 56 -1 -1 -1 -1 57 35 -1 -1 -1 -1 -1 -1 -1 -1 -1
-1 -1 -1 12 -1 -1 -1 -1 -1 -1 -1 -1 -1 -1 -1 -1 -1 -1 -1
-1 -1 -1 -1 -1 -1 -1 -1 0 -1 0 -1 -1 2 -1 56 -1 -1 57
-1 -1 35 -1 -1 -1 -1 -1 -1 -1 -1 -1 -1 -1 12 -1 -1 -1 -1
-1 -1 -1 -1 -1 -1 -1 -1 -1 -1 -1 -1 -1 -1 -1 -1 -1 -1 -1
-1 -1 0 -1 0 -1 24 -1 -1 -1 61 -1 -1 -1 60 -1 -1 -1 -1
27 -1 51 -1 -1 -1 -1 -1 16 -1 1 -1 -1 -1 -1 -1 -1 -1 -1
-1 -1 -1 -1 -1 -1 -1 -1 -1 -1 0 -1 24 -1 -1 -1 61 -1 -1
-1 60 -1 -1 -1 -1 -1 -1 27 -1 51 -1 -1 -1 -1 -1 16 -1
1 -1 -1 -1 -1 -1 -1 -1 -1 -1 -1 -1 -1 -1 -1 -1 -1 -1
-1 -1 -1 0].

The first exponent matrix may include one or two values shifted from one or more corresponding positive values of the second exponent matrix by −1 or +1. The one or more corresponding positive values of the second exponent matrix may not be selected as the at least 1150 values. The first exponent matrix (e.g., permutation matrix P) may be generated by perturbating one or two values from the second exponent matrix. For example, based on the second exponent matrix, the first matrix may be generated as [−1 56 −1 −1 −1 −1 −1 −1 −1 49 −1 −1 −1 1 1 −1 −1 50 −1 −1 −1 79 −1 −1 −1 1 1 −1 0 −1 −1 −1 −1 −1 −1 −1 −1 −1 −1 −1 −1 −1 −1 −1 −1 −1 57 −1 −1 −1 −1 −1 −1 50 −1 −1 1 1 1 −1 −1 −1 50 −1 −1 −1 79 −1 −1 −1 1 1 −1 0 −1 −1 −1 −1 −1 −1 −1 −1 −1 −1 −1 −1 −1 −1 −1 3 −1 −1 −1 −1 28 −1 −1 0 −1 −1 −1 −1 −1 −1 55 −1 −1 7 −1 −1 −1 −1 −1 −1 0 −1 0 −1 −1 −1 −1 −1 −1 −1 −1 −1 −1 −1 3 −1 −1 28 −1 −1 −1 0 −1 −1 −1 −1 −1 −1 55 7 −1 −1 −1 −1 −1 −1 −1 −1 −1 0 −1 0 −1 −1 −1 −1 −1 −1 −1 −1 −1 −1 −1 −1 30 −1 −1 −1 −1 −1 −1 −1 24 37 −1 −1 −1 −1 −1 56 −1 −1 14 −1 −1 −1 −1 −1 −1 −1 −1 0 −1 0 −1 −1 −1 −1 −1 −1 −1 −1 −1 −1 −1 −1 30 −1 −1 −1 −1 −1 −1 24 −1 −1 37 −1 −1 −1 −1 56 14 −1 −1 −1 −1 −1 −1 −1 −1 0 −1 0 −1 −1 −1 −1 −1 −1 −1 −1 −1 −1 −1 62 −1 53 −1 −1 −1 −1 −1 −1 53 −1 −1 1 3 −1 35 −1 −1 −1 −1 −1 −1 −1 −1 −1 −1 −1 −1 −1 0 −1 0 −1 −1 −1 −1 −1 −1 −1 −1 −1 −1 −1 −1 62 −1 53 −1 −1 −1 −1 53 −1 −1 −1 −1 −1 3 −1 35 −1 −1 −1 −1 −1 −1 −1 −1 −1 0 −1 0 −1 −1 −1 −1 −1 −1

-1 -1 -1 -1 -1 -1 40 -1 -1 -1 -1 20 -1 -1 66 -1 -1
-1 -1 -1 22 -1 28 -1 -1 -1 -1 -1 -1 -1 -1 -1 -1 -1 -1
-1 -1 0 -1 0 -1 -1 -1 -1 -1 -1 -1 -1 -1 -1 -1 -1 -1 40
-1 -1 -1 -1 -1 -1 20 66 -1 -1 -1 -1 -1 22 -1 28 -1 -1
-1 -1 -1 -1 -1 -1 -1 -1 -1 -1 -1 -1 -1 -1 -1 0 -1 0 -1 -1
-1 -1 -1 -1 -1 -1 -1 -1 -1 -1 0 -1 -1 -1 -1 -1 -1 -1 -1
8 -1 -1 42 -1 -1 -1 -1 50 -1 -1 -1 -1 -18 -1 -1 -1 -1
-1 -1 -1 -1 -1 -1 0 -1 0 -1 -1 -1 -1 -1 -1 -1 -1 -1 -1
-1 -1 0 -1 -1 -1 -1 -1 -18 -1 -1 -1 -1 42 -1 -1 50 -1
-1 -1 -1 -18 -1 -1 -1 -1 -1 -1 -1 -1 -1 -1 -1 -1 -1 0 -1
0 -1 -1 -1 -1 -1 -1 -1 -1 -1 -1 69 79 -1 -1 79 -1 -1
-1 -1 -1 56 -1 -1 -1 -1 52 -1 -1 -1 -1 -1 -1 0 -1 -1
-1 -1 -1 -1 -1 -1 -1 -1 0 -1 0 -1 -1 -1 -1 -1 -1 -1 -1
-1 69 -1 -1 79 79 -1 -1 -1 -1 -1 -1 -1 -1 56 -1 -1 52
-1 -1 -1 -1 -1 -1 -1 -1 0 -1 -1 -1 -1 -1 -1 -1 -1 -1 -1
-1 0 -1 0 -1 -1 -1 -1 -1 -1 -1 -1 65 -1 -1 -1 -1 -1
-1 -1 38 57 -1 -1 -1 -1 -1 -1 72 -1 -1 -1 27 -1 -1 -1
-1 -1 -1 -1 -1 -1 -1 -1 -1 -1 -1 -1 -1 0 -1 0 -1 -1 -1
-1 -1 -1 65 -1 -1 -1 -1 -1 -1 -1 38 -1 -1 57 -1 -1 -1
-1 -1 72 -1 -1 -1 27 -1 -1 -1 -1 -1 -1 -1 -1 -1 -1 -1 -1
-1 -1 -1 -1 -1 -1 -1 0 -1 0 -1 -1 -1 -1 -1 -1 -1 64 -1
-1 -1 -1 -1 -1 14 -1 -1 52 -1 -1 -1 -1 30 -1 -1 -1
-1 -1 32 -1 -1 -1 -1 -1 -1 -1 -1 -1 -1 -1 -1 -1 -1 -1 -1
-1 0 -1 0 -1 -1 -1 -1 -1 64 -1 -1 -1 -1 -1 -1 -1 -1 14
52 -1 -1 -1 -1 -1 -1 30 -1 -1 -1 -1 -1 32 -1 -1 -1 -1 -1
-1 -1 -1 -1 -1 -1 -1 -1 -1 -1 -1 -1 0 -1 0 -1 -1 -1 -1
-1 -1 -1 45 -1 -1 -1 70 -1 0 -1 -1 -1 -1 -1 -1 -1 779
-1 -1 -1 -1 -1 -1 -1 -1 -1 -1 -1 -1 -1 -1 -1 -1 -1 -1 -1
-1 -1 -1 -1 -1 0 -1 0 -1 -1 -1 -1 -1 45 -1 -1 70 -1
0 -1 -1 -1 -1 -1 -1 -1 77 -1 -1 9 -1 -1 -1 -1 -1 -1 -1
-1 -1 -1 -1 -1 -1 -1 -1 -1 -1 -1 -1 -1 -1 -1 -1 -1 0 -1 0
-1 -1 2 -1 56 -1 -1 -1 -1 57 35 -1 -1 -1 -1 -1 -1 -1 -1
-1 -1 -1 -1 12 -1 -1 -1 -1 -1 -1 -1 -1 -1 -1 -1 -1 -1 -1
-1 -1 -1 -1 -1 -1 -1 -1 0 -1 0 -1 -1 2 -1 56 -1 -1 -1
57 -1 -1 35 -1 -1 -1 -1 -1 -1 -1 -1 -1 -1 -1 -1 12 -1 -1 -1
-1 -1 -1 -1 -1 -1 -1 -1 -1 -1 -1 -1 -1 -1 -1 -1 -1 -1 -1
-1 -1 -1 0 -1 0 -1 24 -1 -1 -1 61 -1 -1 -1 60 -1 -1 -1
-1 27 -1 51 -1 -1 -1 -1 -1 16 -1 1 -1 -1 -1 -1 -1 -1 -1
-1 -1 -1 -1 -1 -1 -1 -1 -1 -1 -1 -1 -1 -1 0 -1 24 -1 -1
-1 61 -1 -1 -1 60 -1 -1 -1 -1 -1 -1 27 -1 51 -1 -1 -1
-1 -1 16 -1 1 1 -1 -1 -1 -1 -1 -1 -1 -1 -1 -1 -1 -1 -1
-1 -1 -1 -1 -1 -1 -1 0] in which the second value 56 and the tenth value 49 are shifted from 57 and 50, respectively.

In some implementations, the second exponent matrix may include the following set of values: [−1 57 −1 −1 −1 −1 −1 −1 −1 50 −1 −1 1 1 1 −1 −1 −1 50 −1 −1 −1 −1 79 −1 −1 1 −1 0 −1 −1 −1 −1 −1 −1 −1 −1 −1 −1 −1 −1 −1 −1 −1 −1 57 −1 −1 −1 −1 −1 −1 −1 −1 50 −1 −1 −1 −1 1 1 −1 −1 −1 50 −1 −1 79 −1 −1 −1 −1 1 1 −1 0 −1 −1 −1 −1 −1 −1 −1 −1 −1 −1 −1 −1 −1 −1 −1 −1 3 −1 −1 −1 28 −1 −1 −1 0 −1 −1 −1 −1 −1 −1 −1 −1 55 −1 −1 7 −1 −1 −1 −1 −1 −1 −1 0 −1 0 −1 −1 −1 −1 −1 −1 1 1 −1 −1 −1 −1 −1 −1 −1 −1 −1 −1 3 −1 −1 −1 28 −1 −1 −1 0 −1 −1 −1 −1 −1 −1 −1 55 7 −1 −1 −1 −1 −1 −1 −1 −1 0 −1 0 −1 −1 −1 −1 −1 −1 −1 −1 −1 −1 −1 −1 −1 −1 −1 −1 −1 −1 −1 30 −1 −1 −1 −1 −1 −1 −1 24 37 −1 −1 −1 −1 −1 56 −1 −1 14 −1 −1 −1 −1 −1 −1 −1 −1 0 −1 0 −1 −1 −1 −1 −1 1 1 −1 −1 −1 −1 −1 −1 −1 −1 −1 −1 30 −1 −1 −1 −1 −1 −1 24 −1 −1 37 −1 −1 −1 −1 56 14 −1 −1 −1 −1 −1 −1 −1 −1 −1 0 −1 0 −1 −1 −1 −1 −1 −1 −1 −1 −1 −1 −1 −1 −1 62 −1 53 −1 −1 −1 −1 −1 53 −1 −1 −1 −1 −1 3 −1 35 −1 −1 −1 −1 −1 −1 −1 −1 −1 −1 −1 0 −1 0 −1 −1 −1 −1 −1 −1 −1 −1 −1 −1 −1 −1 62 −1 53 −1 −1 −1 −1 −1 −1 53 −1 −1 −1 −1 −1 3 −1 35 −1 −1 −1 −1 −1 −1 −1 −1 −1 0 −1 0 −1 −1 −1 −1 −1 −1 −1 −1 −1 −1 −1 40 −1 −1 −1 −1 20 −1 66 −1 −1 −1 −1 −1 22 −1 28 −1 −1 −1 −1 −1 −1 −1 −1 −1 −1 −1 −1 −1 −1 −1 −1

0 –1 0 –1 –1 –1 –1 –1 –1 –1 –1 –1 –1 –1 –1 –140 –1 –1
–1 –1 –1 –1 20 –1 66 –1 –1 –1 –1 –1 22 –1 28 –1 –1 –1
–1 –1 –1 –1 –1 –1 –1 –1 –1 0 –1 0 –1 –1 –1 –1 –1 –1
–1 –1 –1 –1 –1 0 –1 –1 –1 –1 –1 –18 –1 –1 –1 –1 42 –1
–1 –1 –1 50 –1 –1 –1 –18 –1 –1 –1 –1 –1 –1 –1 –1 –1 –1
–1 0 –1 0 –1 –1 –1 –1 –1 –1 –1 –1 –1 –1 –1 0 –1 –1
–1 –1 –1 –1 –18 –1 –1 –1 42 –1 –1 50 –1 –1 –1 –1 –1 –1
8 –1 –1 –1 –1 –1 –1 –1 –1 –1 –1 0 –1 0 –1 –1 –1 –1
–1 –1 –1 –1 –1 –1 69 –1 79 –1 79 –1 –1 –1 –1 –1 –1 –1
–1 56 –1 –1 52 –1 –1 –1 –1 –1 –1 –1 0 –1 –1 –1 –1 –1 –1
–1 –1 –1 –1 –1 0 –1 0 –1 –1 –1 –1 –1 –1 –1 –1 –1 69
–1 79 –1 79 –1 –1 –1 –1 –1 56 –1 –1 –1 –1 52 –1 –1
–1 –1 –1 –1 –1 0 –1 –1 –1 –1 –1 –1 –1 –1 –1 –1 0 –1
0 –1 –1 –1 –1 –1 –1 –1 –1 65 –1 –1 –1 –1 –1 –1 38 –1
57 –1 –1 –1 –1 –1 72 –1 –1 –1 27 –1 –1 –1 –1 –1 –1 –1
–1 –1 –1 –1 –1 –1 –1 –1 –1 –1 0 –1 0 –1 –1 –1 –1 –1
–1 –1 65 –1 –1 –1 –1 –1 –1 38 –1 57 –1 –1 –1 –1 –1
72 –1 –1 –1 27 –1 –1 –1 –1 –1 –1 –1 –1 –1 –1 1 –1 –1
–1 –1 –1 0–1 0 –1 –1 –1 –1 –1 –1 64 –1 –1 –1 –1 –1
–1 –1 14 52 –1 –1 –1 –1 –1 –1 30 –1 –1 –1 –1 –1 32 –1
–1 –1 –1 –1 –1 –1 –1 –1 –1 –1 –1 –1 –1 –1 –1 0 –1 0 –1
–1 –1 –1 –1 64 –1 –1 –1 –1 –1 –1 –1 14 –1 –1 52 –1 –1
–1 –1 30 –1 –1 –1 –1 –1 32 –1 –1 –1 –1 –1 –1 –1 –1 –1
–1 –1 –1 –1 –1 –1 –1 –1 0 –1 0 –1 –1 –1 –1 –1 –1 –1 45
–1 –1 –1 70 0 –1 –1 –1 –1 –1 –1 –1 77 –1 9 –1 –1 –1 –1
–1 –1 –1 –1 –1 –1 –1 –1 –1 –1 –1 –1 –1 –1 –1 –1 –1 –1
–1 0 –1 0 –1 –1 –1 –1 –1 45 –1 –1 –1 70 –1 –1 0 –1 –1
–1 –1 –1 –1 –1 77 –19 –1 –1 –1 –1 –1 –1 –1 –1 –1 –1 –1
–1 –1 –1 –1 –1 –1 –1 –1 –1 –1 –1 –1 0 –1 0 –1 –1 –1 2
56 –1 –1 –1 –1 57 35 –1 –1 –1 –1 –1 –1 –1 –1 –1 –1 –1
12 –1 –1 –1 –1 –1 –1 –1 –1 –1 –1 –1 –1 –1 –1 –1 –1 –1
–1 –1 –1 –1 –1 –1 0 –1 0 –1 2 –1 –1 56 –1 –1 57 –1 –1
35 –1 –1 –1 –1 –1 –1 –1 –1 –1 –1 –1 1 2 –1 –1 –1 –1 –1
–1 –1 –1 –1 –1 –1 –1 –1 –1 –1 –1 –1 –1 –1 –1 –1 –1 –1
0 –1 0 –1 24 –1 –1 –1 61 –1 –1 –1 60 –1 –1 –1 –1 –1 27
51 –1 –1 –1 –1 –1 16 –1 1 –1 –1 –1 –1 –1 –1 –1 –1 –1
–1 –1 –1 –1 –1 –1 –1 –1 –1 –1 –1 0 –1 24 –1 –1 –1 61 –1
–1 –1 60 –1 –1 –1 –1 –1 27 –1 –1 51 –1 –1 –1 –1 –1 16
–11 –1 –1 –1 –1 –1 –1 –1 –1 –1 –1 –1 –1 –1 –1 –1 –1
–1 –1 –1 –1 0].

In some implementations, the second exponent matrix may include the following set of values: [–1 57 –1 –1 –1 –1 –1 –1 –1 50 –1 –1 1 1 –1 –1 –1 50 –1 –1 –1 –1 79 –1 –1 1 –1 0 –1 –1 –1 –1 –1 –1 –1 –1 –1 –1 –1 –1 –1 –1 –1 –1 –1 –1 –1 –1 57 –1 –1 –1 –1 –1 50 –1 –1 –1 –1 1 1 –1 –1 –1 50 –1 –1 79 –1 –1 –1 –1 1 1 –1 0 –1 –1 –1 –1 –1 –1 –1 –1 –1 –1 –1 –1 –1 –1 –1 –1 –1 –1 –1 3 –1 –1 –1 28 –1 –1 –1 0 –1 –1 –1 –1 –1 55 –1 –1 7 –1 –1 –1 –1 –1 –1 –1 0 –1 0 –1 –1 –1 –1 –1 –1 –1 –1 –1 –1 –1 –1 –1 –1 –1 –1 –1 –1 –1 3 –1 –1 –1 28 –1 –1 –1 0 –1 –1 –1 –1 –1 –1 55 7 –1 –1 –1 –1 –1 –1 –1 –1 0 –1 0 –1 –1 –1 –1 –1 –1 –1 –1 –1 –1 –1 –1 –1 30 –1 –1 –1 –1 –1 –1 24 37 –1 –1 –1 –1 –1 56 –1 –1 14 –1 –1 –1 –1 –1 –1 –1 –1 0 –1 0 –1 –1 –1 –1 –1 –1 –1 –1 –1 –1 –1 –1 –1 –1 –1 –1 30 –1 –1 –1 –1 –1 24 –1 –1 37 –1 –1 –1 –1 –1 56 14 –1 –1 –1 –1 –1 –1 –1 –1 –1 –1 –1 0 –1 0 –1 –1 –1 –1 –1 –1 –1 –1 –1 –1 –1 –1 –1 62 –1 53 –1 –1 –1 –1 –1 –1 53 –1 –1 –1 –1 –1 3 –1 35 –1 –1 –1 –1 –1 –1 –1 –1 –1 –1 –1 0 –1 0 –1 –1 –1 –1 –1 –1 –1 –1 –1 –1 –1 –1 –1 –1 62 –1 53 –1 –1 –1 53 –1 –1 –1 –1 –1 3 –1 35 –1 –1 –1 –1 –1 –1 –1 –1 –1 0 –1 0 –1 –1 –1 –1 –1 –1 –1 –1 –1 –1 –1 –1 –1 40 –1 –1 –1 –1 20 –1 66 –1 –1 –1 –1 –1 22 –1 28 –1 –1 –1 –1 –1 –1 –1 –1 –1 –1 –1 –1 0 –1 0 –1 –1 –1 –1 –1 –1 –1 –1 –1 –1 –1 –1 –1 –1 –1 –1 40 –1 –1 –1 –1 –1 –1 20 –1 66 –1 –1 –1 –1 –1 22 –1 28 –1 –1 –1 –1 –1 –1 –1 –1 –1 –1 –1 –1 –1 –1 –1 –1 –1 –1 0 –1 0 –1 –1 –1 –1 –1 –1

---

–1 –1 –1 –1 –1 –1 0 –1 –1 –1 –1 –1 –1 –18 –1 –1 –1 42
–1 –1 –1 –1 50 –1 –1 –1 –18 –1 –1 –1 –1 –1 –1 –1 –1 –1
–1 –1 0 –1 0 –1 –1 –1 –1 –1 –1 –1 –1 –1 –1 –1 –1 0 –1
–1 –1 –1 –1 –1 –18 –1 –1 1 42 –1 –1 50 –1 –1 –1 –1 –1
–1 8 –1 –1 –1 –1 –1 –1 –1 –1 –1 –1 –1 –1 0 –1 0 –1 –1 –1
–1 –1 –1 –1 –1 –1 –1 69 –1 79 –1 79 –1 –1 –1 –1 –1 –1
–1 56 –1 –1 52 –1 –1 –1 –1 –1 –1 –1 0 –1 –1 –1 –1 –1 1
–1 –1 –1 –1 0 –1 0 –1 –1 –1 –1 –1 –1 –1 1 –1 –1 –1 69 –1
79 –1 79 –1 –1 –1 –1 –1 –1 56 –1 –1 –1 –1 52 –1 –1 –1
–1 –1 –1 –1 0 –1 –1 –1 –1 –1 –1 –1 –1 1 1 –1 –1 –1 0 –1 0 –1
–1 –1 –1 –1 –1 –1 65 –1 –1 –1 –1 –1 –1 38 –1 57 –1
–1 –1 –1 –1 72 –1 –1 –1 27 –1 –1 –1 –1 –1 –1 –1 –1 –1
–1 –1 –1 –1 –1 –1 –1 –1 0 –1 0 –1 –1 –1 –1 –1 –1 –1
65 –1 –1 –1 –1 –1 –1 –1 38 –1 57 –1 –1 –1 –1 –1 72 –1
–1 –1 27 –1 –1 –1 –1 –1 –1 –1 –1 –1 –1 –1 –1 –1 –1 –1
–1 –1 0 –1 0 –1 –1 –1 –1 –1 –1 –1 –1 64 –1 –1 –1 –1 –1
14 –1 52 –1 –1 –1 –1 –1 –1 30 –1 –1 –1 –1 –1 32 –1 –1
–1 –1 –1 –1 –1 –1 –1 –1 –1 –1 –1 –1 –1 –1 0 –1 0 –1 –1
–1 –1 –1 64 –1 –1 –1 –1 –1 –1 –1 14 –1 52 –1 –1 –1 –1
–1 30 –1 –1 –1 –1 –1 32 –1 –1 –1 –1 –1 –1 –1 –1 –1 –1
–1 –1 –1 –1 –1 –1 –1 –1 0 –1 0 –1 –1 –1 –1 –1 –1 –1 45
–1 –1 –1 70 0 –1 –1 –1 –1 –1 –1 –1 77 –1 9 –1 –1 –1 –1
–1 –1 –1 –1 –1 –1 –1 –1 –1 –1 –1 –1 –1 –1 –1 –1 –1 –1
–1 0 –1 0 –1 –1 –1 –1 –1 45 –1 –1 –1 70 –1 –1 0 –1 –1
–1 –1 –1 –1 –1 77 –19 –1 –1 –1 –1 –1 –1 –1 –1 –1 –1 –1
–1 –1 –1 –1 –1 –1 –1 –1 –1 –1 –1 –1 0 –1 0 –1 –1 –1 2 –1
56 –1 –1 –1 –1 57 35 –1 –1 –1 –1 –1 –1 –1 –1 –1 –1 –1
12 –1 –1 –1 –1 –1 –1 –1 –1 –1 –1 –1 –1 –1 –1 –1 –1 –1
–1 –1 –1 –1 –1 –1 0 –1 0 –1 –1 2 –1 56 –1 –1 57 –1 –1
35 –1 –1 –1 –1 –1 –1 –1 –1 –1 –1 –1 1 2 –1 –1 –1 –1 –1
–1 –1 –1 –1 –1 –1 –1 –1 –1 –1 –1 –1 –1 –1 –1 –1 –1 –1
0 –1 0 –1 24 –1 –1 –1 61 –1 –1 –1 60 –1 –1 –1 –1 –1 27
51 –1 –1 –1 –1 –1 16 –1 1 –1 –1 –1 –1 –1 –1 –1 –1 –1
–1 –1 –1 –1 –1 –1 –1 –1 –1 –1 –1 0 –1 24 –1 –1 –1 61 –1
–1 –1 60 –1 –1 –1 –1 –1 27 –1 –1 51 –1 –1 –1 –1 –1 16
–11 –1 –1 –1 –1 –1 –1 –1 –1 –1 –1 –1 –1 –1 –1 –1 –1
–1 –1 –1 0].

In some implementations, the one or more processors may be configured to identify (e.g., from a codebook) a third binary parity check matrix in which one or more rows or one or more columns of the second binary parity check matrix are permuted, the third binary parity check matrix having the same dimensions as dimensions of the first binary parity check matrix. For example, the third binary parity check matrix may correspond to a binary parity check matrix in which a first row and a second row of the second binary parity check matrix are permuted. the one or more processors may be further configured to decode the received encoded data using the third binary parity check matrix.

In some implementations, the one or more processors may be configured to identify a fourth binary parity check matrix corresponding to a third exponent matrix in which one or more rows or one or more columns of the first exponent matrix are permuted. For example, the third exponent matrix may correspond to an exponent matrix in which a first row and a second row of the first exponent matrix are permuted. The third exponent matrix may have the same dimensions as dimensions of the first exponent matrix. The one or more processors may be configured to decode the received encoded data using the fourth binary parity check matrix.

FIG. 13 is a flow diagram showing a process for encoding data and/or decoding data using an LDPC code, in accordance with an embodiment. FIG. 13 is a flow diagram showing a process 1300 for encoding data using an LDPC code, in accordance with an embodiment. In some embodiments, the process 1300 is performed by one or more processors of a first device (e.g. encoder 130 or processor 2010 of communication system 105) or by one or more processors of a second device (e.g., decoder 160 or processor 2010 of communication system 108). In other embodiments, the process 1300 is performed by other entities (e.g., a computing system other than the communication system 105 or 108). In some embodiments, the process 1300 includes more, fewer, or different steps than shown in FIG. 13.

At step 1302, the first device may identify, based on a first parity check matrix (e.g., base parity check matrix H) of a first quasi-cyclic-low-density parity-check (QC-LDPC) code according to a code rate of 1/2, a second parity check matrix (e.g., new parity check matrix H) corresponding to a first exponent matrix (e.g., E(H)) including 1152 values for a second QC-LDPC code. The second QC-LDPC code may have a code block size (e.g., n=3888) that is twice a code block size of the first QC-LDPC code (e.g., n=1944).

In some implementations, the first parity check matrix of the first QC-LDPC code having the code rate of 1/2 may be identified (e.g., from a codebook) by the first device or another device other than the first device. If the device other than the first device identifies the first parity check matrix, that device may transmit the first parity check matrix to the first device. A first binary matrix having the same dimensions (e.g., m/Z×n/Z if the first parity check matrix has a dimension of (m×n)) as dimensions of an exponent matrix of the first parity check matrix may be determined. A Khatri-Rao product of the first parity check matrix and the first binary matrix may be determined (e.g., using Equation 15). The second parity check matrix (e.g., new parity check matrix H) may be determined based on a result of the Khatri-Rao product.

In some implementations, the first binary matrix may be determined by the following steps: (i) determining a second binary matrix having the same dimensions as dimensions of the first binary matrix; and (ii) determining the first binary matrix including at least (1) one or more rows of a second binary matrix or (2) one or more columns of the second binary matrix. The second parity check matrix may be determined by the following steps: (i) determining, based on a result of the Khatri-Rao product, a second exponent matrix having the same dimensions as dimensions of the first exponent matrix, (ii) determining, based on the second exponent matrix, the first exponent matrix; and (iii) determining, based on the first exponent matrix, the second parity check matrix (e.g., using Equation 8).

In some implementations, the second binary matrix may include the following set of values: [1 1 1 1 1 1 0 1 0 1 1 1 0 0 1 1 1 1 1 1 1 1 1 1 1 1 1 1 1 1 0 1 1 1 0 0 1 1 1 1 1 1 1 1 0 1 1 1 0 1 1 0 1 1 1 1 0 0 1 1 1 1 1 1 1 1 0 0 1 1 1 1 1 1 1 1 1 1 1 1 0 0 1 1 1 1 1 1 1 1 1 0 0 1 1 1 1 1 1 0 1 1 1 0 1 0 1 1 1 1 0 1 1 1 1 0 0 1 1 1 1 1 0 0 0 1 1 1 1 0 1 1 1 0 1 1 1 1 0 0 1 1 1 1 0 1 1 0 0 1 1 0 1 0 1 1 1 1 1 1 1 0 0 1 1 1 1 1 1 0 1 1 1 1 1 1 1 1 1 1 0 0 1 1 1 1 1 1 0 1 1 0 0 1 1 1 1 1 1 1 1 1 1 0 0 1 1 0 1 1 0 1 1 1 1 1 0 1 1 1 1 1 1 1 1 1 1 0 0 1 1 1 1 1 1 1 0]. The second exponent matrix may include the following set of values: [-1 57 -1 -1 -1 -1 -1 -1 -1 50 -1 -1 1 1 -1 -1 -1 50 -1 -1 -1 -1 79 -1 -1 1 1 -1 0 -1 -1 -1 -1 -1 -1 -1 -1 -1 -1 -1 -1 -1 -1 -1 -1 -1 -1 -1 57 -1 -1 -1 -1 -1 -1 50 -1 -1 -1 -1 1 1 -1 -1 -1 50 -1 -1 79 -1 -1 -1 1 -1 0 -1 -1 -1 -1 -1 -1 -1 -1 -1 -1 -1 -1 -1 -1 -1 -1 -1 -1 -1 3 -1 -1 -1 28 -1 -1 -1 0 -1 -1 -1 -1 -1 1 55 -1 -1 7 -1 -1 -1 -1 -1 -1 1 0 -1 0 -1 -1 -1 -1 -1 -1 -1 -1 -1 -1 -1 -1 -1 -1 -1 -1 -1 3 -1 -1 -1 28 -1 -1 -1 0 -1 -1 -1 -1 -1 -1 -1 -1

55 7 -1 -1 -1 -1 -1 -1 -1 -1 0 -1 0 -1 -1 -1 -1 -1 -1 -1 -1 -1 -1 -1 -1 -1 -1 -1 -1 -1 -1 -1 30 -1 -1 -1 -1 -1 -1 -1 -1 -1 24 37 -1 -1 -1 -1 -1 56 -1 -1 14 -1 -1 -1 -1 -1 -1 -1 -1 -1 0 -1 0 -1 -1 -1 -1 -1 -1 -1 -1 -1 -1 -1 -1 -1 -1 -1 -1 -1 -1 30 -1 -1 -1 -1 -1 -1 24 -1 -1 37 -1 -1 -1 -1 -1 56 14 -1 -1 -1 -1 -1 -1 -1 -1 -1 -1 -1 0 -1 0 -1 -1 -1 -1 -1 -1 -1 -1 -1 -1 -1 -1 -1 -1 -1 -1 -1 -1 -1 62 -1 53 -1 -1 -1 -1 -1 -1 53 -1 -1 -1 -1 -1 3 -1 35 -1 -1 -1 -1 -1 -1 -1 -1 -1 -1 -1 -1 -1 0 -1 0 -1 -1 -1 -1 -1 -1 -1 -1 -1 -1 -1 -1 -1 -1 -1 -1 -1 62 -1 53 -1 -1 -1 -1 53 -1 -1 -1 -1 1 3 -1 35 -1 -1 -1 -1 -1 -1 -1 -1 -1 -1 -1 -1 -1 -1 -1 0 -1 0 -1 -1 -1 -1 -1 -1 -1 -1 -1 -1 -1 -1 -14 0 -1 -1 -1 -1 20 -1 66 -1 -1 -1 -1 -1 22 -1 28 -1 -1 -1 -1 -1 -1 -1 -1 -1 -1 -1 -1 -1 -1 0 -1 0 -1 -1 -1 -1 -1 -1 -1 -1 -1 -1 -1 -1 -1 -1 -1 40 -1 -1 -1 -1 -1 -1 20 -1 66 -1 -1 -1 -1 -1 22 -1 28 -1 -1 -1 -1 -1 -1 -1 -1 -1 -1 -1 -1 -1 -1 0 -1 0 -1 -1 -1 -1 -1 -1 -1 -1 -1 -1 0 -1 -1 -1 -1 -1 -1 -18 -1 -1 -1 42 -1 -1 -1 -1 50 -1 -1 -1 1 8 -1 -1 -1 -1 -1 -1 -1 -1 -1 -1 -1 -1 0 -1 0 -1 -1 -1 -1 -1 -1 -1 -1 -1 -1 -1 -1 -1 0 -1 -1 -1 -1 -18 -1 -1 -1 42 -1 -1 -1 1 -1 -1 -1 -1 -1 -1 -1 -1 -1 0 -1 0 -1 -1 -1 -1 -1 -1 -1 -1 -1 69 -1 79 -1 79 -1 -1 -1 -1 -1 -1 -1 56 -1 -1 52 -1 -1 -1 -1 -1 1 0 -1 -1 -1 -1 -1 -1 -1 -1 -1 0 -1 0 -1 -1 -1 -1 -1 -1 -1 -1 -1 -1 -1 69 -1 79 -1 79 -1 -1 -1 -1 -1 -1 56 -1 -1 -1 -1 -1 52 -1 -1 -1 -1 -1 1 0 -1 -1 -1 -1 -1 -1 -1 -1 -1 -1 0 -1 0 -1 -1 -1 -1 -1 -1 65 -1 -1 -1 -1 -1 -1 38 -1 57 -1 -1 -1 -1 -1 72 -1 -1 -1 27 -1 -1 -1 -1 -1 -1 -1 -1 -1 -1 -1 -1 -1 0 -1 0 -1 -1 -1 -1 -1 -1 -1 65 -1 -1 -1 -1 -1 -1 38 -1 57 -1 -1 -1 -1 -1 72 -1 -1 -1 27 -1 -1 -1 -1 -1 -1 -1 -1 -1 -1 -1 -1 -1 0 -1 0 -1 -1 -1 -1 -1 -1 -1 64 -1 -1 -1 -1 -1 -1 14 52 -1 -1 -1 -1 -1 30 -1 -1 -1 -1 -1 32 -1 -1 -1 -1 -1 -1 -1 -1 -1 -1 -1 0 -1 0 -1 -1 -1 -1 -1 64 -1 -1 -1 -1 -1 14 -1 52 -1 -1 -1 30 -1 -1 -1 -1 -1 32 -1 -1 -1 -1 -1 -1 -1 -1 -1 -1 0 -1 0 -1 -1 -1 -1 -1 -1 -1 45 -1 -1 70 0 -1 -1 -1 -1 -1 -1 77 -19 -1 -1 -1 -1 -1 -1 -1 -1 -1 -1 -1 -1 -1 -1 -1 -1 -1 -1 -1 -1 -1 0 -1 0 -1 -1 -1 -1 -1 45 -1 -1 -1 70 -1 0 -1 0 -1 -1 -1 77 -19 -1 -1 -1 -1 -1 -1 -1 -1 -1 -1 -1 -1 -1 -1 -1 -1 0 -1 0 -1 -1 -1 2 56 -1 -1 -1 57 35 -1 -1 -1 -1 -1 -1 -1 -1 -1 -1 -1 -1 12 -1 -1 -1 -1 -1 -1 -1 -1 -1 -1 -1 -1 -1 -1 -1 -1 0 -1 0 -1 2 -1 -1 56 -1 -1 57 -1 -1 35 -1 -1 -1 -1 -1 -1 -1 -1 -1 -1 12 -1 -1 -1 -1 -1 -1 -1 -1 -1 -1 -1 -1 -1 -1 -1 -1 -1 -1 0 -1 0 -1 24 -1 -1 -1 61 -1 -1 -1 60 -1 -1 -1 -1 -1 27 51 -1 -1 -1 -1 16 -1 1 -1 -1 -1 -1 -1 -1 -1 -1 -1 -1 -1 -1 -1 -1 -1 -1 -1 -1 -1 -1 0 -1 24 -1 -1 -1 61 -1 -1 -1 60 -1 -1 -1 -1 -1 27 -1 -1 51 -1 -1 -1 -1 16 -1 1 -1 -1 -1 -1 -1 -1 -1 -1 -1 -1 -1 -1 -1 -1 -1 -1 -1 -1 0].

In some implementations, the first exponent matrix may be determined by the following steps: (i) selecting, from values of the second exponent matrix, at least 1150 values as values of the first exponent matrix; and (ii) shifting one or two values of the first exponent matrix from one or more corresponding positive values of the second exponent matrix by -1 or +1; (iii) determining a resulting matrix of the shifting as the first exponent matrix. The one or more corresponding positive values of the second exponent matrix may not be selected as the at least 1150 values. The first exponent matrix (e.g., permutation matrix P) may be generated by perturbating one or two values from the second exponent matrix. For example, based on the second exponent matrix, the first matrix may be generated as [−1 56 −1
−1 −1 −1 −1 −1 −1 49 −1 −1 −1 1 1 −1 −1 50 −1 −1 −1 79
−1 −1 −1 1 1 −1 0 −1 −1 −1 −1 −1 −1 −1 −1 −1 −1 −1 −1
−1 −1 −1 −1 −1 −1 −1 −1 57 −1 −1 −1 −1 −1 −1 −1 50 −1
−1 −1 1 1 −1 −1 −1 −1 50 −1 −1 −1 79 −1 −1 −1 1 −1 0 −1
−1 −1 −1 −1 −1 −1 −1 −1 −1 −1 −1 −1 −1 −1 −1 3 −1 −1 −1
−1 28 −1 −1 0 −1 −1 −1 −1 −1 −1 −1 55 −1 −1 7 −1 −1 −1
−1 −1 −1 0 −1 0 −1 −1 −1 −1 −1 −1 −1 −1 −1 −1 −1 −1 −1
−1 −1 −1 −1 −1 −1 −1 3 −1 −1 28 −1 −1 −1 −1 0 −1 −1 −1
−1 −1 −1 −1 55 7 −1 −1 −1 −1 −1 −1 −1 −1 0 −1 0 −1 −1 −1
−1 −1 −1 −1 −1 −1 −1 −1 −1 −1 −1 −1 −1 −1 −1 −1 30 −1
−1 −1 −1 −1 −1 −1 −1 24 37 −1 −1 −1 −1 −1 56 −1 −1 14
−1 −1 −1 −1 −1 −1 −1 −1 0 −1 0 −1 −1 −1 −1 −1 −1 −1 −1
−1 −1 −1 −1 −1 −1 −1 −1 −1 30 −1 −1 −1 −1 −1 −1 −1 24
−1 −1 37 −1 −1 −1 −1 −1 56 14 −1 −1 −1 −1 −1 −1 −1 −1
−1 −1 0 −1 0 −1 −1 −1 −1 −1 −1 −1 −1 −1 −1 −1 −1 −1 −1
−1 −1 62 −1 53 −1 −1 −1 −1 −1 −1 53 −1 −1 −1 −1 3 −1 35
−1 −1 −1 −1 −1 −1 −1 −1 −1 −1 −1 −1 −1 0 −1 0 −1 −1 −1
−1 −1 −1 −1 −1 −1 −1 −1 −1 −1 −1 −1 −1 62 −1 53 −1 −1
−1 −1 53 −1 −1 −1 −1 −1 3 −1 35 −1 −1 −1 −1 −1 −1
−1 −1 −1 −1 −1 −1 0 −1 0 −1 −1 −1 −1 −1 −1 −1 −1 −1 −1
−1 −1 −1 −1 −1 14 0 −1 −1 −1 −1 20 −1 −1 66 −1 −1 −1 −1
−1 22 −1 28 −1 −1 −1 −1 −1 −1 −1 −1 −1 −1 −1 −1 −1 −1
0 −1 0 −1 −1 −1 −1 −1 −1 −1 −1 −1 −1 −1 −1 40 −1 −1
−1 −1 −1 −1 20 66 −1 −1 −1 −1 −1 22 −1 28 −1 −1 −1 −1
−1 −1 −1 −1 −1 −1 −1 −1 −1 −1 −1 −1 0 −1 0 −1 −1 −1 −1
−1 −1 −1 −1 −1 0 −1 −1 −1 −1 1 1 −1 −1 −18 −1 −1 42 −1 −1
−1 −1 50 −1 −1 −1 −1 −18 −1 −1 −1 −1 −1 −1 −1 −1 −1
0 −1 0 −1 −1 −1 −1 −1 −1 −1 −1 −1 −1 0 −1 −1 −1 −1 −1
−1 8 −1 −1 −1 −1 42 −1 −1 50 −1 −1 −1 −1 −18 −1 −1 −1
−1 −1 −1 −1 −1 −1 −1 −1 −1 0 −1 0 −1 −1 −1 −1 −1 −1 −1
−1 −1 −1 −1 69 79 −1 −1 79 −1 −1 −1 −1 −1 −1 56 −1 −1
−1 −1 52 −1 −1 −1 −1 −1 −1 0 −1 −1 −1 −1 −1 −1 −1 −1
−1 −1 0 −1 0 −1 −1 −1 −1 −1 −1 −1 −1 69 −1 −1 79 79
−1 −1 −1 −1 −1 −1 −1 −1 56 −1 −1 52 −1 −1 −1 −1 −1 −1
−1 −1 0 −1 −1 −1 −1 −1 −1 −1 −1 −1 −1 0 −1 0 −1 −1 −1
−1 −1 −1 −1 −1 −1 −1 65 −1 −1 −1 −1 −1 −1 −1 38 57 −1
−1 −1 −1 −1 −1 72 −1 −1 −1 27 −1 −1 −1 −1 −1 −1 −1 −1
−1 −1 −1 −1 −1 −1 −1 −1 0 −1 0 −1 −1 −1 −1 −1 −1 −1 65
−1 −1 −1 −1 −1 −1 −1 38 −1 −1 57 −1 −1 −1 −1 72 −1 −1
−1 27 −1 −1 −1 −1 −1 −1 −1 −1 −1 −1 −1 −1 −1 −1 −1 −1
−1 −1 0 −1 0 −1 −1 −1 −1 −1 −1 −1 −1 64 −1 −1 −1 −1 −1
14 −1 −1 52 −1 −1 −1 −1 −1 30 −1 −1 −1 −1 −1 32 −1 −1
−1 −1 −1 −1 −1 −1 −1 −1 −1 −1 −1 −1 −1 0 −1 0 −1 −1 −1
−1 −1 −1 64 −1 −1 −1 −1 −1 −1 −1 −1 14 52 −1 −1 −1 −1
−1 30 −1 −1 −1 −1 −1 32 −1 −1 −1 −1 −1 −1 −1 −1 −1 −1
−1 −1 −1 −1 −1 −1 −1 0 −1 0 −1 −1 −1 −1 −1 −1 45 −1
−1 −1 −1 70 −1 0 −1 −1 −1 −1 −1 −1 −1 77 9 −1 −1 −1 −1
−1 −1 −1 −1 −1 −1 −1 −1 −1 −1 −1 −1 −1 −1 −1 −1 −1 −1
−1 0 −1 0 −1 −1 −1 −1 −1 −1 45 −1 −1 70 −1 0 −1 −1 −1
−1 −1 −1 −1 77 −1 −1 9 −1 −1 −1 −1 −1 −1 −1 −1 −1 −1
−1 −1 −1 −1 −1 −1 −1 −1 −1 −1 −1 −1 0 −1 0 −1 −1 2 −1
56 −1 −1 −1 −1 57 35 −1 −1 −1 −1 −1 −1 −1 −1 −1 −1 −1
−1 12 −1 −1 −1 −1 −1 −1 −1 −1 −1 −1 −1 −1 −1 −1 −1 −1
−1 −1 −1 −1 −1 −1 0 −1 0 −1 −1 2 −1 56 −1 −1 57 −1 −1
35 −1 −1 −1 −1 −1 −1 −1 −1 −1 12 −1 −1 −1 −1 −1 −1
−1 −1 −1 −1 −1 −1 −1 −1 −1 −1 −1 −1 −1 −1 −1 0 −1 0
−1 24 −1 −1 −1 61 −1 −1 −1 60 −1 −1 −1 −1 27 −1 51 −1
−1 −1 −1 −1 16 −1 1 1 −1 −1 −1 −1 −1 −1 1 1 −1 −1 1 1 −1 −1 −1
−1 −1 −1 −1 0 −1 24 −1 −1 −1 61 −1 −1 −1 60 −1 −1 −1 −1
−1 −1 27 −1 51 −1 −1 −1 −1 −1 16 −1 1 1 −1 −1 −1 −1
−1 −1 −1 −1 −1 −1 −1 −1 −1 −1 −1 −1 −1 −1 −1 −1 −1 0] in which
the second value 56 and the tenth value 49 are shifted from
57 and 50, respectively. The one or more processors may be
configured to determine a resulting matrix of the shifting as
the first exponent matrix.

In some implementations, the second binary matrix may
include the following set of values: [1 1 1 1 1 1 0 1 0 1 1 1
0 0 1 1 1 1 1 1 1 1 1 1 1 1 1 1 1 1 1 1 1 1 0 1 1 1 1 0 0 1 1 1
1 1 1 1 1 1 0 1 1 1 1 0 1 1 0 1 1 1 1 1 0 0 1 1 1 1 1 1 1 1
0 0 1 1 1 1 1 1 1 1 1 1 1 1 0 0 1 1 1 1 1 1 1 1 1 1 0 1 1 1 0 0 1
1 0 0 1 1 1 1 1 1 1 0 0 1 1 1 1 1 1 1 0 1 1 1 0 1 0 1 1 1 1 0
1 1 1 1 1 0 0 1 1 1 1 1 0 0 0 1 1 1 1 1 0 1 1 1 0 1 1 1 1 0
0 0 1 1 1 1 1 0 1 1 1 0 0 1 1 0 1 0 1 1 1 1 1 1 1 1 1 0 0 1 1 1
1 1 1 1 0 1 1 1 1 1 1 1 1 1 1 1 1 1 0 0 1 1 1 1 1 1 0 1
1 1 0 0 1 1 1 1 1 1 1 1 1 1 1 1 0 0 1 1 0 1 1 0 1 1 1 1 1 0 1
1 1 1 1 1 1 1 1 1 1 0 0 1 1 1 1 1 1 1 1 0 1 1 0 0 1 1 1 1 1
1 1 1 1 1 0]. The second exponent matrix may include the
following set of values: [−1 57 −1 −1 −1 −1 −1 −1 −1 50 −1
−1 −1 1 1 −1 −1 50 −1 −1 −1 79 −1 −1 −1 1 1 −1 0 −1 −1 −1 −1
−1 −1 −1 −1 −1 −1 −1 −1 −1 −1 −1 −1 −1 −1 −1 −1 −1 −1
57 −1 −1 −1 −1 −1 −1 −1 50 −1 −1 −1 1 1 −1 −1 −1 −1 50
−1 −1 −1 79 −1 −1 −1 1 1 −1 0 −1 −1 −1 −1 −1.1 −1 1 1 −1 −1 −1 −1
−1 1 1 −1 −1 −1 −1 −1 −1 3 −1 −1 −1 −1 28 −1 −1 0 −1 −1 −1
−1 −1 −1 −1 55 −1 −1 7 −1 −1 −1 −1 −1 −1 0 −1 0 −1 −1 −1
−1 −1 −1 −1 −1 −1 −1 −1 −1 −1 −1 −1 −1 −1 −1 −1 −1 −1
3 −1 −1 28 −1 −1 −1 −1 0 −1 −1 −1 −1 −1 −1 −1 55 7 −1
−1 −1 −1 −1 −1 −1 −1 0 −1 0 −1 −1 −1 −1 −1 −1 −1 −1 −1
−1 −1 −1 −1 −1 −1 −1 −1 30 −1 −1 −1 −1 −1 −1 −1 −1 −1
24 37 −1 −1 −1 −1 −1 56 −1 −1 14 −1 −1 −1 −1 −1 −1 −1 −1
−1 0 −1 0 −1 −1 −1 −1 −1 −1 −1 −1 −1 −1 −1 −1 −1 −1 −1
−1 −1 −1 30 −1 −1 −1 −1 −1 24 −1 −1 37 −1 −1 −1 −1 −1
−1 56 14 −1 −1 −1 −1 −1 −1 −1 −1 −1 −1 −1 0 −1 0 −1 −1
−1 −1 −1 −1 −1 −1 −1 −1 −1 −1 −1 −1 62 −1 53 −1 −1
−1 −1 −1 53 −1 −1 −1 −1 3 −1 35 −1 −1 −1 −1 −1 −1 −1
−1 −1 −1 −1 −1 0 −1 0 −1 −1 −1 −1 −1 −1 −1 −1 −1 −1
−1 −1 −1 −1 −1 −1 62 −1 53 −1 −1 −1 −1 53 −1 −1 −1 −1
−1 −1 3 −1 35 −1 −1 −1 −1 −1 −1 −1 −1 −1 −1 −1 −1 0
−1 0 −1 −1 −1 −1 −1 −1 −1 −1 −1 −1 −1 −1 −1 −1 40 −1
−1 −1 −1 20 −1 −1 66 −1 −1 −1 −1 −1 22 −1 28 −1 −1 −1
−1 −1 −1 −1 −1 −1 −1 −1 −1 −1 0 −1 0 −1 −1 −1 −1 −1
−1 −1 −1 −1 −1 −1 −1 40 −1 −1 −1 −1 −1 20 66 −1
−1 −1 −1 22 −1 28 −1 −1 −1 −1 −1 −1 −1 −1 −1 −1 −1
−1 −1 −1 −1 0 −1 0 −1 −1 −1 −1 −1 −1 −1 −1 −1 −1
−1 0 −1 −1 −1 −1 −1 −1 −1 −18 −1 −1 42 −1 −1 −1 −1 50
−1 −1 −1 −1 −18 −1 −1 −1 −1 −1 −1 −1 −1 −1 0 −1 0
−1 −1 −1 −1 −1 −1 −1 −1 −1 −1 −1 0 −1 −1 −1 −1 −1 −18
−1 −1 −1 42 −1 −1 50 −1 −1 −1 −1 −18 −1 −1 −1 −1 −1
−1 −1 −1 −1 −1 0 −1 −1 −1 −1 −1 −1 −1 −1 −1 −1 −1 −1
−1 69 79 −1 −1 79 −1 −1 −1 −1 −1 56 −1 −1 −1 −1 52
−1 −1 −1 −1 −1 −1 0 −1 −1 −1 −1 −1 −1 −1 −1 −1 −1 −1 0
−1 0 −1 −1 −1 −1 −1 −1 −1 −1 69 −1 −1 79 79 −1 −1 −1
−1 −1 −1 −1 −1 56 −1 −1 52 −1 −1 −1 −1 −1 −1 −1 0 −1
−1 −1 −1 −1 −1 −1 −1 −1 −1 0 −1 0 −1 −1 −1 −1 −1 −1
−1 −1 65 −1 −1 −1 −1 −1 −1 38 57 −1 −1 −1 −1 −1
−1 72 −1 −1 −1 27 −1 −1 −1 −1 −1 −1 −1 −1 −1 −1 −1
−1 −1 0 −1 0 −1 −1 −1 −1 −1 −1 65 −1 −1 −1 −1 −1
−1 38 −1 −1 57 −1 −1 −1 72 −1 −1 −1 27 −1 −1 −1
−1 −1 −1 −1 −1 −1 −1 −1 −1 −1 −1 −1 −1 0 −1 0 −1 −1
−1 −1 −1 −1 −1 64 −1 −1 −1 −1 −1 −1 14 −1 −1 52 −1 −1
−1 −1 −1 30 −1 −1 −1 −1 32 −1 −1 −1 −1 −1 −1 −1
−1 −1 −1 −1 −1 −1 −1 0 −1 0 −1 −1 −1 −1 −1 64 −1 −1
−1 −1 −1 −1 −1 −1 14 52 −1 −1 −1 −1 −1 30 −1 −1 −1
−1 32 −1 −1 −1 −1 −1 −1 −1 −1 −1 −1 −1 −1 −1 −1
−1 −1 0 −1 0 −1 −1 −1 −1 −1 −1 45 −1 −1 −1 −1 70 −1 0
−1 −1 −1 −1 −1 −1 −1 77 9 −1 −1 −1 −1 −1 −1 −1 −1 −1
−1 −1 −1 −1 −1 −1 −1 −1 −1 −1 −1 −1 −1 0 −1 0 −1 −1 −1
−1 −1 −1 45 −1 −1 70 −1 0 −1 −1 −1 −1 −1 −1 −1 77 −1 −1
9 −1 −1 −1 −1 −1 −1 −1 −1 −1 −1 −1 −1 −1 −1 −1 −1 −1
−1 −1 −1 −1 −1 0 −1 0 −1 −1 2 −1 56 −1 −1 −1 57 35
−1 −1 −1 −1 −1 −1 −1 −1 −1 −1 −1 −1 12 −1 −1 −1 −1 −1 −1
−1 −1 −1 −1 −1 −1 −1 −1 −1 −1 −1 −1 −1 −1 −1 0 −1
0 −1 −1 2 −1 56 −1 −1 57 −1 −1 35 −1 −1 −1 −1 −1 −1 −1

−1 −1 −1 12 −1 −1 −1 −1 −1 −1 −1 −1 −1 −1 −1 −1 −1 −1
−1 −1 −1 −1 −1 −1 −1 −1 −1 −1 0 −1 0 −1 0 −1 24 −1 −1 −1 61
−1 −1 −1 60 −1 −1 −1 −1 −1 27 −1 51 −1 −1 −1 −1 −1 16 −1
1 −1 −1 −1 −1 −1 −1 −1 −1 −1 −1 −1 −1 −1 −1 −1 −1 −1
−1 −1 0 −1 24 −1 −1 −1 61 −1 −1 −1 60 −1 −1 −1 −1 −1 −1
27 −1 51 −1 −1 −1 −1 −1 16 −1 1 −1 −1 −1 −1 −1 −1 −1 −1
−1 −1 −1 −1 −1 −1 −1 −1 −1 −1 −1 0].

In some implementations, the second binary matrix may include the following set of values: [1 1 1 1 1 1 0 1 0 1 1 1 0 0 1 1 1 1 1 1 1 1 1 1 1 1 1 1 1 1 1 0 1 1 1 1 0 0 1 1 1 1 1 1 1 1 1 0 1 1 1 1 0 1 1 0 1 1 1 1 0 0 1 1 1 1 1 1 1 0 1 1 1 1 0 1 1 1 1 1 1 1 1 1 0 0 1 1 1 1 1 1 1 1 1 0 0 1 1 1 1 1 1 1 1 1 1 1 1 0 0 1 1 1 1 1 1 1 1 1 1 0 0 1 1 1 1 1 0 1 1 1 0 1 0 1 1 1 1 0 1 1 1 1 1 1 1 1 1 1 0 0 1 1 1 1 1 0 1 1 1 0 0 0 1 1 1 1 0 1 1 1 0 1 1 1 1 0 0 1 1 1 1 0 1 1 1 0 0 1 1 0 1 0 1 1 1 1 1 1 1 0 0 1 1 1 1 1 1 1 0 0 1 1 1 1 1 1 1 1 1 1 1 0 0 1 1 1 1 1 1 0 1 1 1 1 1 1 1 1 1 1 1 0 0 1 1 1 0 0 1 1 0 1 1 1 1 1 0 1 1 1 1 1 1 1 1 0 0 1 1 1 1 1 1 1 1 0 1 1 0 0 1 1 1 1 1 1 1 1 0 1 1 0 0 1 1 1 1 1 1 1 0]. The second exponent matrix may include the following set of values: [−1 57 −1 −1 −1 −1 −1 −1 −1 50 −1 −1 1 1 −1 −1 −1 50 −1 −1 −1 −1 79 −1 −1 1 1 −1 0 −1 −1 −1 −1 −1 −1 −1 −1 −1 −1 −1 −1 −1 −1 −1 −1 −1 −1 57 −1 −1 −1 −1 −1 −1 −1 50 −1 −1 −1 −1 1 1 −1 −1 −1 50 −1 −1 79 −1 −1 −1 −1 1 1 −1 0 −1 −1 −1 −1 −1 −1 −1 −1 −1 −1 −1 −1 −1 −1 −1 −1 −1 −1 −1 3 −1 −1 −1 28 −1 −1 −1 0 −1 −1 −1 −1 −1 55 −1 −1 7 −1 −1 −1 −1 −1 −1 0 −1 0 −1 −1 −1 −1 −1 −1 −1 −1 −1 −1 −1 −1 −1 −1 −1 −1 −1 −1 −1 3 −1 −1 −1 28 −1 −1 −1 0 −1 −1 −1 −1 −1 −1 −1 55 7 −1 −1 −1 −1 −1 −1 −1 −1 0 −1 0 −1 −1 −1 −1 −1 −1 −1 −1 −1 −1 −1 −1 −1 −1 −1 −1 −1 30 −1 −1 −1 −1 −1 −1 −1 −1 24 37 −1 −1 −1 −1 −1 56 −1 −1 14 −1 −1 −1 −1 −1 −1 −1 −1 0 −1 0 −1 −1 −1 −1 −1 −1 −1 −1 −1 −1 −1 −1 −1 −1 −1 −1 −1 30 −1 −1 −1 −1 −1 −1 24 −1 −1 37 −1 −1 −1 −1 56 14 −1 −1 −1 −1 −1 −1 −1 −1 −1 −1 0 −1 0 −1 −1 −1 −1 −1 −1 −1 −1 −1 −1 −1 −1 −1 −1 −1 62 −1 53 −1 −1 −1 −1 −1 53 −1 −1 −1 −1 −1 3 −1 35 −1 −1 −1 −1 −1 −1 −1 −1 −1 −1 −1 −1 −1 0 −1 0 −1 −1 −1 −1 −1 −1 −1 −1 −1 −1 −1 −1 −1 −1 −1 62 −1 53 −1 −1 −1 −1 53 −1 −1 −1 −1 −13 −1 35 −1 −1 −1 −1 −1 −1 −1 −1 −1 −1 −1 −1 0 −1 0 −1 −1 −1 −1 −1 −1 −1 −1 −1 −1 40 −1 −1 −1 −1 20 −1 66 −1 −1 −1 −1 −1 22 −1 28 −1 −1 −1 −1 −1 −1 −1 −1 −1 −1 −1 −1 −1 −1 0 −1 0 −1 −1 −1 −1 −1 −1 −1 −1 −1 −1 −1 40 −1 −1 −1 −1 −1 20 −1 66 −1 −1 −1 −1 22 −1 28 −1 −1 −1 −1 −1 −1 −1 −1 −1 −1 −1 −1 −1 0 −1 0 −1 −1 −1 −1 −1 −1 −1 −1 −1 0 −1 0 −1 −1 −1 −1 −1 −1 −18 −1 −1 −1 42 −1 −1 −1 −1 50 −1 −1 −1 −1 8 −1 −1 −1 −1 −1 −1 −1 −1 −1 −1 0 −1 0 −1 −1 −1 −1 −1 −1 −1 −1 −1 −1 0 −1 −1 −1 −1 −1 −1 −18 −1 −1 −1 42 −1 −1 50 −1 −1 −1 −1 −18 −1 −1 −1 −1 −1 −1 −1 −1 −1 −1 0 −1 0 −1 −1 −1 −1 −1 −1 −1 −1 69 −1 79 −1 79 −1 −1 −1 −1 −1 −1 −1 −1 56 −1 −1 52 −1 −1 −1 −1 −1 −1 −1 0 −1 −1 −1 −1 −1 −1 −1 −1 −1 0 −1 0 −1 −1 −1 −1 −1 −1 −1 −1 −1 69 −1 79 −1 79 −1 −1 −1 −1 −1 56 −1 −1 −1 −1 −1 52 −1 −1 −1 −1 −1 0 −1 −1 −1 −1 −1 −1 −1 −1 −1 0 −1 0 −1 −1 −1 −1 −1 65 −1 −1 −1 −1 −1 −1 38 −1 57 −1 −1 −1 −1 72 −1 −1 −1 27 −1 −1 −1 −1 −1 −1 −1 −1 0 −1 0 −1 −1 −1 −1 −1 −1 65 −1 −1 −1 −1 38 −1 57 −1 −1 −1 −1 72 −1 −1 −1 27 −1 −1 −1 −1 −1 −1 −1 −1 −1 −1 0 −1 0 −1 −1 −1 −1 −1 64 0 −1 −1 −1 −1 −1 −1 64 −1 −1 −1 −1 −1 14 −1 52 −1 −1 −1 −1 −1 30 −1 −1 −1 −1 32 −1 −1 −1 −1 −1 −1 −1 −1 −1 −1 −1 −1 0 −1 0 −1 −1 −1 −1 64 −1 −1 −1 −1 −1 −1 −1 14 −1 52 −1 −1 −1 −1 −1 30 −1 −1 −1 −1 32 −1 −1 −1 −1 −1 −1 −1 −1 −1 −1 −1 −1 0 −1 0 −1 −1 −1 −1 −1 45 −1 −1 −1 70 0 −1 −1 −1 −1 −1 −1 −1 77 −19 −1 −1 −1 −1 −1 −1 −1 −1

−1 −1 −1 −1 −1 −1 −1 −1 −1 −1 −1 −1 −1 −1 0 −1 0 −1
−1 −1 −1 −1 45 −1 −1 −1 70 −1 −1 0 −1 −1 −1 −1 −1 −1 −1
77 −1 9 −1 −1 −1 −1 −1 −1 −1 −1 −1 −1 −1 −1 −1 −1 −1 −1
−1 −1 −1 −1 −1 −1 −1 0 −1 0 −1 −1 2 −1 56 −1 −1 −1 −1
57 35 −1 −1 −1 −1 −1 −1 −1 −1 −1 −1 −1 12 −1 −1 −1 −1
−1 −1 −1 −1 −1 −1 −1 −1 −1 −1 −1 −1 −1 −1 −1 −1 −1 −1
−1 0 −1 0 −1 −1 2 −1 56 −1 −1 57 −1 −1 35 −1 −1 −1 −1
−1 −1 −1 −1 −1 −1 −1 12 −1 −1 −1 −1 −1 −1 −1 −1 −1
−1 −1 −1 −1 −1 −1 −1 −1 −1 −1 −1 −1 0 −1 0 −1 24 −1
−1 −1 61 −1 −1 −1 60 −1 −1 −1 −1 −1 27 51 −1 −1 −1 −1
−1 16 −1 1 −1 −1 −1 −1 −1 −1 −1 −1 −1 −1 −1 −1 −1 −1
−1 −1 −1 −1 −1 −1 0 −1 24 −1 −1 −1 61 −1 −1 −1 60 −1 −1
−1 −1 −1 27 −1 −1 51 −1 −1 −1 −1 −1 16 −1 1 −1 −1 −1 −1
−1 −1 −1 −1 −1 −1 −1 −1 −1 −1 −1 −1 −1 −1 −1 0].

In some implementations, the first binary matrix may be determined by the following steps: (i) permuting (1) two or more rows of the second binary matrix or (2) two or more columns of the second binary matrix; and (ii) determining a resulting binary matrix of the permuting as the first binary matrix. For example, the first binary matrix may correspond to a binary matrix in which a first row and a second row of the second binary matrix are permuted. The first binary matrix may be determined such that the first binary matrix maintains to have full rank.

At step 1304, the first device may encode data using the second parity check matrix. At step 1306, the first device may transmit the encoded data to another apparatus (e.g., communication system 108).

At step 1308, the second device (e.g., decoder 160 or processor 2010 of communication system 108) may identify (e.g., from a codebook) the second binary parity check matrix (e.g., new parity check matrix H). At step 1310, the second device may receive, from the first device (e.g., communication system 105), the encoded data. At step 1312, the second device may decode the encoded data using the second binary parity check matrix.

In some implementations, the second device may identify (e.g., from a codebook) a third binary parity check matrix in which one or more rows or one or more columns of the second binary parity check matrix are permuted, the third binary parity check matrix having the same dimensions as dimensions of the first binary parity check matrix. For example, the third binary parity check matrix may correspond to a binary parity check matrix in which a first row and a second row of the second binary parity check matrix are permuted. the second device may decode the received encoded data using the third binary parity check matrix.

In some implementations, the second device may be configured to identify a fourth binary parity check matrix corresponding to a third exponent matrix in which one or more rows or one or more columns of the first exponent matrix are permuted. For example, the third exponent matrix may correspond to an exponent matrix in which a first row and a second row of the first exponent matrix are permuted. The third exponent matrix may have the same dimensions as dimensions of the first exponent matrix. The second device may decode the received encoded data using the fourth binary parity check matrix.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., STAs, APs, beamformers and/or beamformees) that can operate within a system or environment. It should be understood that the systems described above can provide multiple ones of any or each of those components and these components can be provided on either a standalone machine or, in some embodiments, on multiple machines in a distributed system. Further still, bit field positions can be changed and multibit words can be used. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A method, comprising:

identifying, by baseband circuitry of a first device, a first parity check matrix of a first quasi-cyclic-low-density parity-check (QC-LDPC) code according to a code rate of 1/2; determining, by the baseband circuitry, based on a result of a Khatri-Rao product of the first parity check matrix and a first binary matrix having the same dimensions as dimensions of an exponent matrix of the first parity check matrix, a second parity check matrix corresponding to a first exponent matrix comprising 1152 values for a second QC-LDPC code, wherein the second QC-LDPC code has a code block size that is twice a code block size of the first QC-LDPC code;

encoding, by an encoder of the baseband circuitry of the first device, data using the second parity check matrix; and transmitting, by a transmitter of the first device, the encoded data over a wireless channel to increase a gain in a signal-to-noise (SNR) of the wireless channel compared with encoding data using the first QC-LDPC code.

2. The method of claim 1, further comprising:

determining the first binary matrix by:

determining a second binary matrix having the same dimensions as dimensions of the first binary matrix; and determining the first binary matrix comprising at least (1) one or more rows of a second binary matrix or (2) one or more columns of the second binary matrix, and determining the second parity check matrix by:

determining, based on the result of the Khatri-Rao product, a second exponent matrix having the same dimensions as dimensions of the first exponent matrix, determining, based on the second exponent matrix, the first exponent matrix; and determining, based on the first exponent matrix, the second parity check matrix.

3. The method of claim 2, wherein the second binary matrix comprises the following set of values: [1 1 1 1 1 1 1 1 0 1 0 1 0 0 1 1 1 1 1 1 1 1 1 0 1 1 1 0 1 1 1 0 1 1 1 1 0 0 1 1 1 1 1 1 1 1 0 1 1 1 1 0 1 1 0 1 1 1 1 1 0 0 1 1 1 1 1 1 1 1 0 0 1 1 1 1 1 0 0 1 1 1 1 1 1 1 1 1 1 0 1 1 1 1 1 1 1 1 1 0 0 1 1 1 1 1 1 0 1 1 1 1 1 0 1 1 1 1 1 0 1 1 1 1 1 1 0 0 1 1 1 1 1 1 0 1 1 1 1 0 1 1 1 1 0 1 1 1 1 1 0 1 1 1 1 1 0 0 1 1 1 1 1 1 1 1 1 0 1 1 1 1 1 1 1 1 1 1 1 1 1 1 0 0 1 1 1 1 1 1 1 0 1 1 1 1 1 1 1 1 1 1 1 1 1 1 0 0 1 1 1 1 1 1 1 1 0 1 1 1 1 1 1 1 1 1 1 1 0 0 1 0 1 1 1 0 1 1 1 1 1 1 1 1 1 1 1 1 1 0 0 1 1 0 0 1 1 0 1 1 1 1 1 1 1 1 1 1 1 1 1 0 0 1 1 1 1 1 1 0], and the second exponent matrix comprises the following set of values: [−1 57 −1 −1 −1 −1 −1 −1 −1 50 −1 −1 −1 11 −1 −1 50 −1 −1 −1 79 −1 −1 −1 1 −1 0 −1 −1 −1 −1 −1 −1 −1 −1 −1 −1 −1 −1 −1 −1 −1 −1 −1 −1 −1 −1 57 −1 −1 −1 −1 −1 −1 −1 50 −1 −1 −1 11 −1 −1 −1 −1 50 −1 −1 −1 79 −1 −1 −1 1 −1 0 −1 −1 −1 −1 −1 −1 −1 −1 −1 −1 −1 −1 −1 −1 −1 −1 −1 −13 −1 −1 −1 −1 28 −1 −1 0 −1 −1 −1 −1 −1 −1 −1 55 −1 −17 −1 −1 −1 −1 −1 −1 0 −1 0 −1 −1 −1 −1 −1 −1 −1 −1 −1 −1 −1 −1 −1 −1 −1 −1 −1 −1 −13 −1 −128 −1 −1 −1 0 −1 −1 −1 −1 −1 −1 −1557 −1 −1 −1 −1 −1 −1 −1 0 −1 0 −1 −1 −1 −1 −1 −1 −1 −1 −1 −1 −1 −1 −1 −1 −1 −1 30 −1 −1 −1 −1 −1 −1 −1 24 37 −1 −1 −1 −1 −1 −1 56 −1 −1 14 −1 −1 −1 −1 −1 −1 −1 0 −1 0 −1 −1 −1 −1 −1 −1 −1 −1 −1 −1 −1 −1 −1 −1 −1 −1 −1 −1 −1 30 −1 −1 −1 −1 −1 −1 24 −1 −1 37 −1 −1 −1 −1 −1 56 14 −1 −1 −1 −1 −1 −1 −1 −1 −1 −1 0 −1 0 −1 −1 −1 −1 −1 −1 −1 −1 −1 −1 −1 −1 −1 −1 −1 −1 62 −1 53 −1 −1 −1 −1 −1 −1 −153 −1 −1 −1 −13 −135 −1 −1 −1 −1 −1 −1 −1 −1 −1 −1 −1 −1 0 −1 0 −1 −1 −1 −1 −1 −1 −1 −1 −1 −1 −1 −1 −1 −1 −1 62 −1 53 −1 −1 −1 −1 53 −1 −1 −1 −1 −1 −1 3 −1 35 −1 −1 −1 −1 −1 −1 −1 −1 −1 −1 −1 −1 0 −1 0 −1 −1 −1 −1 −1 −1 −1 −1 −1 −1 −1 −1 −1 40 −1 −1 −1 −1 20 −1 −1 66 −1 −1 −1 −1 −1 22 −1 28 −1 −1 −1 −1 −1 −1 −1 −1 −1 −1 −1 −1 0 −1 0 −1 −1 −1 −1 −1 −1 −1 −1 −1 −1 −1 40 −1 −1 −1 −1 −1 20 66 −1 −1 −1 −1 −1 22 −1 28 −1 −1 −1 −1 −1 −1 −1 −1 −1 −1 −1 −1 −1 0 −1 0 −1 −1 −1 −1 −1 −1 −1 −1 −1 −1 −1 0 −1 −1 −1 −1 −1 −1 −1 −18 −1 −1 42 −1 −1 −1 −1 50 −1 −1 −1 −1 −18 −1 −1 −1 −1 −1 −1 −1 −1 −1 −1 0 −1 0 −1 −1 −1 −1 −1 −1 −1 −1 −1 −1 −1 −1 0 −1 −1 −1 −1 −1 −18 −1 −1 −1 42 −1 −1 50 −1 −1 −1 −1 −18 −1 −1 −1 −1 −1 −1 −1 −1 −1 −1 −1 0 −1 0 −1 −1 −1 −1 −1 −1 −1 −1 −1 69 79 −1 −1 79 −1 −1 −1 −1 −1 −1 56 −1 −1 −1 −1 52 −1 −1 −1 −1 −1 −1 0 −1 −1 −1 −1 −1 −1 −1 −1 −1 0 −1 0 −1 −1 −1 −1 −1 −1 −1 −1 −1 69 −1 −1 79 79 −1 −1 −1 −1 −1 −1 −1 56 −1 −1 52 −1 −1 −1 −1 −1 −1 −1 0 −1 0 −1 −1 −1 −1 −1 −1 −1 −1 −1 −1 −1 −1 −1 0 −1 0 −1 −1 −1 −1 −1 −1 −1 −1 −1 −1 65 −1 −1 −1 −1 −1 −1 −1 38 57 −1 −1 −1

−1 −1 −1 72 −1 −1 −1 27 −1 −1 −1 −1 −1 −1 −1 −1 −1
−1 −1 −1 −1 −1 −1 −1 0 −1 0 −1 −1 −1 −1 −1 −1 −1
65 −1 −1 −1 −1 −1 −1 −1 38 −1 −1 57 −1 −1 −1 −1 72
−1 −1 −1 27 −1 −1 −1 −1 −1 −1 −1 −1 −1 −1 −1 −1 −1
−1 −1 −1 −1 −1 0 −1 0 −1 −1 −1 −1 −1 −1 −1 64 −1    5
−1 −1 −1 −1 −1 14 −1 −1 52 −1 −1 −1 −1 30 −1 −1
−1 −1 −1 32 −1 −1 −1 −1 −1 −1 −1 −1 −1 −1 −1 −1 −1
−1 −1 −1 0 −1 0 −1 −1 −1 −1 −1 64 −1 −1 −1 −1 −1
−1 −1 −1 14 52 −1 −1 −1 −1 −1 30 −1 −1 −1 −1 −1 32
−1 −1 −1 −1 −1 −1 −1 −1 −1 −1 −1 −1 −1 −1 −1 −1 −1    10
−1 0 −1 0 −1 −1 −1 −1 −1 −1 45 −1 −1 −1 −1 70 −1 0
−1 −1 −1 −1 −1 −1 −1 77 9 −1 −1 −1 −1 −1 −1 −1 −1
−1 −1 −1 −1 −1 −1 −1 −1 −1 −1 −1 −1 −1 −1 −1 0 −1
0 −1 −1 −1 −1 −1 −1 45 −1 −1 70 −1 0 −1 −1 −1 −1 −1
−1 −1 77 −1 −19 −1 −1 −1 −1 −1 −1 −1 −1 −1 −1 −1 −1    15
−1 −1 −1 −1 −1 −1 −1 −1 −1 −1 −1 −1 0 −1 0 −1 −1 2
−156 −1 −1 −1 −1 57 35 −1 −1 −1 −1 −1 −1 −1 −1 −1
−1 −1 −1 12 −1 −1 −1 −1 −1 −1 −1 −1 −1 −1 −1 −1 −1
−1 −1 −1 −1 −1 −1 −1 −1 −1 0 −1 0 −1, −1 2 −1 56 −1
−1 57 −1 −1 35 −1 −1 −1 −1 −1 −1 −1 −1 −1 −1 12 −1    20
−1 −1 −1 −1 −1 −1 −1 −1 −1 −1 −1 −1 −1 −1 −1 −1 −1
−1 −1 −1 −1 −1 −1 0 −1 0 −124 −1 −1 −1 61 −1 −1 −1
60 −1 −1 −1 −1 27 −1 51 −1 −1 −1 −1 −1 16 −1 1 −1
−1 −1 −1 −1 −1 −1 −1 −1 −1 −1 −1 −1 −1 −1 −1 −1 −1
−1 −1 −1 0 −1 24 −1 −1 −1 61 −1 −1 −1 60 −1 −1 −1    25
−1 −1 −1 27 −1 51 −1 −1 −1 −1 −1 16 −1 1 −1 −1 −1
−1 −1 −1 −1 −1 −1 −1 −1 −1 −1 −1 −1 −1 −1 −1 −1 −1
−1 0].

4. The method of claim 2, wherein
the second binary matrix comprises the following set of values: [1 1 1 1 1 1 0 1 0 1 1 1 0 0 1 1 1 1 1 1 1 1
    1 1 1 1 1 1 1 1 1 0 1 1 1 1 0 0 1 1 1 1 1 1 1 1 0 1
    1 1 1 0 1 1 0 1 1 1 1 1 0 0 1 1 1 1 1 1 1 1 0 0 1 1 1
    1 1 1 1 1 1 1 1 1 0 0 1 1 1 1 1 1 1 1 1 0 0 1 1 0
    0 1 1 1 1 1 1 1 0 0 1 1 1 1 1 0 1 1 1 0 1 0 1 1 1 1    35
    0 1 1 1 1 1 0 0 1 1 1 1 1 0 0 0 1 1 1 1 0 1 1 1 0 1
    1 1 1 1 0 0 1 1 1 1 0 1 1 1 0 0 1 1 0 1 0 1 1 1 1 1 1
    1 1 0 0 1 1 1 1 1 1 1 1 0 1 1 1 1 1 1 1 1 1 1 1 1 1 1
    0 0 1 1 1 1 1 1 0 1 1 1 0 0 1 1 1 1 1 1 1 1 1 1 0 0
    1 1 0 1 1 0 1 1 1 1 1 0 1 1 1 1 1 1 1 1 1 1 1 0 0 1 1    40
    1 1 1 1 1 1 0 1 1 0 0 1 1 1 1 1 1 1 1 1 1 0], and
the second exponent matrix comprises the following set of
    values: [−1 57 −1 −1 −1 −1 −1 −1 −1 50 −1 −1 11 −1
    −1 −1 50 −1 −1 −1 −1 79 −1 −1 1 1 −1 0 −1 −1 −1 −1 −1
    −1 −1 −1 −1 −1 −1 −1 −1 −1 −1 −1 −1 −1 −1 −1 −1 57    45
    −1 −1 −1 −1 −1 −1 −1 50 −1 −1 −1 −1 11 −1 −1 −1 50
    −1 −1 79 −1 −1 −1 −1 1 −1 0 −1 −1 −1 −1 −1 −1 −1
    −1 −1 −1 −1 −1 −1 −1 −1 −1 −1 −1 −1 −1 −13 −1 −1 −1
    −1 28 −1 −1 −1 0 −1 −1 −1 −1 −1 55 −1 −1 7 −1 −1 −1
    −1 −1 −1 −1 0 −1 0 −1 −1 −1 −1 −1 −1 −1 −1 −1 −1 −1    50
    −1 −1 −1 −1 −1 −1 −1 −1 −13 −1 −1 −1 28 −1 −1 −1
    0 −1 −1 −1 −1 −1 −1 −1 −1 55 7 −1 −1 −1 −1 −1 −1
    −1 −1 0 −1 0 −1 −1 −1 −1 −1 −1 −1 −1 −1 −1 −1 −1
    −1 −1 −1 −1 −1 −1 30 −1 −1 −1 −1 −1 −1 −1 24 37
    −1 −1 −1 −1 −1 56 −1 −1 14 −1 −1 −1 −1 −1 −1 −1 −1    55
    0 −1 0 −1 −1 −1 −1 −1 −1 −1 −1 −1 −1 −1 −1 −1 −1
    −1 −1 −1 −1 30 −1 −1 −1 −1 −1 −1 24 −1 −1 1 37 −1 −1
    −1 −1 −1 56 14 −1 −1 −1 −1 −1 −1 −1 −1 −1 −1 0 −1
    0 −1 −1 −1 −1 −1 −1 −1 −1 −1 −1 −1 −1 −1 −1 −1 −1
    62 −1 53 −1 −1 −1 −1 −1 −1 53 −1 −1 −1 −1 −13 −1    60
    35 −1 −1 −1 −1 −1 −1 −1 −1 −1 −1 −1 −1 0 −1 0 −1
    −1 −1 −1 −1 −1 −1 −1 −1 −1 −1 −1 −1 −1 −1 −1 62 −1
    53 −1 −1 −1 −1 53 −1 −1 −1 −1 −1 3 −1 35 −1 −1 −1
    −1 −1 −1 −1 −1 −1 −1 −1 −1 −1 −1 0 −1 0 −1 −1 −1 −1
    −1 −1 −1 −1 −1 −1 −1 −1 −1 −1 −1 −1 40 −1 −1 −1 −1 −1    65
    20 −1 66 −1 −1 −1 −1 −1 22 −1 28 −1 −1 −1 −1 −1 −1
    −1 −1 −1 −1 −1 −1 −1 −1 −1 0 −1 0 −1 −1 −1 −1 −1 −1

−1 −1 −1 −1 −1 −1 −1 −1 40 −1 −1 −1 −1 −1 −1 20 −1
66 −1 −1 −1 −1 −1 22 −1 28 −1 −1 −1 −1 −1 −1 −1 −1
−1 −1 −1 −1 −1 −1 −1 0 −1 0 −1 −1 −1 −1 −1 −1 −1
−1 −1 −1 −1 −1 0 −1 −1 −1 −1 −1 −1 −18 −1 −1 −1 42
−1 −1 −1 −1 50 −1 −1 −1 −18 −1 −1 −1 −1 −1 −1 −1 −1
−1 −1 −1 −1 0 −1 0 −1 −1 −1 −1 −1 −1 −1 −1 −1 −1
−1 −1 0 −1 −1 −1 −1 −1 −1 −18 −1 −1 −1 42 −1 −1 50
−1 −1 −1 −1 −1 −18 −1 −1 −1 −1 −1 −1 −1 −1 −1 −1
−1 0 −1 0 −1 −1 −1 −1 −1 −1 −1 −1 −1 −1 69 −1 79 −1
79 −1 −1 −1 −1 −1 −1 −1 −1 56 −1 −1 52 −1 −1 −1 −1
−1 −1 −1 0 −1 −1 −1 −1 −1 −1 −1 −1 −1 −1 −1 −1 0 −1
0 −1 −1 −1 −1 −1 −1 −1 −1 −1 −1 69 −1 79 −1 79 −1
−1 −1 −1 −1 −1 56 −1 −1 −1 −1 52 −1 −1 −1 −1 −1
−1 0 −1 −1 −1 −1 −1 −1 −1 −1 −1 −1 −1 0 −1 0 −1 −1
−1 −1 −1 −1 −1 −1 65 −1 −1 −1 −1 −1 −1 38 −1 57
−1 −1 −1 −1 −1 72 −1 −1 −1 27 −1 −1 −1 −1 −1 −1 −1
−1 −1 −1 −1 −1 −1 −1 −1 −1 −1 0 −1 0 −1 −1 −1 −1
−1 −1 −1 −1 65 −1 −1 −1 −1 −1 −1 38 −157 −1 −1
−1 −1 −1 72 −1 −1 −1 27 −1 −1 −1 −1 −1 −1 −1 −1 −1
−1 −1 −1 −1 −1 −1 −1 −1 0 −1 0 −1 −1 −1 −1 −1 −1
−1 64 −1 −1 −1 −1 −1 −1 −1 14 52 −1 −1 −1 −1 −1 −1
30 −1 −1 −1 −1 −1 32 −1 −1 −1 −1 −1 −1 −1 −1 −1 −1
−1 −1 −1 −1 −1 −1 0 −1 0 −1 −1 −1 −1 −1 64 −1 −1
−1 −1 −1 −1 14 −1 −1 −1 52 −1 −1 −1 −1 30 −1 −1 −1
−1 −1 32 −1 −1 −1 −1 −1 −1 −1 −1 −1 −1 −1 −1 −1 −1
−1 −1 −1 −1 0 −1 0 −1 −1 −1 −1 −1 −1 −1 45 −1 −1
−1 70 0 −1 −1 −1 −1 −1 −1 77 −1 9 −1 −1 −1 −1 −1
−1 −1 −1 −1 −1 −1 −1 −1 −1 −1 −1 −1 −1 −1 −1 −1 −1
−1 0 −1 0 −1 −1 −1 −1 −1 45 −1 −1 −1 70 −1 −1 0 −1
−1 −1 −1 −1 −1 −1 77 −19 −1 −1 −1 −1 −1 −1 −1 −1
−1 −1 −1 −1 −1 −1 −1 −1 −1 −1 −1 −1 −1 −1 −1 0 −1
0 −1 −1 −12 56 −1 −1 −1 −1 57 35 −1 −1 −1 −1 −1 −1
−1 −1 −1 −1 −1 12 −1 −1 −1 −1 −1 −1 −1 −1 −1 −1 −1
−1 −1 −1 −1 −1 −1 −1 −1 −1 −1 −1 −1 0 −1 0 −1 2 −1
−1 56 −1 −1 57 −1 −1 35 −1 −1 −1 −1 −1 −1 −1 −1 −1
−1 −1 12 −1 −1 −1 −1 −1 −1 −1 −1 −1 −1 −1 −1 −1 −1
−1 −1 −1 −1 −1 −1 −1 −1 −1 0 −1 0 −1 24 −1 −1 −1
61 −1 −1 −1 60 −1 −1 −1 −1 −1 27 51 −1 −1 −1 −1 −1
16 −1 1 −1 −1 −1 −1 −1 −1 −1 −1 −1 −1 −1 −1 −1 −1
−1 −1 −1 −1 −1 −1 −1 0 −1 24 −1 −1 −1 61 −1 −1 −1
60 −1 −1 −1 −1 27 −1 −1 51 −1 −1 −1 −1 16 −1
1 −1 −1 −1 −1 −1 −1 −1 −1 −1 −1 −1 −1 −1 −1 −1
−1 −1 −1 −1 −1 0 −1].

5. The method of claim 2, wherein
the second binary matrix comprises the following set of
    values: [1 1 1 1 1 1 0 1 0 1 1 1 0 0 1 1 1 1 1 1 1 1 1
    1 1 1 1 1 0 1 1 1 1 0 0 1 1 1 1 1 1 1 1 1 0 1 1 1 1
    0 1 1 0 1 1 1 1 1 0 0 1 1 1 1 1 1 1 1 0 1 1 1 1 0 1 1
    1 1 1 1 1 1 0 0 1 1 1 1 1 1 1 1 1 1 0 0 1 1 1 1 1 1
    1 1 1 1 1 0 0 1 1 1 1 1 0 1 1 1 0 1 0 1 1 1 1 0 1 1
    1 1 1 0 0 1 1 1 1 1 0 0 0 1 1 1 1 0 1 1 1 0 1 1 1 1
    1 0 0 1 1 1 1 0 1 1 1 0 0 1 1 0 1 0 1 1 1 1 1 1 1 0
    0 1 1 1 1 1 0 0 1 1 1 1 1 1 1 1 1 1 1 1 1 1 1 1 0 0 1
    1 1 1 1 0 1 1 1 1 1 1 1 1 1 1 1 1 0 0 1 1 1 0 0
    1 1 0 1 1 1 1 1 0 1 1 1 1 1 1 1 1 1 1 1 0 0 1 1 1 1 1
    1 1 1 0 1 1 0 0 1 1 1 1 1 1 1 1 1 1 0], and
the second exponent matrix comprises the following set of
    values: [−1 57 −1 −1 −1 −1 −1 −1 −1 50 −1 −1 11 −1
    −1 −1 50 −1 −1 −1 −1 79 −1 −1 1 1 −1 0 −1 −1 −1 −1 −1
    −1 −1 −1 −1 −1 −1 −1 −1 −1 −1 −1 −1 −1 −1 −1 −1 57
    −1 −1 −1 −1 −1 −1 −1 50 −1 −1 −1 −1 11 −1 −1 −1 50
    −1 −1 79 −1 −1 −1 −1 1 1 −1 0 −1 −1 −1 −1 −1 −1 −1
    −1 −1 −1 −1 −1 −1 −1 −1 −1 −1 −1 −1 −1 −13 −1 −1 −1
    −1 28 −1 −1 −1 0 −1 −1 −1 −1 −1 55 −1 −1 7 −1 −1 −1
    −1 −1 −1 −1 0 −1 0 −1 −1 −1 −1 −1 −1 −1 −1 −1 −1 −1
    −1 −1 −1 −1 −1 −1 −1 −1 −13 −1 −1 −1 28 −1 −1 −1
    0 −1 −1 −1 −1 −1 −1 −1 −1 55 7 −1 −1 −1 −1 −1 −1

–1 –1 0 –1 0 –1 –1 –1 –1 –1 –1 –1 –1 –1 –1 –1
–1 –1 –1 –1 –1 –1 30 –1 –1 –1 –1 –1 –1 –1 –1 24 37
–1 –1 –1 –1 –1 56 –1 –1 14 –1 –1 –1 –1 –1 –1 –1
0 –1 0 –1 –1 –1 –1 –1 –1 –1 –1 –1 –1 –1 –1 –1
–1 –1 –1 –1 30 –1 –1 –1 –1 –1 –1 24 –1 –1 37 –1 –1    5
–1 –1 –1 56 14 –1 –1 –1 –1 –1 –1 –1 –1 –1 –1 0 –1
0 –1 –1 –1 –1 –1 –1 –1 –1 –1 –1 –1 –1 –1 –1 –1
62 –1 53 –1 –1 –1 –1 –1 –1 53 –1 –1 –1 –1 –13 –1
35 –1 –1 –1 –1 –1 –1 –1 –1 –1 –1 –1 0 –1 0 –1
–1 –1 –1 –1 –1 –1 –1 –1 –1 –1 –1 –1 –1 –1 62 –1    10
53 –1 –1 –1 –1 53 –1 –1 –1 –1 –1 3 –1 35 –1 –1 –1
–1 –1 –1 –1 –1 –1 –1 –1 –1 –1 –1 0 –1 0 –1 –1 –1
–1 –1 –1 –1 –1 –1 –1 –1 –1 –1 –1 –1 40 –1 –1 –1 –1
20 –1 66 –1 –1 –1 –1 –1 –122 –1 28 –1 –1 –1 –1 –1    15
–1 –1 –1 –1 –1 –1 –1 –1 –1 0 –1 0 –1 –1 –1 –1 –1
–1 –1 –1 –1 –1 –1 –1 –1 40 –1 –1 –1 –1 –1 20 –1
66 –1 –1 –1 –1 22 –1 28 –1 –1 –1 –1 –1 –1 –1 –1
–1 –1 –1 –1 –1 –1 –1 0 –1 0 –1 –1 –1 –1 –1 –1 –1
–1 –1 –1 –1 –1 0 –1 –1 –1 –1 –1 –1 –18 –1 –1 –1 42    20
–1 –1 –1 –1 50 –1 –1 –1 –18 –1 –1 –1 –1 –1 –1 –1
–1 –1 –1 –1 0 –1 0 –1 –1 –1 –1 –1 –1 –1 –1 –1
–1 –1 0 –1 –1 –1 –1 –1 –1 –18 –1 –1 –1 42 –1 –1 50
–1 –1 –1 –1 –1 –1 8 –1 –1 –1 –1 –1 –1 –1 –1 –1
–1 0 –1 0 –1 –1 –1 –1 –1 –1 –1 –1 –1 69 –1 79 –1    25
79 –1 –1 –1 –1 –1 –1 –1 56 –1 –1 52 –1 –1 –1 –1
–1 –1 –1 0 –1 –1 –1 –1 –1 –1 –1 –1 –1 –1 –1 0 –1
0 –1 –1 –1 –1 –1 –1 –1 –1 –1 –1 69 –1 79 –1 79 –1
–1 –1 –1 –1 –1 56 –1 –1 –1 –1 52 –1 –1 –1 –1 –1
–1 0 –1 –1 –1 –1 –1 –1 –1 –1 –1 –1 –1 0 –1 0 –1 –1    30
–1 –1 –1 –1 –1 –1 65 –1 –1 –1 –1 –1 –1 –1 38 –1 57
–1 –1 –1 –1 –1 72 –1 –1 –1 27 –1 –1 –1 –1 –1 –1 –1
–1 –1 –1 –1 –1 –1 –1 –1 –1 –1 0 –1 0 –1 –1 –1 –1
–1 –1 –1 –1 65 –1 –1 –1 –1 –1 –1 –1 38 –1 57 –1 –1    35
–1 –1 –1 72 –1 –1 –1 27 –1 –1 –1 –1 –1 –1 –1 –1 –1
–1 –1 –1 –1 –1 –1 –1 –1 0 –1 0 –1 –1 –1 –1 –1 –1
–1 64 –1 –1 –1 –1 –1 –1 14 –1 52 –1 –1 –1 –1 –1 –1
30 –1 –1 –1 –1 –1 32 –1 –1 –1 –1 –1 –1 –1 –1 –1 –1
–1 –1 –1 –1 –1 –1 0 –1 0 –1 –1 –1 –1 –1 64 –1 –1    40
–1 –1 –1 –1 –1 –1 14 –1 52 –1 –1 –1 –1 30 –1 –1 –1
–1 –1 –1 32 –1 –1 –1 –1 –1 –1 –1 –1 –1 –1 –1 –1 –1
–1 –1 –1 –1 0 –1 0 –1 –1 –1 –1 –1 –1 –1 45 –1 –1
–1 70 0 –1 –1 –1 –1 –1 –1 –1 77 –1 9 –1 –1 –1 –1 –1
–1 –1 –1 –1 –1 –1 –1 –1 –1 –1 –1 –1 –1 –1 –1 –1 –1    45
–1 0 –1 0 –1 –1 –1 –1 –1 45 –1 –1 –1 70 –1 –1 0 –1
–1 –1 –1 –1 –1 –1 77 –19 –1 –1 –1 –1 –1 –1 –1 –1
–1 –1 –1 –1 –1 –1 –1 –1 –1 –1 –1 –1 –1 –1 –1 0 –1
0 –1 –12 –1 56 –1 –1 –1 –1 57 35 –1 –1 –1 –1 –1 –1
–1 –1 –1 –1 –1 12 –1 –1 –1 –1 –1 –1 –1 –1 –1 –1 –1    50
–1 –1 –1 –1 –1 –1 –1 –1 –1 –1 –1 –1 0 –1 0 –1 –1 –1
2 –1 56 –1 –1 57 –1 –1 35 –1 –1 –1 –1 –1 –1 –1 –1
–1 –1 –1 12 –1 –1 –1 –1 –1 –1 –1 –1 –1 –1 –1 –1 –1
–1 –1 –1 –1 –1 –1 –1 –1 –1 –1 0 –1 0 –1 24 –1 –1
–1 61 –1 –1 –1 60 –1 –1 –1 –1 –1 27 51 –1 –1 –1 –1    55
–1 16 –1 1 –1 –1 –1 –1 –1 –1 –1 –1 –1 –1 –1 –1 –1
–1 –1 –1 –1 –1 –1 –1 –1 0 –1 24 –1 –1 –1 61 –1 –1
–1 60 –1 –1 –1 –1 27 –1 –1 51 –1 –1 –1 –1 –1 16
–1 1 –1 –1 –1 –1 –1 –1 –1 –1 –1 –1 –1 –1 –1 –1
–1 –1 –1 –1 –1 –1 0].

6. The method of claim 1, further comprising:
identifying, by a second device, the second parity check matrix;
receiving, by the second device from the first device, the encoded data; and decoding, by the second device, the encoded data using the second binary parity check matrix.

7. An apparatus comprising:
a transmitter and baseband circuitry, wherein
the baseband circuitry is configured to:
    identify a first parity check matrix of a first quasi-cyclic-low-density parity-check (QC-LDPC) code according to a code rate of 1/2;
    determine, based on a result of a Khatri-Rao product of the first parity check matrix and a first binary matrix having the same dimensions as dimensions of an exponent matrix of the first parity check matrix, a second parity check matrix corresponding to a first exponent matrix comprising 1152 values for a second QC-LDPC code, wherein the second QC-LDPC code has a code block size that is twice a code block size of the first QC-LDPC code; and
    encode, by an encoder of the baseband circuitry, data using the second parity check matrix, and
the transmitter is configured to transmit the encoded data over a wireless channel to increase a gain in a signal-to-noise (SNR) of the wireless channel compared with encoding data using the first QC-LDPC code.

8. The apparatus of claim 7, wherein
in determining the first binary matrix, the baseband circuitry is configured to:
    determine a second binary matrix having the same dimensions as dimensions of the first binary matrix; and
    determine the first binary matrix comprising at least (1) one or more rows of a second binary matrix or (2) one or more columns of the second binary matrix, and
in determining the second parity check matrix, the one or more processors are baseband circuitry is configured to:
    determine, based on the result of the Khatri-Rao product, a second exponent matrix having the same dimensions as dimensions of the first exponent matrix,
    determine, based on the second exponent matrix, the first exponent matrix; and
    determine, based on the first exponent matrix, the second parity check matrix.

9. The apparatus of claim 8, wherein
the second binary matrix comprises the following set of values: [1 1 1 1 1 1 1 1 0 1 0 1 0 0 1 1 1 1 1 1 1 1 1
1 0 1 1 1 0 1 1 1 0 1 1 1 1 0 0 1 1 1 1 1 1 1 1 1 1 0 1
1 1 1 0 1 1 0 1 1 1 1 1 0 0 1 1 1 1 1 1 1 1 0 0 1 1 1
1 1 0 0 1 1 1 1 1 1 0 0 1 1 1 1 1 1 1 1 1 0 1 1 1 1
1 1 1 1 1 1 1 1 0 0 1 1 1 1 1 1 0 1 1 1 1 1 0 1 1 1 1
1 1 1 1 0 0 1 1 1 1 1 1 0 1 1 1 1 0 1 1 1 1 1 0 1 1 1
1 1 0 0 1 1 1 1 1 1 1 1 0 1 1 1 1 1 1 1 1 1 1 1 1 1
0 0 1 1 1 1 1 1 1 0 1 1 1 1 1 1 1 1 1 1 1 1 1 1 1 1 0
0 1 1 1 0 1 1 1 1 1 1 1 0 1 1 1 1 1 1 1 1 0 0 1 0 0
1 1 0 1 1 1 1 1 1 1 1 1 1 1 1 1 1 1 1 1 0 0 1 1 1 1 1
1 1 0 0 1 1 0 0 1 1 1 1 1 1 1 1 1 1 0], and
the second exponent matrix comprises the following set of values: [–1 57 –1 –1 –1 –1 –1 –1 –1 50 –1 –1 –1 11
–1 –1 50 –1 –1 –1 79 –1 –1 –1 1 –1 0 –1 –1 –1 –1 –1
–1 –1 –1 –1 –1 –1 –1 –1 –1 –1 –1 –1 –1 –1 –1 57
–1 –1 –1 –1 –1 –1 –1 50 –1 –1 –1 11 –1 –1 –1 –1 50
–1 –1 –1 79 –1 –1 –1 1 –1 0 –1 –1 –1 –1 –1 –1 –1
–1 –1 –1 –1 –1 –1 –1 –1 –1 –1 –1 –1 –13 –1 –1 –1
–1 28 –1 –1 0 –1 –1 –1 –1 –1 –1 –1 55 –1 –17 –1 –1
–1 –1 –1 –1 0 –1 0 –1 –1 –1 –1 –1 –1 –1 –1 –1 –1
–1 –1 –1 –1 –1 –1 –1 –1 –1 –13 –1 –1 28 –1 –1 –1
–1 0 –1 –1 –1 –1 –1 –1 –1 55 7 –1 –1 –1 –1 –1 –1
–1 –1 0 –1 0 –1 –1 –1 –1 –1 –1 –1 –1 –1 –1 –1 –1
–1 –1 –1 –1 –1 –1 30 –1 –1 –1 –1 –1 –1 –1 –1 24 37

–1 –1 –1 –1 –1 56 –1 –1 14 –1 –1 –1 –1 –1 –1 –1 –1
0 –1 0 –1 –1 –1 –1 –1 –1 –1 –1 –1 –1 –1 –1 –1 –1
–1 –1 –1 –1 30 –1 –1 –1 –1 –1 –1 24 –1 –1 37 –1 –1
–1 –1 –1 56 14 –1 –1 –1 –1 –1 –1 –1 –1 –1 –1 0 –1
0 –1 –1 –1 –1 –1 –1 –1 –1 –1 –1 –1 –1 –1 –1 –1 –1  5
62 –1 53 –1 –1 –1 –1 –1 –1 53 –1 –1 –1 –13 –1 35
–1 –1 –1 –1 –1 –1 –1 –1 –1 –1 –1 –1 –1 –1 0 –1 0 –1
–1 –1 –1 –1 –1 –1 –1 –1 –1 –1 –1 –1 –1 –1 –1 62 –1
53 –1 –1 –1 –1 53 –1 –1 –1 –1 –1 –1 3 –1 35 –1 –1
–1 –1 –1 –1 –1 –1 –1 –1 –1 –1 –1 0 –1 0 –1 –1 –1  10
–1 –1 –1 –1 –1 –1 –1 –1 –1 –1 –1 –1 40 –1 –1 –1 –1
20 –1 –1 66 –1 –1 –1 –1 –1 22 –1 28 –1 –1 –1 –1 –1
–1 –1 –1 –1 –1 –1 –1 –1 –1 0 –1 0 –1 –1 –1 –1 –1
–1 –1 –1 –1 –1 –1 –1 –1 40 –1 –1 –1 –1 –1 20 66
–1 –1 –1 –1 –1 22 –1 28 –1 –1 –1 –1 –1 –1 –1 –1 –1  15
–1 –1 –1 –1 –1 –1 –1 0 –1 0 –1 –1 –1 –1 –1 –1 –1
–1 –1 –1 –1 –1 0 –1 –1 –1 –1 –1 –1 –1 –18 –1 –1 42
–1 –1 –1 –1 50 –1 –1 –1 –1 –18 –1 –1 –1 –1 –1 –1
–1 –1 –1 –1 0 –1 0 –1 –1 –1 –1 –1 –1 –1 –1 –1 –1
–1 –1 0 –1 –1 –1 –1 –1 –18 –1 –1 –1 –1 42 –1 –1 50  20
–1 –1 –1 –1 –1 8 –1 –1 –1 –1 –1 –1 –1 –1 –1 –1 –1
–1 0 –1 0 –1 –1 –1 –1 –1 –1 –1 –1 –1 –1 –1 69 79 –1
–1 79 –1 –1 –1 –1 –1 –1 56 –1 –1 –1 –1 52 –1 –1 –1
–1 –1 –1 0 –1 –1 –1 –1 –1 –1 –1 –1 –1 –1 –1 0 –1
0 –1 –1 –1 –1 –1 –1 –1 –1 69 –1 –1 79 79 –1 –1 –1  25
–1 –1 –1 –1 –1 –1 56 –1 –1 52 –1 –1 –1 –1 –1 –1 –1
–1 0 –1 –1 –1 –1 –1 –1 –1 –1 –1 –1 –1 0 –1 0 –1 –1
–1 –1 –1 –1 –1 –1 –1 65 –1 –1 –1 –1 –1 –1 –1 38 57
–1 –1 –1 –1 –1 –1 72 –1 –1 –1 27 –1 –1 –1 –1 –1 –1
–1 –1 –1 –1 –1 –1 –1 –1 –1 –1 0 –1 0 –1 –1 –1 –1 –1  30
–1 –1 –1 65 –1 –1 –1 –1 –1 –1 –1 38 –1 –1 57 –1 –1
–1 –1 72 –1 –1 –1 27 –1 –1 –1 –1 –1 –1 –1 –1 –1 –1
–1 –1 –1 –1 –1 –1 –1 –1 0 –1 0 –1 –1 –1 –1 –1 –1
–1 64 –1 –1 –1 –1 –1 –1 14 –1 –1 52 –1 –1 –1 –1 –1
30 –1 –1 –1 –1 –1 32 –1 –1 –1 –1 –1 –1 –1 –1 –1 –1  35
–1 –1 –1 –1 –1 –1 0 –1 0 –1 –1 –1 –1 –1 64 –1 –1
–1 –1 –1 –1 –1 –1 14 52 –1 –1 –1 –1 –1 30 –1 –1 –1
–1 –1 32 –1 –1 –1 –1 –1 –1 –1 –1 –1 –1 –1 –1 –1 –1
–1 –1 –1 –1 0 –1 0 –1 –1 –1 –1 –1 –1 45 –1 –1 –1
–1 70 –1 0 –1 –1 –1 –1 –1 –1 –1 77 9 –1 –1 –1 –1 –1  40
–1 –1 –1 –1 –1 –1 –1 –1 –1 –1 –1 –1 –1 –1 –1 –1 –1
–1 0 –1 0 –1 –1 –1 –1 –1 –1 45 –1 –1 70 –1 0 –1 –1
–1 –1 –1 –1 –1 77 –1 –1 19 –1 –1 –1 –1 –1 –1 –1 –1
–1 –1 –1 –1 –1 –1 –1 –1 –1 –1 –1 –1 –1 –1 –1 0 –1 –1
0 –1 –1 2 –1 56 –1 –1 –1 –1 57 35 –1 –1 –1 –1 –1 –1  45
–1 –1 –1 –1 –1 –1 12 –1 –1 –1 –1 –1 –1 –1 –1 –1 –1
–1 –1 –1 –1 –1 –1 –1 –1 –1 –1 –1 –1 –1 0 –1 0 –1 –1
2 –1 56 –1 –1 57 –1 –1 35 –1 –1 –1 –1 –1 –1 –1 –1
–1 –1 12 –1 –1 –1 –1 –1 –1 –1 –1 –1 –1 –1 –1 –1 –1
–1 –1 –1 –1 –1 –1 –1 –1 –1 –1 0 –1 0 –1 24 –1 –1 –1  50
–1 61 –1 –1 –1 60 –1 –1 –1 –1 27 –1 51 –1 –1 –1 –1
–1 16 –1 1 1 –1 –1 –1 –1 –1 –1 –1 –1 –1 –1 –1 –1
–1 –1 –1 –1 –1 –1 –1 –1 0 –1 24 –1 –1 –1 61 –1 –1
–1 60 –1 –1 –1 –1 –1 –1 27 –1 51 –1 –1 –1 –1 –1 16
–1 1 –1 –1 –1 –1 –1 –1 –1 –1 –1 –1 –1 –1 –1 –1 –1  55
–1 –1 –1 –1 –1 –1 0].

10. The apparatus of claim 8, wherein
the second binary matrix comprises the following set of
values: [1 1 1 1 1 1 0 1 0 1 1 0 0 1 1 1 1 1 1 1 1 1
1 1 1 1 1 1 1 1 0 1 1 1 1 0 0 1 1 1 1 1 1 1 1 0 1 1 1 1 0 1 1 0 1 1 1 1 1 0 0 1 1 1 1 1 1 1 0 0 1 1 1 1 1
1 1 1 1 1 1 1 1 0 0 1 1 1 1 1 1 1 1 1 1 1 0 0 1 1 0 0 1
1 1 1 1 1 1 0 0 1 1 1 1 1 1 0 1 1 1 0 1 0 1 1 1 1 0 1
1 1 1 0 0 1 1 1 1 0 1 1 1 0 0 0 1 1 1 1 0 1 0 1 1 1 0 1 1 1
1 1 0 0 1 1 1 1 0 1 1 1 0 0 1 1 0 1 0 1 1 1 1 1 1 1 1  65
0 0 1 1 1 1 1 1 1 1 0 1 1 1 1 1 1 1 1 1 1 1 1 1 0 0
1 1 1 1 1 1 0 1 1 1 0 0 1 1 1 1 1 1 1 1 1 1 1 0 0 1 1

0 1 1 0 1 1 1 1 1 0 1 1 1 1 1 1 1 1 1 0 0 1 1 1 1 1 1
1 1 0 1 1 0 0 1 1 1 1 1 1 1 1 1 1 1 0], and
the second exponent matrix comprises the following set of
values: [–1 57 –1 –1 –1 –1 –1 –1 50 –1 –1 11 –1
–1 –1 50 –1 –1 –1 79 –1 –1 1 –1 0 –1 –1 –1 –1 –1 –1
–1 –1 –1 –1 –1 –1 –1 –1 –1 –1 –1 –1 –1 –1 –1 –1 57
–1 –1 –1 –1 –1 –1 –1 50 –1 –1 –1 –1 11 –1 –1 –1 50
–1 –1 79 –1 –1 –1 –1 1 –1 0 –1 –1 –1 –1 –1 –1 –1
–1 –1 –1 –1 –1 –1 –1 –1 –1 –1 –1 –1 –1 –1 –13 –1 –1
–1 28 –1 –1 –1 0 –1 –1 –1 –1 –1 –1 55 –1 –1 7 –1 –1
–1 –1 –1 –1 0 –1 0 –1 –1 –1 –1 –1 –1 –1 –1 –1 –1
–1 –1 –1 –1 –1 –1 –1 –1 –1 –13 –1 –1 –1 28 –1 –1 –1
0 –1 –1 –1 –1 –1 –1 –1 –1 55 7 –1 –1 –1 –1 –1 –1
–1 –1 0 –1 0 –1 –1 –1 –1 –1 –1 –1 –1 –1 –1 –1 –1
–1 –1 –1 –1 –1 –1 30 –1 –1 –1 –1 –1 –1 –1 24 37
–1 –1 –1 –1 –1 56 –1 –1 14 –1 –1 –1 –1 –1 –1 –1 –1
0 –1 0 –1 –1 –1 –1 –1 –1 –1 –1 –1 –1 –1 –1 –1 –1
–1 –1 –1 –1 30 –1 –1 –1 –1 –1 –1 24 –1 –1 37 –1 –1
–1 –1 –1 56 14 –1 –1 –1 –1 –1 –1 –1 –1 –1 –1 0 –1
0 –1 –1 –1 –1 –1 –1 –1 –1 –1 –1 –1 –1 –1 –1 –1 –1
62 –1 53 –1 –1 –1 –1 –1 –1 53 –1 –1 –1 –1 –13 –1
35 –1 –1 –1 –1 –1 –1 –1 –1 –1 –1 –1 –1 0 –1 0 –1
–1 –1 –1 –1 –1 –1 –1 –1 –1 –1 –1 –1 –1 62 –1
53 –1 –1 –1 53 –1 –1 –1 –1 –1 –1 3 –1 35 –1 –1 –1
–1 –1 –1 –1 –1 –1 –1 –1 –1 –1 0 –1 0 –1 –1 –1 –1
–1 –1 –1 –1 –1 –1 –1 –1 –1 –1 40 –1 –1 –1 –1 –1
20 –1 66 –1 –1 –1 –1 22 –1 28 –1 –1 –1 –1 –1 –1
–1 –1 –1 –1 –1 –1 –1 –1 0 –1 0 –1 –1 –1 –1 –1 –1
–1 –1 –1 –1 –1 –1 –1 40 –1 –1 –1 –1 –1 20 –1
66 –1 –1 –1 –1 22 –1 28 –1 –1 –1 –1 –1 –1 –1 –1
–1 –1 –1 –1 –1 –1 –1 0 –1 0 –1 –1 –1 –1 –1 –1 –1
–1 –1 –1 –1 0 –1 –1 –1 –1 –1 –1 –18 –1 –1 –1 42
–1 –1 –1 50 –1 –1 –1 –18 –1 –1 –1 –1 –1 –1 –1
–1 –1 –1 0 –1 0 –1 –1 –1 –1 –1 –1 –1 –1 –1 –1
–1 –1 0 –1 –1 –1 –1 –1 –18 –1 –1 –1 42 –1 –1 50
–1 –1 –1 –1 –1 8 –1 –1 –1 –1 –1 –1 –1 –1 –1 –1
–1 0 –1 0 –1 –1 –1 –1 –1 –1 –1 –1 –1 69 –1 79 –1
79 –1 –1 –1 –1 –1 –1 –1 56 –1 –1 52 –1 –1 –1 –1
–1 –1 –1 0 –1 –1 –1 –1 –1 –1 –1 –1 –1 –1 –1 0 –1
0 –1 –1 –1 –1 –1 –1 –1 –1 –1 69 –1 79 –1 79 –1
–1 –1 –1 –1 56 –1 –1 –1 –1 52 –1 –1 –1 –1 –1 –1
–1 0 –1 –1 –1 –1 –1 –1 –1 –1 –1 –1 –1 0 –1 0 –1 –1
–1 –1 –1 –1 –1 65 –1 –1 –1 –1 –1 –1 38 –1 57
–1 –1 –1 –1 72 –1 –1 –1 27 –1 –1 –1 –1 –1 –1 –1 –1
–1 –1 –1 –1 –1 –1 –1 –1 –1 –1 0 –1 0 –1 –1 –1 –1 –1
–1 –1 –1 65 –1 –1 –1 –1 –1 –1 –1 38 –1 57 –1 –1
–1 –1 –1 72 –1 –1 –1 27 –1 –1 –1 –1 –1 –1 –1 –1 –1
–1 –1 –1 –1 –1 –1 –1 –1 –1 0 –1 0 –1 –1 –1 –1 –1
–1 64 –1 –1 –1 –1 –1 –1 14 52 –1 –1 –1 –1 –1
30 –1 –1 –1 –1 –1 32 –1 –1 –1 –1 –1 –1 –1 –1 –1
–1 –1 –1 –1 –1 –1 0 –1 0 –1 –1 –1 –1 64 –1 –1
–1 –1 –1 –1 –1 14 –1 –1 52 –1 –1 –1 30 –1 –1 –1
–1 –1 32 –1 –1 –1 –1 –1 –1 –1 –1 –1 –1 –1 –1 –1
–1 –1 –1 –1 0 –1 0 –1 –1 –1 –1 –1 –1 45 –1 –1
–1 70 0 –1 –1 –1 –1 –1 –1 77 –19 –1 –1 –1 –1
–1 –1 –1 –1 –1 –1 –1 –1 –1 –1 –1 –1 –1 –1 –1 –1
–1 0 –1 0 –1 –1 –1 –1 –1 45 –1 –1 –1 70 –1 –1 0 –1
–1 –1 –1 –1 –1 –1 77 –19 –1 –1 –1 –1 –1 –1 –1 –1
–1 –1 –1 –1 –1 –1 –1 –1 –1 –1 –1 –1 –1 –1 0 –1 0
–1 –1 –1 –12 56 –1 –1 –1 –1 57 35 –1 –1 –1 –1 –1 –1
–1 –1 –1 –1 –1 12 –1 –1 –1 –1 –1 –1 –1 –1 –1 –1
–1 –1 –1 –1 –1 –1 –1 –1 –1 –1 –1 –1 0 –1 0 –12 –1
–1 56 –1 –1 57 –1 –1 35 –1 –1 –1 –1 –1 –1 –1 –1
–1 –1 12 –1 –1 –1 –1 –1 –1 –1 –1 –1 –1 –1 –1 –1 –1
–1 –1 –1 –1 –1 –1 –1 –1 0 –1 0 –1 24 –1 –1 –1
61 –1 –1 –1 60 –1 –1 –1 –1 27 51 –1 –1 –1 –1 –1
16 –1 1 1 –1 –1 –1 –1 –1 –1 –1 –1 –1 –1 –1 –1 –1

–1 –1 –1 –1 –1 –1 –1 0 –1 24 –1 –1 –1 61 –1 –1 –1
60 –1 –1 –1 –1 –1 27 –1 –1 51 –1 –1 –1 –1 –1 16 –1
1 –1 –1 –1 –1 –1 –1 –1 –1 –1 –1 –1 –1 –1 –1 –1 –1
–1 –1 –1 –1 –1 –1 0].

11. The apparatus of claim 8, wherein
the second binary matrix comprises the following set of
values: [1 1 1 1 1 1 0 1 0 1 1 1 0 0 1 1 1 1 1 1 1 1 1
1 1 1 1 1 1 1 1 1 0 1 1 1 1 0 0 1 1 1 1 1 1 1 1 1 0 1
1 1 1 0 1 1 0 1 1 1 1 1 0 0 1 1 1 1 1 1 1 1 0 1 1 1 1
0 1 1 1 1 1 1 1 1 0 0 1 1 1 1 1 1 1 1 1 0 0 1 1 1
1 1 1 1 1 1 1 1 0 0 1 1 1 1 1 1 0 1 1 1 0 1 0 1 1 1 1
0 1 1 1 1 1 0 0 1 1 1 1 1 0 0 0 1 1 1 1 1 0 1 1 1 0 1
1 1 1 1 0 0 1 1 1 1 0 1 1 1 0 0 1 1 0 1 0 1 1 1 1 1 1
1 1 0 0 1 1 1 1 1 1 0 0 1 1 1 1 1 1 1 1 1 1 1 1 1 1
0 0 1 1 1 1 1 1 0 1 1 1 1 1 1 1 1 1 1 1 1 1 1 0 0 1 1
1 0 0 1 1 0 1 1 1 1 1 0 1 1 1 1 1 1 1 1 1 1 1 0 0 1 1
1 1 1 1 1 1 0 1 1 0 0 1 1 1 1 1 1 1 1 1 1 0], and
the second exponent matrix comprises the following set of
values: [–1 57 –1 –1 –1 –1 –1 –1 –1 50 –1 –1 11 –1
–1 –1 50 –1 –1 –1 –1 79 –1 –1 1 1 –1 0 –1 –1 –1 –1 –1
–1 –1 –1 –1 –1 –1 –1 –1 –1 –1 –1 –1 –1 –1 –1 –1 57
–1 –1 –1 –1 –1 –1 –1 50 –1 –1 –1 –1 11 –1 –1 –1 50
–1 –1 79 –1 –1 –1 –1 1 1 –1 0 –1 –1 –1 –1 –1 –1 –1
–1 –1 –1 –1 –1 –1 –1 –1 –1 –1 –1 –1 –1 –1 –13 –1 –1
–1 28 –1 –1 –1 0 –1 –1 –1 –1 –1 –1 55 –1 –1 7 –1 –1
–1 –1 –1 –1 0 –1 0 –1 –1 –1 –1 –1 –1 –1 –1 –1 –1 –1
–1 –1 –1 –1 –1 –1 –1 –1 –13 –1 –1 –1 28 –1 –1 –1
0 –1 –1 –1 –1 –1 –1 –1 55 7 –1 –1 –1 –1 –1 –1 –1
–1 –1 0 –1 0 –1 –1 –1 –1 –1 –1 –1 –1 –1 –1 –1 –1
–1 –1 –1 –1 –1 –1 30 –1 –1 –1 –1 –1 –1 –1 –1 24 37
–1 –1 –1 –1 –1 56 –1 –1 14 –1 –1 –1 –1 –1 –1 –1 –1
0 –1 0 –1 –1 –1 –1 –1 –1 –1 –1 –1 –1 –1 –1 –1 –1
–1 –1 –1 –1 30 –1 –1 –1 –1 –1 –1 24 –1 –1 37 –1 –1
–1 –1 –1 56 14 –1 –1 –1 –1 –1 –1 –1 –1 –1 –1 0 –1
0 –1 –1 –1 –1 –1 –1 –1 –1 –1 –1 –1 –1 –1 –1 –1 –1 –1
62 –1 53 –1 –1 –1 –1 –1 –1 53 –1 –1 –1 –1 –13 –1
35 –1 –1 –1 –1 –1 –1 –1 –1 –1 –1 –1 –1 0 –1 0 –1
–1 –1 –1 –1 –1 –1 –1 –1 –1 –1 –1 –1 –1 –1 62 –1
53 –1 –1 –1 –1 53 –1 –1 –1 –1 –1 3 –1 35 –1 –1 –1
–1 –1 –1 –1 –1 –1 –1 –1 –1 –1 –1 0 –1 0 –1 –1 –1 –1
–1 –1 –1 –1 –1 –1 –1 –1 –1 –1 –1 –1 40 –1 –1 –1 –1
20 –1 66 –1 –1 –1 –1 –1 22 –1 28 –1 –1 –1 –1 –1
–1 –1 –1 –1 –1 –1 –1 –1 –1 0 –1 0 –1 –1 –1 –1 –1
–1 –1 –1 –1 –1 –1 –1 –1 –1 40 –1 –1 –1 –1 –1 –1 20 –1
66 –1 –1 –1 22 –1 28 –1 –1 –1 –1 –1 –1 –1 –1 –1 –1
–1 –1 –1 –1 –1 –1 –1 0 –1 0 –1 –1 –1 –1 –1 –1 –1 –1
–1 –1 –1 –1 –1 0 –1 –1 –1 –1 –1 –1 –18 –1 –1 –1 42
–1 –1 –1 –1 50 –1 –1 –1 –18 –1 –1 –1 –1 –1 –1 –1
–1 –1 –1 –1 0 –1 0 –1 –1 –1 –1 –1 –1 –1 –1 –1
–1 –1 0 –1 –1 –1 –1 –1 –1 –18 –1 –1 –1 42 –1 –1 50
–1 –1 –1 –1 –1 –18 –1 –1 –1 –1 –1 –1 –1 –1 –1 –1
–1 0 –1 0 –1 –1 –1 –1 –1 –1 –1 –1 –1 69 –1 79 –1
79 –1 –1 –1 –1 –1 –1 –1 56 –1 –1 52 –1 –1 –1 –1
–1 –1 –1 0 –1 –1 –1 –1 –1 –1 –1 –1 –1 –1 –1 0 –1
0 –1 –1 –1 –1 –1 –1 –1 –1 –1 69 –1 79 –1 79 –1
–1 –1 –1 –1 –1 56 –1 –1 –1 –1 52 –1 –1 –1 –1 –1
–1 0 –1 –1 –1 –1 –1 –1 –1 –1 –1 –1 0 –1 0 –1 –1
–1 –1 –1 –1 –1 65 –1 –1 –1 –1 –1 –1 –1 38 –1 57
–1 –1 –1 –1 –1 72 –1 –1 –1 27 –1 –1 –1 –1 –1 –1 –1
–1 –1 –1 –1 –1 –1 –1 –1 –1 –1 0 –1 0 –1 –1 –1 –1
–1 –1 –1 –1 65 –1 –1 –1 –1 –1 –1 38 –1 57 –1 –1
–1 –1 –1 72 –1 –1 –1 27 –1 –1 –1 –1 –1 –1 –1 –1
–1 –1 –1 –1 –1 –1 –1 0 –1 0 –1 –1 –1 –1 –1 –1 –1
–1 64 –1 –1 –1 –1 –1 –1 14 –1 52 –1 –1 –1 –1 –1 –1
30 –1 –1 –1 –1 32 –1 –1 –1 –1 –1 –1 –1 –1 –1 –1 –1
–1 –1 –1 –1 –1 –1 0 –1 0 –1 –1 –1 –1 –1 64 –1 –1
–1 –1 –1 –1 –1 –1 14 –1 52 –1 –1 –1 –1 30 –1 –1 –1

–1 –1 32 –1 –1 –1 –1 –1 –1 –1 –1 –1 –1 –1 –1 –1 –1
–1 –1 –1 –1 0 –1 0 –1 –1 –1 –1 –1 –1 –1 45 –1 –1
–1 70 0 –1 –1 –1 –1 –1 –1 –1 77 –19 –1 –1 –1 –1 –1
–1 –1 –1 –1 –1 –1 –1 –1 –1 –1 –1 –1 –1 –1 –1 –1 –1
–1 0 –1 0 –1 –1 –1 –1 –1 45 –1 –1 –1 70 –1 –1 0 –1
–1 –1 –1 –1 –1 –1 77 –19 –1 –1 –1 –1 –1 –1 –1 –1
–1 –1 –1 –1 –1 –1 –1 –1 –1 –1 –1 –1 –1 –1 –1 0 –1
0 –1 –12 –1 56 –1 –1 –1 –1 57 35 –1 –1 –1 –1 –1 –1
–1 –1 –1 –1 –1 12 –1 –1 –1 –1 –1 –1 –1 –1 –1 –1 –1
–1 –1 –1 –1 –1 –1 –1 –1 –1 –1 –1 –1 0 –1 0 –1 –1 –1
2 –1 56 –1 –1 57 –1 –1 35 –1 –1 –1 –1 –1 –1 –1 –1
–1 –1 –1 12 –1 –1 –1 –1 –1 –1 –1 –1 –1 –1 –1 –1 –1
–1 –1 –1 –1 –1 –1 –1 –1 –1 –1 0 –1 0 –1 24 –1 –1
–1 61 –1 –1 –1 60 –1 –1 –1 –1 –1 27 51 –1 –1 –1 –1
–1 16 –1 1 –1 –1 –1 –1 –1 –1 –1 –1 –1 –1 –1 –1 –1
–1 –1 –1 –1 –1 –1 –1 –1 0 –1 24 –1 –1 –1 61 –1 –1
–1 60 –1 –1 –1 –1 –1 27 –1 –1 51 –1 –1 –1 –1 –1 16
–1 1 –1 –1 –1 –1 –1 –1 –1 –1 –1 –1 –1 –1 –1 –1 –1
–1 –1 –1 –1 –1 –1 0].

12. The apparatus of claim 8, wherein in determining the
first exponent matrix, the baseband circuitry is configured
to:
    select, from values of the second exponent matrix, at least
        1150 values as values of the first exponent matrix;
    shift one or two values of the first exponent matrix from
        one or more corresponding positive values of the
        second exponent matrix by –1 or +1 wherein the one or
        more corresponding positive values of the second expo-
        nent matrix are not selected as the at least 1150 values;
        and
    determine a resulting matrix of the shifting as the first
        exponent matrix.

13. An apparatus comprising:
    a receiver configured to receive encoded data over a
        wireless channel to increase a gain in a signal-to-noise
        (SNR) of the wireless channel compared with encoding
        data using a first quasi-cyclic-low-density parity-check
        (QC-LDPC) code, wherein the encoded data is encoded
        using a second QC-LDPC code according to a code rate
        of 1/2, wherein the second QC-LDPC code has a code
        block size that is twice a code block size of the first
        QC-LDPC code; and
    baseband circuitry configured to:
        identify, based on a first parity check matrix of the first
            QC-LDPC code according to the code rate of 1/2;
        determine, based on a result of a Khatri-Rao product of
            the first parity check matrix and a first binary matrix
            having the same dimensions as dimensions of an
            exponent matrix of the first parity check matrix, a
            second parity check matrix corresponding to a first
            exponent matrix comprising 1152 values for the
            second QC-LDPC code; and
        decode the received encoded data using the second
            binary parity check matrix.

14. The apparatus of claim 13, wherein the first exponent
matrix comprises at least 1150 values selected from a second
exponent matrix having the same dimensions as dimensions
of the first exponent matrix.

15. The apparatus of claim 14, wherein the first exponent
matrix comprises one or two values shifted from one or more
corresponding positive values of the second exponent matrix
by –1 or +1,
    wherein the one or more corresponding positive values of
        the second exponent matrix are not selected as the at
        least 1150 values.

16. The apparatus of claim 14, wherein the second expo-
nent matrix comprises the following set of values: [–1 57 –1

−1 −1 −1 −1 −1 −1 50 −1 −1 −1 11 −1 −1 50 −1 −1 −1 79
−1 −1 −1 1 1 −1 0 −1 −1 −1 −1 −1 −1 −1 −1 −1 −1 −1 −1
−1 −1 −1 −1 −1 −1 −1 57 −1 −1 −1 −1 −1 −1 −1 50 −1
−1 −1 11 −1 −1 −1 −1 50 −1 −1 −1 79 −1 −1 −1 1 −1 0 −1
−1 −1 −1 −1 −1 −1 −1 −1 −1 −1 −1 −1 −1 −1 −1 −1 −1 −1
−1 3 −1 −1 −1 −1 28 −1 −1 0 −1 −1 −1 −1 −1 −1 −1 55 −1
−17 −1 −1 −1 −1 −1 −1 0 −1 0 −1 −1 −1 −1 −1 −1 −1 −1 −1
−1 −1 −1 −1 −1 −1 −1 −1 −1 −1 −1 −13 −1 −1 28 −1 −1 −1 −1
0 −1 −1 −1 −1 −1 −1 −1 55 7 −1 −1 −1 −1 −1 −1 −1 −1 0
−1 0 −1 −1 −1 −1 −1 −1 −1 −1 −1 −1 −1 −1 −1 −1 −1 −1 −1
−1 30 −1 −1 −1 −1 −1 −1 −1 −1 24 37 −1 −1 −1 −1 −1 56
−1 −1 14 −1 −1 −1 −1 −1 −1 −1 −1 −1 0 −1 0 −1 −1 −1 −1 −1
−1 −1 −1 −1 −1 −1 −1 −1 −1 −1 −1 −1 −1 30 −1 −1 −1 −1 −1
−1 −1 24 −1 −1 37 −1 −1 −1 −1 −1 56 14 −1 −1 −1 −1 −1 −1
−1 −1 −1 −1 −1 0 −1 0 −1 −1 −1 −1 −1 −1 −1 −1 −1 −1 −1 −1
−1 −1 −1 −1 −1 62 −1 53 −1 −1 −1 −1 −1 −1 53 −1 −1 −1 −1
−1 3 −1 35 −1 −1 −1 −1 −1 −1 −1 −1 −1 −1 −1 −1 0 −1
0 −1 −1 −1 −1 −1 −1 −1 −1 −1 −1 −1 −1 −1 −1 −1 −1 62 −1
53 −1 −1 −1 −1 53 −1 −1 −1 −1 −1 −13 −1 35 −1 −1 −1 −1
−1 −1 −1 −1 −1 −1 −1 −1 −1 0 −1 0 −1 −1 −1 −1 −1 −1 −1 −1
−1 −1 −1 −1 −1 −1 −1 −1 40 −1 −1 −1 −1 20 −1 −1 66 −1
−1 −1 −1 −1 22 −1 28 −1 −1 −1 −1 −1 −1 −1 −1 −1 −1 −1 −1
−1 −1 −1 0 −1 0 −1 −1 −1 −1 −1 −1 −1 −1 −1 −1 −1 −1 −1 −1
40 −1 −1 −1 −1 −1 −1 20 66 −1 −1 −1 −1 −1 −1 22 −1 28 −1
−1 −1 −1 −1 −1 −1 −1 −1 −1 −1 −1 −1 −1 −1 0 −1 0 −1
−1 −1 −1 −1 −1 −1 −1 −1 −1 −1 −1 0 −1 −1 −1 −1 −1 −1 −1 −1
−18 −1 −1 42 −1 −1 −1 −1 50 −1 −1 −1 −1 −18 −1 −1 −1
−1 −1 −1 −1 −1 −1 −1 0 −1 0 −1 −1 −1 −1 −1 −1 −1 −1 −1
−1 −1 −1 0 −1 −1 −1 −1 −1 −18 −1 −1 −1 −1 42 −1 −1 50
−1 −1 −1 −1 −18 −1 −1 −1 −1 −1 −1 −1 −1 −1 −1 −1 −1 −1 0
−1 0 −1 −1 −1 −1 −1 −1 −1 −1 −1 −1 −1 69 79 −1 −1 79 −1
−1 −1 −1 −1 −1 56 −1 −1 −1 −1 52 −1 −1 −1 −1 −1 −1 0 −1
−1 −1 −1 −1 −1 −1 −1 −1 −1 −1 −1 0 −1 0 −1 −1 −1 −1 −1 −1
−1 −1 −1 69 −1 −1 79 79 −1 −1 −1 −1 −1 −1 −1 −1 56 −1
−1 52 −1 −1 −1 −1 −1 −1 −1 −1 0 −1 −1 −1 −1 −1 −1 −1 −1
−1 −1 −1 0 −1 0 −1 −1 −1 −1 −1 −1 −1 −1 −1 65 −1 −1 −1
−1 −1 −1 −1 38 57 −1 −1 −1 −1 −1 −1 72 −1 −1 −1 27 −1
−1 −1 −1 −1 −1 −1 −1 −1 −1 −1 −1 −1 −1 −1 −1 0 −1 0 −1
−1 −1 −1 −1 −1 −1 65 −1 −1 −1 −1 −1 −1 −1 38 −1 −1 57
−1 −1 −1 −1 72 −1 −1 −1 27 −1 −1 −1 −1 −1 −1 −1 −1 −1 −1
−1 −1 −1 −1 −1 −1 −1 −1 −1 −1 −1 0 −1 0 −1 −1 −1 −1 −1 −1
64 −1 −1 −1 −1 −1 −1 14 −1 −1 52 −1 −1 −1 −1 −1 30 −1
−1 −1 −1 −1 32 −1 −1 −1 −1 −1 −1 −1 −1 −1 −1 −1 −1 −1 −1
−1 −1 −1 0 −1 0 −1 −1 −1 −1 −1 −1 64 −1 −1 −1 −1 −1 −1
−1 14 52 −1 −1 −1 −1 −1 30 −1 −1 −1 −1 −1 −1 32 −1 −1 −1
−1 −1 −1 −1 −1 −1 −1 −1 −1 −1 −1 −1 −1 −1 −1 0 −1 0 −1
−1 −1 −1 −1 −1 45 −1 −1 −1 70 −1 0 −1 −1 −1 −1 −1 −1 −1
−1 7 79 −1 −1 −1 −1 −1 −1 −1 −1 −1 −1 −1 −1 −1 −1 −1 −1
−1 −1 −1 −1 −1 −1 −1 0 −1 0 −1 −1 −1 −1 −1 −1 45 −1 −1
70 −1 0 −1 −1 −1 −1 −1 −1 −1 77 −1 −1 9 −1 −1 −1 −1 −1
−1 −1 −1 −1 −1 −1 −1 −1 −1 −1 −1 −1 −1 −1 −1 −1 −1 −1 −1
0 −1 0 −1 −1 2 −1 56 −1 −1 −1 −1 −1 57 35 −1 −1 −1 −1 −1 −1
−1 −1 −1 −1 −1 −1 −1 12 −1 −1 −1 −1 −1 −1 −1 −1 −1 −1 −1
−1 −1 −1 −1 −1 −1 −1 −1 −1 −1 −1 0 −1 0 −1 −1 2 −1 56
−1 −1 57 −1 −1 35 −1 −1 −1 −1 −1 −1 −1 −1 −1 −1 12 −1
−1 −1 −1 −1 −1 −1 −1 −1 −1 −1 −1 −1 −1 −1 −1 −1 −1 −1 −1
−1 −1 −1 −1 −1 0 −1 0 −1 24 −1 −1 −1 61 −1 −1 −1 60 −1
−1 −1 −1 27 −1 51 −1 −1 −1 −1 −1 16 −1 1 −1 −1 −1 −1 −1 −1
−1 −1 −1 −1 −1 −1 −1 −1 −1 −1 −1 −1 −1 −1 −1 −1 0 −1 24
−1 −1 −1 61 −1 −1 −1 60 −1 −1 −1 −1 −1 −1 27 −1 51 −1
−1 −1 −1 −1 16 −1 1 −1 −1 −1 −1 −1 −1 −1 −1 −1 −1 −1 −1
−1 −1 −1 −1 −1 −1 −1 −1 −1 −1 0].

17. The apparatus of claim 14, wherein the second exponent matrix comprises the following set of values: [−1 57 −1
−1 −1 −1 −1 −1 −1 50 −1 −1 11 −1 −1 −1 50 −1 −1 −1 −1
79 −1 −1 1 −1 0 −1 −1 −1 −1 −1 −1 −1 −1 −1 −1 −1 −1 −1
−1 −1 −1 −1 −1 −1 −1 −1 57 −1 −1 −1 −1 −1 −1 −1 50 −1

−1 −1 −1 11 −1 −1 −1 −1 50 −1 −1 79 −1 −1 −1 −1 −1 1 1 −1 0 −1
−1 −1 −1 −1 −1 −1 −1 −1 −1 −1 −1 −1 −1 −1 −1 −1 −1 −1 −1
−1 −13 −1 −1 −1 28 −1 −1 −1 0 −1 −1 −1 −1 −1 −1 −1 55 −1
−17 −1 −1 −1 −1 −1 −1 0 −1 0 −1 −1 −1 −1 −1 −1 −1 −1 −1
−1 −1 −1 −1 −1 −1 −1 −1 −13 −1 −1 −1 28 −1 −1 −1 0
−1 −1 −1 −1 −1 −1 −1 −1 55 7 −1 −1 −1 −1 −1 −1 −1 −1 0
−1 0 −1 −1 −1 −1 −1 −1 −1 −1 −1 −1 −1 −1 −1 −1 −1 −1 −1
−1 30 −1 −1 −1 −1 −1 −1 −1 24 37 −1 −1 −1 −1 56 −1
−1 14 −1 −1 −1 −1 −1 −1 −1 −1 0 −1 0 −1 −1 −1 −1 −1 −1
−1 −1 −1 −1 −1 −1 −1 −1 −1 −1 −1 −1 30 −1 −1 −1 −1 −1
−1 24 −1 −1 37 −1 −1 −1 −1 −1 56 14 −1 −1 −1 −1 −1 −1
−1 −1 −1 −1 0 −1 0 −1 −1 −1 −1 −1 −1 −1 −1 −1 −1 −1 −1 −1
−1 −1 −1 −1 62 −1 53 −1 −1 −1 −1 −1 −1 53 −1 −1 −1 −1 −1
−1 3 −1 35 −1 −1 −1 −1 −1 −1 −1 −1 −1 −1 −1 0 −1 0 −1
−1 −1 −1 −1 −1 −1 −1 −1 −1 −1 −1 −1 −1 −1 −1 −1 62 −1 53
−1 −1 −1 53 −1 −1 −1 −1 −13 −1 35 −1 −1 −1 −1 −1 −1
−1 −1 −1 −1 −1 −1 −1 0 −1 0 −1 −1 −1 −1 −1 −1 −1 −1 −1
−1 −1 −1 −1 −1 −1 40 −1 −1 −1 −1 20 −1 66 −1 −1 −1 −1
−1 −1 22 −1 28 −1 −1 −1 −1 −1 −1 −1 −1 −1 −1 −1 −1 −1 −1
−1 −1 0 −1 0 −1 −1 −1 −1 −1 −1 −1 −1 −1 −1 −1 −1 −1 40
−1 −1 −1 −1 −1 −1 20 −1 66 −1 −1 −1 −1 −1 22 −1 28 −1
−1 −1 −1 −1 −1 −1 −1 −1 −1 −1 −1 −1 −1 −1 0 −1 0 −1 −1
−1 −1 −1 −1 −1 −1 −1 −1 −1 −1 0 −1 −1 −1 −1 −1 −1 −18
−1 −1 −1 42 −1 −1 −1 −1 50 −1 −1 −1 −18 −1 −1 −1 −1
−1 −1 −1 −1 −1 −1 −1 0 −1 0 −1 −1 −1 −1 −1 −1 −1 −1 −1
−1 −1 0 −1 −1 −1 −1 −1 −1 18 −1 −1 −1 42 −1 −1 50 −1
−1 −1 −1 −1 −18 −1 −1 −1 −1 −1 −1 −1 −1 −1 −1 −1 0 −1
0 −1 −1 −1 −1 −1 −1 −1 −1 −1 −1 69 −1 79 −1 79 −1 −1 −1
−1 −1 −1 −1 −1 56 −1 −1 52 −1 −1 −1 −1 −1 −1 −1 0 −1 −1
−1 −1 −1 −1 −1 −1 −1 −1 −1 0 −1 0 −1 −1 −1 −1 −1 −1 −1
−1 −1 −1 69 −1 79 −1 79 −1 −1 −1 −1 −1 −1 −1 56 −1 −1
−1 52 −1 −1 −1 −1 −1 −1 −1 0 −1 −1 −1 −1 −1 −1 −1 −1 −1
−1 −1 0 −1 0 −1 −1 −1 −1 −1 −1 −1 −1 65 −1 −1 −1 −1 −1
−1 −1 38 −1 57 −1 −1 −1 −1 −1 72 −1 −1 −1 27 −1 −1 −1
−1 −1 −1 −1 −1 −1 −1 −1 −1 −1 −1 −1 −1 0 −1 0 −1 −1 −1
−1 −1 −1 −1 −1 65 −1 −1 −1 −1 −1 −1 −1 38 −1 57 −1
−1 −1 −1 72 −1 −1 −1 27 −1 −1 −1 −1 −1 −1 −1 −1 −1 −1 −1
−1 −1 −1 −1 −1 −1 −1 −1 0 −1 0 −1 −1 −1 −1 −1 −1 −1 64
−1 −1 −1 −1 −1 −1 −1 14 52 −1 −1 −1 −1 −1 −1 30 −1 −1
−1 −1 −1 32 −1 −1 −1 −1 −1 −1 −1 −1 −1 −1 −1 −1 −1 −1 −1
−1 −1 0 −1 0 −1 −1 −1 −1 −1 64 −1 −1 −1 −1 −1 −1 −1 14
−1 −1 52 −1 −1 −1 −1 30 −1 −1 −1 −1 −1 −1 32 −1 −1 −1 −1
−1 −1 −1 −1 −1 −1 −1 −1 −1 −1 −1 −1 −1 −1 −1 0 −1 0 −1 −1
−1 −1 −1 −1 −1 45 −1 −1 −1 70 0 −1 −1 −1 −1 −1 −1 −1 77
−19 −1 −1 −1 −1 −1 −1 0 −1 0 −1 −1 −1 −1 −1 −145 −1 −1 −1
−1 −1 −1 −1 −1 −1 0 −1 0 −1 −1 −1 −1 −1 −145 −1 −1 −1 70
−1 −1 0 −1 −1 −1 −1 −1 −1 77 −19 −1 −1 −1 −1 −1 −1 −1
−1 −1 −1 −1 −1 −1 −1 −1 −1 −1 −1 −1 −1 −1 −1 −1 −1 0 −1
0 −1 −1 −1 2 56 −1 −1 −1 −1 57 35 −1 −1 −1 −1 −1 −1 −1
−1 −1 −1 −1 12 −1 −1 −1 −1 −1 −1 −1 −1 −1 −1 −1 −1 −1 −1
−1 −1 −1 −1 −1 −1 −1 −1 −1 −1 0 −1 0 −1 2 −1 −1 56 −1
−1 57 −1 −1 35 −1 −1 −1 −1 −1 −1 −1 −1 −1 −1 −1 12 −1
−1 −1 −1 −1 −1 −1 −1 −1 −1 −1 −1 −1 −1 −1 −1 −1 −1 −1 −1
−1 −1 −1 −1 0 −1 0 −1 24 −1 −1 −1 61 −1 −1 −1 60 −1 −1
−1 −1 −1 27 51 −1 −1 −1 −1 −1 16 −1 1 −1 −1 −1 −1 −1 −1
−1 −1 −1 −1 −1 −1 −1 −1 −1 −1 −1 −1 −1 −1 0 −1 24 −1
−1 −1 61 −1 −1 −1 60 −1 −1 −1 −1 −1 27 −1 51 −1 −1
−1 −1 −1 16 −1 1 −1 −1 −1 −1 −1 −1 −1 −1 −1 −1 −1 −1 −1
−1 −1 −1 −1 −1 −1 −1 −1 0].

18. The apparatus of claim 14, wherein the second exponent matrix comprises the following set of values: [−1 57 −1
−1 −1 −1 −1 −1 −1 50 −1 −1 11 −1 −1 −1 50 −1 −1 −1 −1
79 −1 −1 1 −1 0 −1 −1 −1 −1 −1 −1 −1 −1 −1 −1 −1 −1 −1
−1 −1 −1 −1 −1 −1 −1 −1 57 −1 −1 −1 −1 −1 −1 −1 50 −1
−1 −1 −1 11 −1 −1 −1 −1 50 −1 −1 79 −1 −1 −1 −1 −1 1 1 −1 0 −1
−1 −1 −1 −1 −1 −1 −1 −1 −1 −1 −1 −1 −1 −1 −1 −1 −1 −1 −1
−1 −13 −1 −1 −1 28 −1 −1 −1 0 −1 −1 −1 −1 −1 −1 −1 55 −1

–17 –1 –1 –1 –1 –1 –1 0 –1 0 –1 –1 –1 –1 –1 –1 –1 –1 –1
–1 –1 –1 –1 –1 –1 –1 –1 –1 –13 –1 –1 –1 28 –1 –1 –1 0
–1 –1 –1 –1 –1 –1 –1 –1 55 7 –1 –1 –1 –1 –1 –1 –1 0
–1 0 –1 –1 –1 –1 –1 –1 –1 –1 –1 –1 –1 –1 –1 –1 –1 –1
–1 30 –1 –1 –1 –1 –1 –1 –1 24 37 –1 –1 –1 –1 –1 56
–1 –1 14 –1 –1 –1 –1 –1 –1 –1 0 –1 0 –1 –1 –1 –1 –1
–1 –1 –1 –1 –1 –1 –1 –1 –1 –1 –1 –1 30 –1 –1 –1 –1
–1 –1 24 –1 –1 37 –1 –1 –1 –1 –1 56 14 –1 –1 –1 –1 –1
–1 –1 –1 –1 –1 0 –1 0 –1 –1 –1 –1 –1 –1 –1 –1 –1 –1
–1 –1 –1 –1 –1 62 –1 53 –1 –1 –1 –1 –1 –1 53 –1 –1 –1
–1 –13 –1 35 –1 –1 –1 –1 –1 –1 –1 –1 –1 –1 –1 0 –1 0 –1
–1 –1 –1 –1 –1 –1 –1 –1 –1 –1 –1 –1 –1 –1 –1 62 –1 53
–1 –1 –1 –1 53 –1 –1 –1 –1 –13 –1 35 –1 –1 –1 –1 –1 –1
–1 –1 –1 –1 –1 –1 –1 –1 0 –1 0 –1 –1 –1 –1 –1 –1 –1
–1 –1 –1 –1 –1 –1 –1 40 –1 –1 –1 –1 20 –1 66 –1 –1 –1
–1 –1 –1 22 –1 28 –1 –1 –1 –1 –1 –1 –1 –1 –1 –1 –1 –1
–1 –1 0 –1 0 –1 –1 –1 –1 –1 –1 –1 –1 –1 –1 –1 –1 40
–1 –1 –1 –1 –1 –1 20 –1 66 –1 –1 –1 –1 22 –1 28 –1 –1
–1 –1 –1 –1 –1 –1 –1 –1 –1 –1 –1 –1 –1 –1 0 –1 0 –1 –1
–1 –1 –1 –1 –1 –1 –1 –1 –1 –1 0 –1 –1 –1 –1 –1 –1 –18
–1 –1 –1 42 –1 –1 –1 –1 50 –1 –1 –1 –1 8 –1 –1 –1 –1 –1
–1 –1 –1 –1 –1 –1 0 –1 0 –1 –1 –1 –1 –1 –1 –1 –1 –1
–1 –1 0 –1 –1 –1 –1 –1 –1 –1 8 –1 –1 –1 42 –1 –1 50 –1
–1 –1 –1 –1 –18 –1 –1 –1 –1 –1 –1 –1 –1 –1 –1 –1 0 –1
0 –1 –1 –1 –1 –1 –1 –1 –1 –1 –1 69 –1 79 –1 79 –1 –1 –1
–1 –1 –1 –1 –1 56 –1 –1 52 –1 –1 –1 –1 –1 –1 –1 0 –1 –1
–1 –1 –1 –1 –1 –1 –1 –1 –1 0 –1 0 –1 –1 –1 –1 –1 –1 –1
–1 –1 –1 69 –1 79 –1 79 –1 –1 –1 –1 –1 –1 56 –1 –1 –1
–1 52 –1 –1 –1 –1 –1 –1 –1 –1 0 –1 –1 –1 –1 –1 –1 –1 –1

–1 –1 0 –1 0 –1 –1 –1 –1 –1 –1 –1 –1 65 –1 –1 –1 –1 –1
–1 –1 38 –1 57 –1 –1 –1 –1 –1 72 –1 –1 –1 27 –1 –1 –1
–1 –1 –1 –1 –1 –1 –1 –1 –1 –1 –1 –1 –1 –1 0 –1 0 –1 –1 –1
–1 –1 –1 –1 –1 –1 65 –1 –1 –1 –1 –1 –1 –1 38 –1 57 –1
–1 –1 –1 –1 72 –1 –1 –1 27 –1 –1 –1 –1 –1 –1 –1 –1 –1
–1 –1 –1 –1 –1 –1 –1 –1 0 –1 0 –1 –1 –1 –1 –1 –1 –1 64
–1 –1 –1 –1 –1 –1 14 –1 52 –1 –1 –1 –1 –1 –1 30 –1 –1
–1 –1 –1 32 –1 –1 –1 –1 –1 –1 –1 –1 –1 –1 –1 –1 –1 –1
–1 –1 0 –1 0 –1 –1 –1 –1 –1 64 –1 –1 –1 –1 –1 –1 –1 –1
14 –1 52 –1 –1 –1 –1 30 –1 –1 –1 –1 –1 32 –1 –1 –1 –1
–1 –1 –1 –1 –1 –1 –1 –1 –1 –1 –1 –1 –1 –1 0 –1 0 –1 –1
–1 –1 –1 –1 –1 45 –1 –1 –1 70 0 –1 –1 –1 –1 –1 –1 –1 77
–19 –1 –1 –1 –1 –1 –1 –1 –1 –1 –1 –1 –1 –1 –1 –1 –1 –1
–1 –1 –1 –1 –1 –1 0 –1 0 –1 –1 –1 –1 –1 –1 45 –1 –1 –1 70
–1 –1 0 –1 –1 –1 –1 –1 –1 –1 77 –19 –1 –1 –1 –1 –1 –1
–1 –1 –1 –1 –1 –1 –1 –1 –1 –1 –1 –1 –1 –1 –1 –1 –1 0 –1
0 –1 –12 –1 56 –1 –1 –1 –1 57 35 –1 –1 –1 –1 –1 –1 –1 –1
–1 –1 –1 –1 12 –1 –1 –1 –1 –1 –1 –1 –1 –1 –1 –1 –1 –1
–1 –1 –1 –1 –1 –1 –1 –1 –1 –1 0 –1 0 –1 –1 –1 2 –1 56 –1
–1 57 –1 –1 35 –1 –1 –1 –1 –1 –1 –1 –1 –1 –1 –1 –1 12 –1
–1 –1 –1 –1 –1 –1 –1 –1 –1 –1 –1 –1 –1 –1 –1 –1 –1 –1
–1 –1 –1 –1 0 –1 0 –1 0 –1 24 –1 –1 –1 61 –1 –1 –1 60 –1 –1
–1 –1 –1 27 51 –1 –1 –1 –1 –1 16 –1 1 –1 –1 –1 –1 –1 –1
–1 –1 –1 –1 –1 –1 –1 –1 –1 –1 –1 –1 –1 –1 –1 –1 0 –1 24 –1
–1 –1 61 –1 –1 –1 60 –1 –1 –1 –1 –1 27 –1 –1 51 –1 –1
–1 –1 –1 16 –1 1 –1 –1 –1 –1 –1 –1 –1 –1 –1 –1 –1 –1 –1
–1 –1 –1 –1 –1 –1 –1 –1 0].

\* \* \* \* \*